(12) United States Patent
Ishibashi

(10) Patent No.: US 12,485,516 B2
(45) Date of Patent: Dec. 2, 2025

(54) SUBSTRATE CLEANING APPARATUS, POLISHING APPARATUS, BUFFING APPARATUS, SUBSTRATE CLEANING METHOD, SUBSTRATE PROCESSING APPARATUS, AND MACHINE LEARNING APPARATUS

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

(*) Notice: Subject to any disclaimer, the term of this patent is extended or adjusted under 35 U.S.C. 154(b) by 459 days.

(21) Appl. No.: 17/780,923

(22) PCT Filed: Dec. 7, 2020

(86) PCT No.: PCT/JP2020/045509
§ 371 (c)(1),
(2) Date: May 27, 2022

(87) PCT Pub. No.: WO2021/117685
PCT Pub. Date: Jun. 17, 2021

(65) Prior Publication Data
US 2022/0410343 A1    Dec. 29, 2022

(30) Foreign Application Priority Data
Dec. 13, 2019  (JP) ................. 2019-225242

(51) Int. Cl.
*B08B 3/02*   (2006.01)
*B08B 1/14*   (2024.01)
(Continued)

(52) U.S. Cl.
CPC ............ *B24B 51/00* (2013.01); *B08B 1/14* (2024.01); *B08B 1/34* (2024.01); *B08B 1/52* (2024.01);
(Continued)

(58) Field of Classification Search
CPC .... B08B 1/12; B08B 1/14; B08B 1/32; B08B 1/34; B08B 1/52; B08B 13/00;
(Continued)

(56) References Cited

U.S. PATENT DOCUMENTS

| 2003/0045008 A1 | 3/2003 | Olsen et al. |
| 2004/0184031 A1* | 9/2004 | Vook ............ G06T 7/586 |
| | | 356/237.1 |

(Continued)

FOREIGN PATENT DOCUMENTS

| CN | 107991285 A | 5/2018 |
| JP | 2008-515171 A | 5/2008 |

(Continued)

OTHER PUBLICATIONS

International Patent Application No. PCT/JP2020/045509; Int'l Search Report; dated Feb. 16, 2021; 4 pages.

*Primary Examiner* — Douglas Lee
(74) *Attorney, Agent, or Firm* — BakerHostetler

(57) ABSTRACT

The invention relates to a substrate cleaning apparatus, a polishing apparatus, a buffing apparatus, a substrate processing apparatus, a machine learning apparatus used for any of these apparatuses, and a substrate cleaning method, with improved performance and throughput. The substrate cleaning apparatus includes: a cleaning tool configured to clean a substrate held by a substrate holder; a surface-property measuring device configured to obtain surface data of the cleaning tool; and a controller configured to determine a replacement time of the cleaning tool based on the surface data. The surface-property measuring device is configured to obtain surface data of the cleaning tool at at least two measurement points of the cleaning tool each time a predetermined number of substrates are scrubbed, and the controller is configured to determine the replacement time of the (Continued)

cleaning tool based on a difference in the surface data obtained.

8 Claims, 29 Drawing Sheets

(51) Int. Cl.
| | |
|---|---|
| B08B 1/34 | (2024.01) |
| B08B 1/52 | (2024.01) |
| B08B 13/00 | (2006.01) |
| B24B 31/02 | (2006.01) |
| B24B 51/00 | (2006.01) |
| G05B 13/02 | (2006.01) |
| G06T 7/00 | (2017.01) |
| H04N 23/695 | (2023.01) |

(52) U.S. Cl.
CPC ............... *B08B 3/02* (2013.01); *B08B 13/00* (2013.01); *B24B 31/02* (2013.01); *G05B 13/028* (2013.01); *G06T 7/0002* (2013.01); *H04N 23/695* (2023.01)

(58) Field of Classification Search
CPC .......... B08B 3/02; B24B 31/02; B24B 51/00; G05B 13/028; G06T 7/0002; H01L 21/304; H04N 23/695; H04N 23/90
See application file for complete search history.

(56) References Cited

U.S. PATENT DOCUMENTS

| | | | | |
|---|---|---|---|---|
| 2006/0234503 | A1* | 10/2006 | Yamada | B08B 3/02 257/E21.228 |
| 2007/0099545 | A1* | 5/2007 | Mavliev | B24B 49/00 451/41 |
| 2008/0289652 | A1* | 11/2008 | Hamada | H01L 21/67046 134/6 |
| 2011/0256805 | A1* | 10/2011 | David | B24B 49/12 451/5 |
| 2012/0309267 | A1* | 12/2012 | Shinozaki | B24B 37/042 451/8 |
| 2017/0270655 | A1* | 9/2017 | Watanabe | G01N 21/57 |
| 2019/0088509 | A1* | 3/2019 | Suemasa | H01L 21/67253 |

FOREIGN PATENT DOCUMENTS

| | | |
|---|---|---|
| JP | 2010-213746 A | 9/2010 |
| JP | 2015-185571 A | 10/2015 |
| JP | 2015-201627 A | 11/2015 |
| JP | 2015-220402 A | 12/2015 |
| JP | 2016-092158 A | 5/2016 |
| JP | 6600470 B2 | 10/2019 |

* cited by examiner

UNUSED

DARK PART : 8 7 %

(BRIGHT PART : 1 3 %)

AFTER PROCESSING OF A PREDETERMINED NUMBER

DARK PART : 6 7 %

(BRIGHT PART : 3 3 %)

|  | MEASUREMENT POINT PA | MEASUREMENT POINT PB | DIFFERENCE |
|---|---|---|---|
| UNUSED | 8 7 | 8 8 | 1 |
| AFTER PROCESSING OF A PREDETERMINED NUMBER NA1 | 8 2 | 8 6 | 4 |
| AFTER PROCESSING OF A PREDETERMINED NUMBER NA2 | 7 0 | 8 2 | 1 2 |
|  | ● ● ● | ● ● ● | ● ● ● |
| AFTER PROCESSING OF A PREDETERMINED NUMBER NAn | 5 1 | 7 4 | 2 3 |

THRESHOLD VALUE D t : 2 2

FIG. 20

| | MEASUREMENT POINT PA | DIFFERENCE |
|---|---|---|
| UNUSED | 4 0 | |
| AFTER PROCESSING OF A PREDETERMINED NUMBER NA1 | 5 6 | 1 6 |
| AFTER PROCESSING OF A PREDETERMINED NUMBER NA2 | 7 1 | 1 5 |
| | ● ● ● | ● ● ● |
| AFTER PROCESSING OF A PREDETERMINED NUMBER NAn-1 | 7 8 | 3 |
| AFTER PROCESSING OF A PREDETERMINED NUMBER NAn | 7 9 | 1 |

THRESHOLD VALUE D t : 2

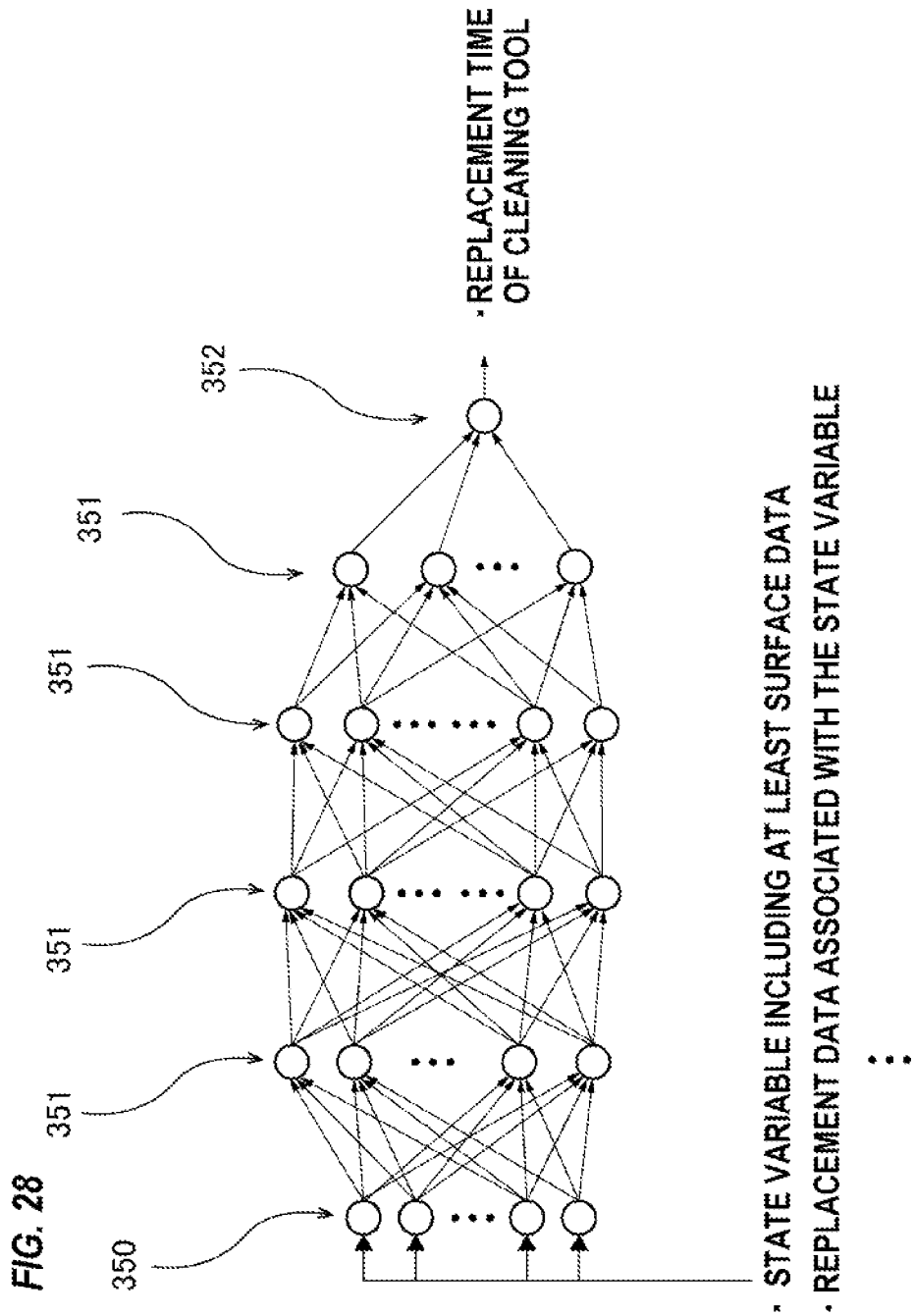

SUBSTRATE CLEANING APPARATUS, POLISHING APPARATUS, BUFFING APPARATUS, SUBSTRATE CLEANING METHOD, SUBSTRATE PROCESSING APPARATUS, AND MACHINE LEARNING APPARATUS

TECHNICAL FIELD

The present invention relates to a substrate cleaning apparatus and a substrate cleaning method for scrubbing a substrate, such as a semiconductor substrate, a glass substrate, or a liquid crystal panel, with a cleaning tool while supplying a cleaning liquid onto the substrate. Further, the present invention relates to a polishing apparatus for polishing a surface of a substrate. Further, the present invention relates to a buffing apparatus for slightly additionally polishing a substrate, which has been polished, or for cleaning the substrate to remove deposits from the substrate by pressing a contact member having a diameter smaller than that of the substrate against the substrate while providing relative movement between the substrate and the contact member. Furthermore, the present invention relates to a substrate processing apparatus having at least one of the substrate cleaning apparatus, the polishing apparatus, and the buffing apparatus. Further, the present invention relates to a machine learning apparatus configured to learn at least one of a replacement time of a cleaning tool, a replacement time of a polishing pad, and a replacement time of a buffing tool.

It has conventionally been used a scrub cleaning method for cleaning a surface of a substrate, such as a semiconductor substrate, a glass substrate, or a liquid crystal panel. This scrub cleaning method is performed by scrubbing the surface of the substrate with a cleaning tool (for example, a roll sponge, a pen sponge, or a cleaning brush) while supplying a cleaning liquid (for example, a chemical liquid or pure water) onto the surface of the substrate (see, for example, Patent Document 1 and Patent Document 2). In this scrub cleaning process, at least one of the substrate and the cleaning tool is rotated to rub the cleaning tool against the substrate, while supplying the cleaning liquid onto the substrate. For example, after polishing of a wafer which is an example of the substrate, a rotating roll sponge (cleaning tool) is placed in sliding contact with the surface of the rotating wafer while pure water (cleaning liquid) is supplied onto the surface of the wafer, so that polishing debris and particles (contaminants), such as abrasive grains contained in a polishing liquid, are removed from the surface of the wafer. The particles that have been removed from the surface of the substrate are either accumulated in the cleaning tool or discharged from the substrate together with the cleaning liquid.

CITATION LIST

Patent Literature

Patent document 1: Japanese Patent No. 6600470
Patent document 2: Japanese laid-open patent publication No. 2015-220402

SUMMARY OF INVENTION

Technical Problem

Since the scrub cleaning process is performed by directly contacting the cleaning tool with the substrate, this process has an advantage that a removal rate of particles, i.e., a cleaning efficiency is high. On the other hand, as the scrubbing of substrates is repeated, the cleaning tool deteriorates. Such deterioration of the cleaning tool leads to a decrease in the cleaning efficiency of a substrate. Furthermore, when the cleaning tool is significantly deteriorated, wear particles may be generated from the cleaning tool during scrubbing of the substrate and may be attached to the surface of the substrate. In such a case, the substrate may be contaminated by the wear particles generated from the cleaning tool.

Further, when the cleaning tool is used for a long period of time, the particles once accumulated in the cleaning tool may separate from the cleaning tool during the scrub cleaning process of the substrate and may be reattached to the surface of the substrate. Specifically, in the scrub cleaning, the particles accumulated in the cleaning tool may cause back-contamination of a substrate. In order to prevent such substrate contamination and the decrease in cleaning efficiency, it is necessary to replace the cleaning tool with a new cleaning tool at an appropriate timing.

In the conventional substrate cleaning apparatus, the replacement time of the cleaning tool is determined in advance mainly based on quality control (QC: Quality Control) and/or a rule of thumb of an operator. The main reasons for this are that the cleaning-tool replacement time varies depending on the cleaning process and cleaning recipe for substrates, and that it is difficult to measure surface property of the cleaning tool actually used for the scrub cleaning in the substrate cleaning apparatus. Specifically, in order to accurately determine the appropriate replacement time of the cleaning tool, it is necessary to observe and/or measure the surface property of the cleaning tool that is actually used in the scrub cleaning according to various cleaning processes and cleaning recipes. However, it has been difficult to determine an appropriate replacement time because a specific technique for observing and/or measuring the surface property of the cleaning tool in the substrate processing apparatus has not been established.

The cleaning tool may be replaced based on a predetermined replacement time. However, the usage time of the cleaning tool may exceed an appropriate time at which the cleaning tool should be replaced. In this case, since a substrate is scrubbed by the cleaning tool that has already reached the replacement time, the back-contamination of the substrate may occur and a yield may be lowered. On the other hand, the cleaning tool may be replaced even though the cleaning tool can be still used. In this case, a running cost of the substrate cleaning apparatus increases. Further, when the substrate cleaning apparatus is stopped in order to replace the cleaning tool, a throughput of the substrate cleaning apparatus may be lowered and a manufacturing cost of the substrate may increase.

A CMP (Chemical Mechanical Polishing) process is known as an example of a substrate polishing process performed before scrubbing of a substrate. In a CMP apparatus that performs this CMP process, the substrate is pressed against a polishing pad on a rotating polishing table to polish the surface of the substrate. As the chemical mechanical polishing process of substrates is repeated, the polishing pad also deteriorates. Therefore, it is necessary to replace the polishing pad with a new polishing pad at an appropriate timing. There is a trade-off relationship between an appropriate polishing performance and a high throughput. Specifically, if the polishing pad is frequently replaced in order to ensure an appropriate polishing performance, the throughput will be lowered. Therefore, it is required to replace the polishing pad at a timing that can achieve both appropriate polishing performance and high throughput.

A buffing process may be performed for slightly additionally polishing a substrate, which has been polished, or for cleaning the substrate to remove deposits from the substrate. This buffing process is performed by pressing a contact member having a diameter smaller than that of the substrate against the substrate while providing relative movement between the substrate and the contact member. The buffing process is performed by a buffing unit which is configured to press a contact member, called a buffing pad held by a buffing head, against the substrate held by a rotating buffing table to thereby slightly process the surface of the substrate or remove foreign matter from the surface of the substrate. As the buffing process is repeated, the buffing pad also deteriorates. Therefore, it is also necessary to replace the buffing pad with a new buffing pad at an appropriate time. There is also a trade-off relationship between an appropriate buffing performance and a high throughput. Specifically, if the buffing pad is frequently replaced in order to ensure an appropriate buffing performance, the throughput will be lowered. Therefore, it is required to replace the buffing pad at a timing that can achieve both appropriate buffing performance and high throughput.

There is a conventional CMP apparatus that includes a polishing unit having a polishing pad, a buffing unit having a buffing pad, and a cleaning unit having a cleaning tool. In such a CMP apparatus, if the entire CMP apparatus is stopped only for replacing any one of the polishing pad, the buffing pad, and the cleaning tool, the throughput of the entire CMP apparatus is lowered.

Therefore, it is an object of the present invention to provide a substrate cleaning apparatus, a polishing apparatus, a buffing apparatus, a substrate processing apparatus, a machine learning apparatus used for any of these apparatuses, and a substrate cleaning method, which are improved in terms of both performance and throughput.

One aspect of the present invention is to provide a substrate cleaning apparatus and a substrate cleaning method capable of determining an appropriate replacement time of a cleaning tool. Further, one aspect of the present invention is to provide a polishing apparatus capable of determining an appropriate replacement time of a polishing pad. Further, one aspect of the present invention is to provide a buffing apparatus capable of determining an appropriate replacement time of a buffing pad. Further, one aspect of the present invention is to provide a substrate processing apparatus including any of such a substrate cleaning apparatus, a polishing apparatus, and a buffing apparatus. Further, one aspect of the present invention is to provide a machine learning apparatus capable of estimating an appropriate replacement time of a cleaning tool. Further, one aspect of the present invention is to provide a machine learning apparatus capable of estimating an appropriate replacement time of a polishing pad. Further, one aspect of the present invention is to provide a machine learning apparatus capable of estimating an appropriate replacement time of a buffing pad.

Solution to Problem

In an embodiment, there is provided a substrate cleaning apparatus comprising: a substrate holder configured to hold a substrate; a cleaning tool configured to clean the substrate by rubbing the substrate in a presence of a cleaning liquid; a surface-property measuring device configured to obtain surface data in a non-contact manner, the surface data being indicative of a surface property of the cleaning tool; and a controller coupled to the surface-property measuring device and configured to determine a replacement time of the cleaning tool based on the surface data, wherein the surface-property measuring device is configured to obtain surface data of the cleaning tool at at least two measurement points of the cleaning tool each time a predetermined number of substrates are scrubbed, and the controller is configured to determine the replacement time of the cleaning tool based on a difference in the surface data obtained.

In an embodiment, the controller stores in advance a predetermined threshold value for the difference in the surface data and is configured to determine that the cleaning tool has reached the replacement time when the difference has reached the predetermined threshold value.

In an embodiment, the surface-property measuring device includes an imaging device configured to obtain the surface data and a camera-moving mechanism configured to move the imaging device.

In an embodiment, the substrate cleaning apparatus further comprises a cleaning-tool moving unit configured to move the cleaning tool between a cleaning position where the cleaning tool contacts a surface of the substrate and a retreat position where the cleaning tool is away from the surface of the substrate, wherein the surface-property measuring device is configured to obtain the surface data of the cleaning tool that has been moved to the retreat position.

In an embodiment, the controller is configured to perform a break-in check operation after replacement of the cleaning tool with a new cleaning tool, wherein the break-in check operation includes: obtaining surface data of the new cleaning tool at at least two measurement points of the new cleaning tool using the surface-property measuring device, each time a predetermined number of dummy substrates are scrubbed with the new cleaning tool; and determining completion of break-in of the new cleaning tool based on a difference in the surface data obtained.

In an embodiment, the surface data is one of bipolar image data, spectrum pattern of infrared absorption spectrum, strain image data, three-dimensional image data, spectral image data, hyperspectral image data, and polarization image data.

In an embodiment, the surface data is a graph of spectral intensity converted from the hyperspectral image data, and the controller is configured to determine that the cleaning tool has reached the replacement time when a difference in the spectral intensity at a predetermined wavelength is larger than a predetermined threshold value.

In an embodiment, the controller is configured to further determine that the cleaning tool has reached the replacement time when an amount of change in a slope of a tangential line at an inflection point of the graph of the spectral intensity is equal to or less than a predetermined threshold value.

In an embodiment, there is provided a substrate cleaning apparatus comprising: a substrate holder configured to hold a substrate; a cleaning tool configured to clean the substrate by rubbing the substrate in a presence of a cleaning liquid; a surface-property measuring device configured to obtain surface data in a non-contact manner, the surface data being indicative of a surface property of the cleaning tool; and a controller coupled to the surface-property measuring device and configured to determine a replacement time of the cleaning tool based on the surface data, wherein the surface-property measuring device includes an imaging device configured to be able to obtain hyperspectral image data, and the controller is configured to obtain, as the surface date of the cleaning tool, a graph of spectral intensity converted from the hyperspectral image data at one measurement point of the cleaning tool, each time a predetermined number of substrates are scrubbed, and determine that the cleaning tool has reached the replacement time when a difference in the spectral intensity of the measurement point at a predetermined wavelength, obtained each time a predetermined number of substrates are scrubbed, is smaller than a predetermined threshold value.

In an embodiment, there is provided A substrate cleaning method comprising: cleaning a substrate by rubbing a cleaning tool against the substrate in a presence of a cleaning liquid while supplying the cleaning liquid to the substrate; obtaining surface data of the cleaning tool at at least two measurement points of the cleaning tool each time a predetermined number of substrates are scrubbed; and determining a replacement time of the cleaning tool based on a difference in the surface data obtained.

In an embodiment, determining the replacement time of the cleaning tool comprises: comparing the difference in the surface data with a predetermined threshold value; and determining that the cleaning tool has reached the replacement time when the difference has reached the predetermined threshold value.

In an embodiment, the surface data is obtained by an imaging device which is moved by a camera-moving mechanism.

In an embodiment, the surface data is obtained at a retreat position where the cleaning tool is away from a surface of the substrate.

In an embodiment, there is provided a substrate cleaning method comprising: performing a break-in check operation after the cleaning tool is replaced with a new cleaning tool, wherein the break-in check operation includes: obtaining surface data of the new cleaning tool at at least two measurement points of the new cleaning tool, each time a predetermined number of dummy substrates are scrubbed with the new cleaning tool; and determining completion of break-in of the new cleaning tool based on a difference in the surface data obtained.

In an embodiment, obtaining the surface data comprises obtaining one of bipolar image data, spectrum pattern of infrared absorption spectrum, strain image data, three-dimensional image data, spectral image data, hyperspectral image data, and polarization image data.

In an embodiment, obtaining the surface data comprises obtaining a graph of spectral intensity converted from the hyperspectral image data, and determining the replacement time of the cleaning tool comprises determining that the cleaning tool has reached the replacement time when a difference in the spectral intensity at a predetermined wavelength is larger than a predetermined threshold value.

In an embodiment, there is provided a substrate cleaning method comprising: cleaning a substrate by rubbing a cleaning tool against the substrate in a presence of a cleaning liquid while supplying the cleaning liquid to the substrate; obtaining surface data of the cleaning tool at one measurement point of the cleaning tool each time a predetermined number of substrates are scrubbed; and determining a replacement time of the cleaning tool based on a difference in the surface data obtained, wherein obtaining the surface data comprises obtaining a graph of spectral intensity converted from hyperspectral image data obtained by an imaging device, and determining the replacement time of the cleaning tool comprises determining that the cleaning tool has reached the replacement time when a difference in the spectral intensity of the measurement point at a predetermined wavelength, obtained each time a predetermined number of substrates are scrubbed, is smaller than a predetermined threshold value.

In an embodiment, there is provided a polishing apparatus comprising: a polishing table configured to support a polishing pad; a polishing head configured to press a substrate against the polishing pad; a surface-property measuring device configured to obtain surface data in a non-contact manner, the surface data being indicative of a surface property of the polishing pad; and a controller coupled to the surface-property measuring device and configured to determine a replacement time of the polishing pad based on the surface data, wherein the surface-property measuring device includes an imaging device configured to be able to obtain hyperspectral image data, the surface-property measuring device is configured to obtain surface data of the polishing pad at at least two measurement points of the polishing pad each time a predetermined number of substrates are polished, the surface data is a graph of spectral intensity converted from the hyperspectral image data obtained by the imaging device, and the controller is configured to determine that the polishing pad has reached the replacement time when a difference in the spectral intensity at a predetermined wavelength is larger than a predetermined threshold value.

In an embodiment, there is provided a polishing apparatus comprising: a polishing table configured to support a polishing pad; a polishing head configured to press a substrate against the polishing pad; a surface-property measuring device configured to obtain surface data in a non-contact manner, the surface data being indicative of a surface property of the polishing pad; and a controller coupled to the surface-property measuring device and configured to determine a replacement time of the polishing pad based on the surface data, wherein the surface-property measuring device includes an imaging device configured to be able to obtain hyperspectral image data, and the controller is configured to obtain, as the surface date of the polishing pad, a graph of spectral intensity converted from the hyperspectral image data at one measurement point of the polishing pad, each time a predetermined number of substrates are polished, and determine that the polishing pad has reached the replacement time when a difference in the spectral intensity of the measurement point at a predetermined wavelength, obtained each time a predetermined number of substrates are polished, is smaller than a predetermined threshold value.

In an embodiment, there is provided a buffing apparatus comprising: a buffing table configured to support a substrate; a buffing tool having a diameter smaller than a diameter of the substrate, the buffing tool being configured to contact the substrate to finish-process the substrate; a buffing head configured to hold the buffing tool; a surface-property measuring device configured to obtain surface data in a non-contact manner, the surface data being indicative of a surface property of the buffing tool; and a controller coupled to the surface-property measuring device and configured to determine a replacement time of the buffing head based on the surface data, wherein the surface-property measuring device includes an imaging device configured to be able to obtain hyperspectral image data, the surface-property measuring device is configured to obtain surface data of the buffing tool at at least two measurement points of the buffing tool each time a predetermined number of substrates are finish-processed, the surface data is a graph of spectral intensity converted from the hyperspectral image data obtained by the imaging device, and the controller is configured to determine that the buffing tool has reached the replacement time when a difference in the spectral intensity at a predetermined wavelength is smaller than a predetermined threshold value.

In an embodiment, there is provided a buffing apparatus comprising: a buffing table configured to support a substrate; a buffing tool having a diameter smaller than a diameter of the substrate, the buffing tool being configured to contact the substrate to finish-process the substrate; a buffing head configured to hold the buffing tool; a surface-property measuring device configured to obtain surface data in a non-contact manner, the surface data being indicative of a surface property of the buffing tool; and a controller coupled to the surface-property measuring device and configured to determine a replacement time of the buffing head based on the surface data, wherein the surface-property measuring device includes an imaging device configured to be able to obtain hyperspectral image data, and the controller is configured to obtain, as the surface date of the buffing tool, a graph of spectral intensity converted from the hyperspectral image data at one measurement point of the buffing tool, each time a predetermined number of substrates are finish-processed, and determine that the buffing tool has reached the replacement time when a difference in the spectral intensity of the measurement point at a predetermined wavelength, obtained each time a predetermined number of substrates are polished, is smaller than a predetermined threshold value.

In an embodiment, there is provided a substrate processing apparatus comprising at least one of the substrate cleaning apparatus, the polishing apparatus, and the buffing apparatus.

In an embodiment, there is provided a machine learning apparatus for learning at least one of the replacement time of the cleaning tool provided in the substrate cleaning apparatus, the replacement time of the polishing pad provided in the polishing apparatus, and the replacement time of the buffing tool provided in the buffing apparatus, comprising: a state observation part configured to obtain a state variable including at least the surface data; a replacement-data acquisition part configured to obtain replacement data associated with the state variable, the replacement data containing at least one of a judgement result as to whether or not the cleaning tool should be replaced, a judgement result as to whether or not the polishing pad should be replaced, and a judgement result as to whether or not the buffing tool should be replaced; and a learning part configured to learn at least one of an appropriate replacement time of the cleaning tool, an appropriate replacement time of the polishing pad, and an appropriate replacement time of the buffing tool based on a training data set which is a combination of the state variable and the replacement data.

In an embodiment, the state variable further includes an output value of a torque sensor provided in an electric motor for rotating the cleaning tool.

In an embodiment, the state variable further includes a measured value of a particle counter configured to measure the number of particles in the cleaning liquid discharged from a cleaning tank of a cleaning-tool cleaning device.

Advantageous Effects of Invention

According to the present invention, the surface data indicative of the surface property (e.g., surface shape, degree of contamination, etc.) of the cleaning tool actually used for the scrub cleaning is obtained at the at least two measurement points having different deterioration degrees, and the replacement time of the cleaning tool is determined based on the difference between the surface data. Therefore, an appropriate replacement time of the cleaning tool can be determined.

Further, according to the present invention, the surface data indicative of the surface property (e.g., surface shape, degree of contamination, etc.) of the polishing pad actually used for the polishing of the substrate is obtained at the at least two measurement points having different deterioration degrees, and the replacement time of the polishing pad is determined based on the difference between the surface data. Therefore, an appropriate replacement time of the polishing pad can be determined.

Further, according to the present invention, the surface data indicative of the surface property (e.g., surface shape, degree of contamination, etc.) of the buffing pad actually used for the buffing of the substrate is obtained at the at least two measurement points having different deterioration degrees, and the replacement time of the buffing pad is determined based on the difference between the surface data. Therefore, an appropriate replacement time of the buffing pad can be determined.

BRIEF DESCRIPTION OF DRAWINGS

FIG. 20 is a table showing an example of a change in spectral intensity obtained at one measurement point after a predetermined number of substrates are scrubbed;

FIG. 28 is a schematic diagram showing an example of a structure of a neural network;

DESCRIPTION OF EMBODIMENTS

Figure 1:
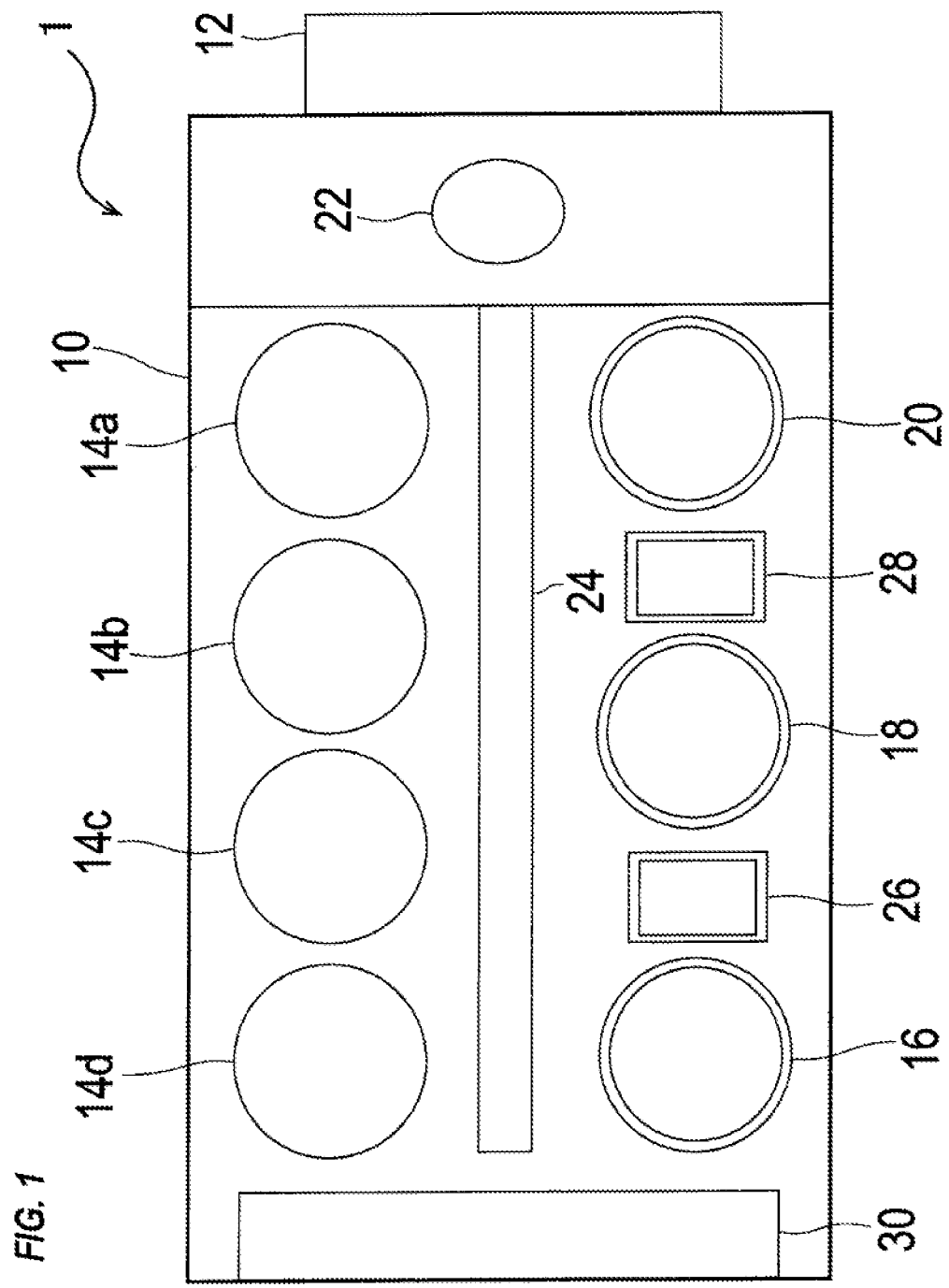
FIG. 1 is a plan view showing an overall configuration of a substrate processing apparatus having a substrate cleaning apparatus according to an embodiment.

Hereinafter, embodiments of the present invention will be described with reference to the drawings. In the drawings described below, the same or corresponding components are denoted by the same reference numerals and duplicated descriptions will be omitted.

FIG. 1 is a plan view showing an overall configuration of a substrate processing apparatus 1 having a substrate cleaning apparatus according to an embodiment. The substrate processing apparatus 1 shown in FIG. 1 is configured to perform a series of processes including polishing of a surface of a substrate (e.g., a wafer), cleaning of the polished substrate, and drying of the cleaned substrate. Hereinafter, the substrate processing apparatus 1 shown in FIG. 1 will be described as an example of a substrate processing apparatus having a substrate cleaning apparatus according to an embodiment.

As shown in FIG. 1, the substrate processing apparatus 1 includes substantially a rectangular housing 10 and a loading port 12 on which a substrate cassette accommodating a number of substrates (wafers) is placed. The loading port 12 is arranged adjacent to the housing 10. An open cassette, a SMIF (Standard Manufacturing Interface) pod, or a FOUP (Front Opening Applied Pod) can be mounted to the loading port 12. Each of SMIF and FOUP is an airtight container configured to accommodate a substrate cassette therein and cover the substrate cassette with a partition wall that can maintain an inside environment independently of an exterior space.

The housing 10 accommodates a plurality of (four in this embodiment) polishing units 14a to 14d for polishing a substrate(s), a first cleaning unit 16 and a second cleaning unit 18 each for cleaning the polished substrate, and a drying unit 20 for drying the cleaned substrate. The polishing units 14a to 14d are arranged along a longitudinal direction of the substrate processing apparatus 1, and the cleaning units 16 and 18 and the drying unit 20 are also arranged along the longitudinal direction of the substrate processing apparatus 1.

In the present embodiment, the substrate processing apparatus 1 includes the plurality of polishing units 14a to 14d, but the present invention is not limited to this embodiment. For example, the substrate processing apparatus 1 may have a single polishing unit. Further, the substrate processing apparatus 1 may include, instead of one or more of the polishing units or in addition to one or more of the polishing units, a bevel polishing unit for polishing a peripheral portion (also referred to as a bevel portion) of a substrate.

A first substrate transfer robot 22 is arranged in an area surrounded by the loading port 12, the polishing unit 14a, and the drying unit 20, and a substrate transfer unit 24 is arranged in parallel with the polishing units 14a to 14d. The first substrate transfer robot 22 is configured to receive a substrate to be polished from the loading port 12 and passes it to the substrate transfer unit 24, and is further configured to receive a dried substrate from the drying unit 20 and returns it to the loading port 12. The substrate transfer unit 24 is configured to transport the substrate received from the first substrate transfer robot 22 and transfers the substrate to and from each of the polishing units 14a to 14d. Each of the polishing units 14a to 14d is configured to polish the surface of the substrate by rubbing the substrate against a polishing surface while supplying a polishing liquid (e.g., slurry containing abrasive grains) onto the polishing surface.

A second substrate transfer robot 26, configured to transfer a substrate between the cleaning units 16 and 18 and the substrate transfer unit 24, is arranged between the first cleaning unit 16 and the second cleaning unit 18. A third substrate transfer robot 28, configured to transfer a substrate between the second cleaning unit 18 and the drying unit 20, is arranged between the second cleaning unit 18 and the drying unit 20. Further, a controller 30 for controlling operations of each of the units of the substrate processing apparatus 1 is arranged in the housing 10.

In the present embodiment, the first cleaning unit 16 is a substrate cleaning apparatus configured to scrub the substrate by rubbing roll sponges against both front and back surfaces of the substrate in the presence of a chemical liquid, and the second cleaning unit 18 is a substrate cleaning apparatus using a pen-shaped sponge (i.e., a pen sponge). In one embodiment, the second cleaning unit 18 may be a substrate cleaning apparatus configured to scrub the substrate by rubbing roll sponges against both front and back surfaces of the substrate in the presence of a chemical liquid. The drying unit 20 is a spin-drying apparatus configured to hold a substrate, emit IPA vapor from a moving nozzle to dry the substrate, and then rotate the substrate at a high speed to thereby dry the substrate.

In one embodiment, the first cleaning unit 16 or the second cleaning unit 18 may be a substrate cleaning apparatus configured to press a cleaning tool (for example, a roll sponge, a pen sponge, or a cleaning brush) against the front surface (or back surface) of the substrate to scrub the front surface (or back surface) of the substrate while emitting a two-fluid jet onto the front surface (or back surface) of the substrate. Further, in one embodiment, the first cleaning unit 16 or the second cleaning unit 18 may be a substrate cleaning apparatus configured to scrub only one of the front surface and the back surface of the substrate with a cleaning tool.

The substrate is polished by at least one of the polishing units 14a to 14d. The polished substrate is cleaned by the first cleaning unit 16 and the second cleaning unit 18, and the cleaned substrate is then dried by the drying unit 20. In one embodiment, the polished substrate may be cleaned in either the first cleaning unit 16 or the second cleaning unit 18.

Figure 2:
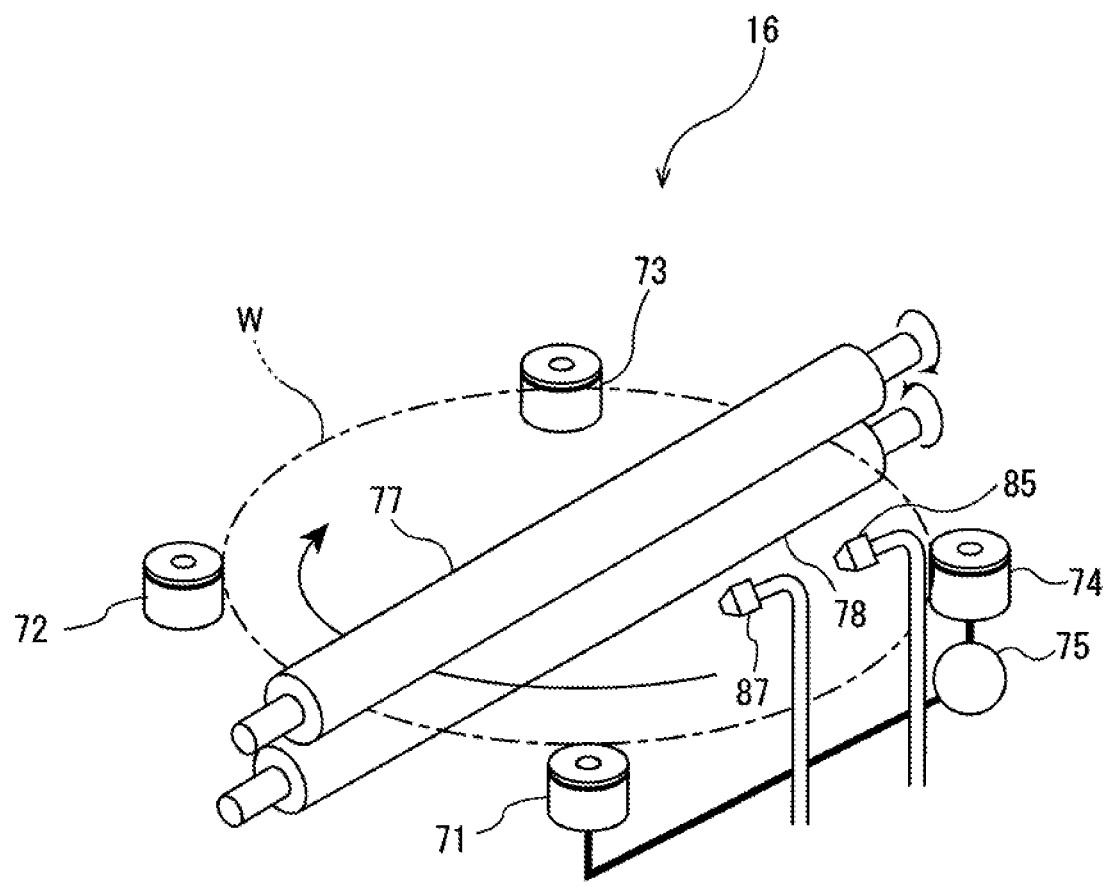
FIG. 2 is a perspective view schematically showing a first cleaning unit.
Figure 3:
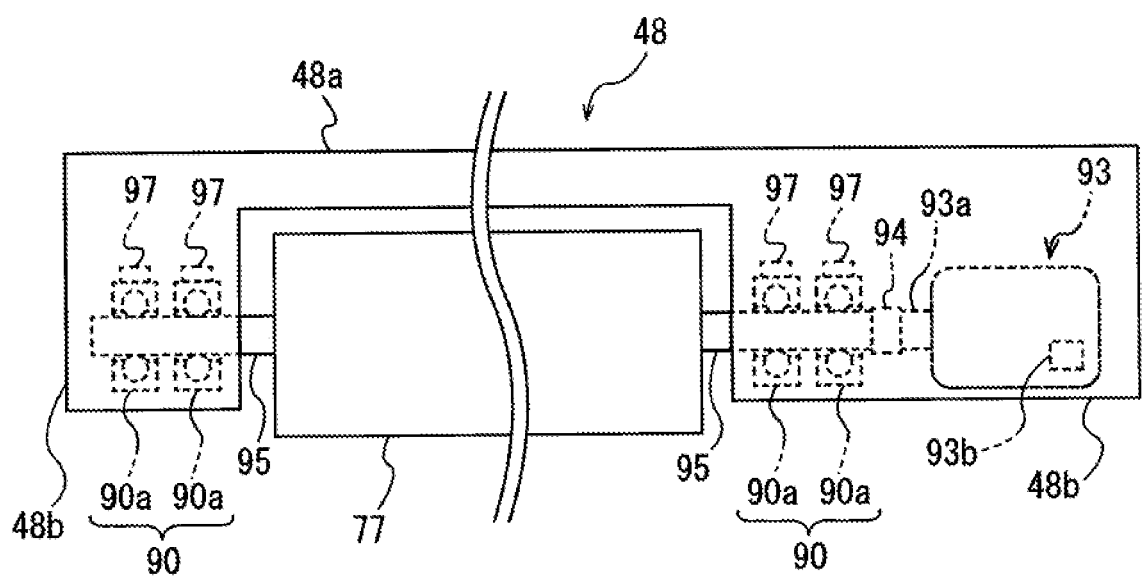
FIG. 3 is a side view schematically showing an example of an upper roll arm that rotatably supports an upper roll sponge shown in FIG. 2.

FIG. 2 is a perspective view schematically showing the first cleaning unit 16 shown in FIG. 1. The first cleaning unit 16 shown in FIG. 2 is a substrate cleaning apparatus according to an embodiment of the present invention. FIG. 3 is a side view schematically showing an example of an upper roll arm that rotatably supports an upper roll sponge shown in FIG. 2. Although not shown in the drawings, the first cleaning unit 16 has a lower roll arm that rotatably supports a lower roll sponge 78. The configuration of the lower roll arm corresponds to, for example, a configuration of the upper roll arm, which will be described later, when the upper roll arm is turned upside down such that the lower roll sponge 78 can rub a lower surface of a substrate W. In this specification, unless otherwise specified, the description of "upper" or "lower" means position or direction of a component, such as a cleaning member, relative to a substrate. Further, the description of "upper surface" or "front surface" of a component, such as a cleaning member, means a surface of the component on its side that contacts the substrate. Moreover, the description of these positions or directions relates to examples in the drawings and therefore does not limit the scope of the present invention.

As shown in FIG. 2, the first cleaning unit 16 includes four holding rollers 71, 72, 73, 74 configured to hold and rotate the substrate (wafer) W in a horizontal posture, a column-shaped upper roll sponge (cleaning tool) 77 and a column-shaped lower roll sponge (cleaning tool) 78 configured to contact the upper and lower surfaces of the substrate W, respectively, an upper rinsing-liquid supply nozzle 85 configured to supply a rinsing liquid (for example, pure water) onto the surface of the substrate W, and an upper chemical-liquid supply nozzle 87 configured to supply a chemical liquid onto the surface of the substrate W. Although not shown in the drawings, a lower rinsing-liquid supply nozzle for supplying a rinsing liquid (for example, pure water) onto the lower surface of the substrate W is provided, and a lower chemical-liquid supply nozzle for supplying a chemical liquid onto the lower surface of the substrate W is provided. In this patent specification, the chemical liquid and the rinsing liquid may be collectively referred to as cleaning liquid, and the chemical-liquid supply nozzle 87 and the rinsing liquid supply nozzle 85 may be collectively referred to as cleaning-liquid supply nozzle. The roll sponges 77 and 78 have a porous structure, and such roll sponges 77 and 78 are made of resin, such as PVA or nylon.

The holding rollers 71, 72, 73, 74 can be moved in directions closer to and away from the substrate W by not-shown drive mechanisms (for example, air cylinders). Two holding rollers 71 and 74 of the four holding rollers are coupled to a substrate rotating mechanism 75, and these holding rollers 71 and 74 are rotated in the same direction by the substrate rotating mechanism 75. In one embodiment, multiple substrate rotating mechanisms 75 may be provided so as to be coupled to the holding roller 71, 72, 73, 74, respectively. With the four holding rollers 71, 72, 73, 74 holding the substrate W, the two holding rollers 71, 74 are rotated to thereby rotate the substrate W about its axis. In the present embodiment, a substrate holder for holding and rotating the substrate W is composed of the holding rollers 71, 72, 73, 74 and the substrate rotating mechanism 75.

As shown in FIG. 3, the upper roll sponge 77 is rotatably supported by an upper roll arm 48. The upper roll arm 48 includes an arm portion 48a extending above the upper roll sponge 77 along the longitudinal direction of the upper roll sponge 77, and a pair of support portions 48b extending downward from both ends of the arm portion 48a.

Bearing devices 90, each having a plurality of (two in FIG. 3) bearings 90a, are arranged in the support portions 48b, respectively. These bearing devices 90 rotatably support rotation shafts 95 extending from both ends of the upper roll sponge 77. An electric motor 93 for rotating the upper roll sponge 77 is arranged in one of the support portions 48b, and a drive shaft 93a of the electric motor 93 is coupled to one of the rotation shafts 95 via a coupling device 94. The electric motor 93 is a rotating mechanism for rotating the upper roll sponge 77. When the electric motor 93 is in motion, a rotating torque is transmitted to the rotation shaft 95 of the upper roll sponge 77 via the drive shaft 93a and the coupling device 94, whereby the upper roll sponge 77 rotates.

In the example shown in FIG. 3, each bearing device 90 has two bearings 90a, but the present embodiment is not limited to this example. For example, each bearing device 90 may have one bearing or three or more bearings that support the rotation shaft 95 of the upper roll sponge 77.

In the present embodiment, the electric motor 93 has a torque sensor 93b configured to measure a torque for rotating the drive shaft 93a (i.e., a torque exerted on the upper roll sponge 77 via the rotation shaft 95). Further, a vibration meter 97 is attached to each bearing 90a of the bearing device 90. The vibration meter 97 is configured to measure vibration generated in the bearing 90a while the upper roll sponge 77 is rotating. The torque sensor 93b and the vibration meter 97 are coupled to the controller 30 (see FIG. 1), and a measured value of the torque for rotating the drive shaft 93a and a measured value of the vibration generated in the bearing 90a are transmitted to the controller 30. The operation and purpose of the torque sensor 93b and the vibration meter 97 will be described later.

Figure 4:
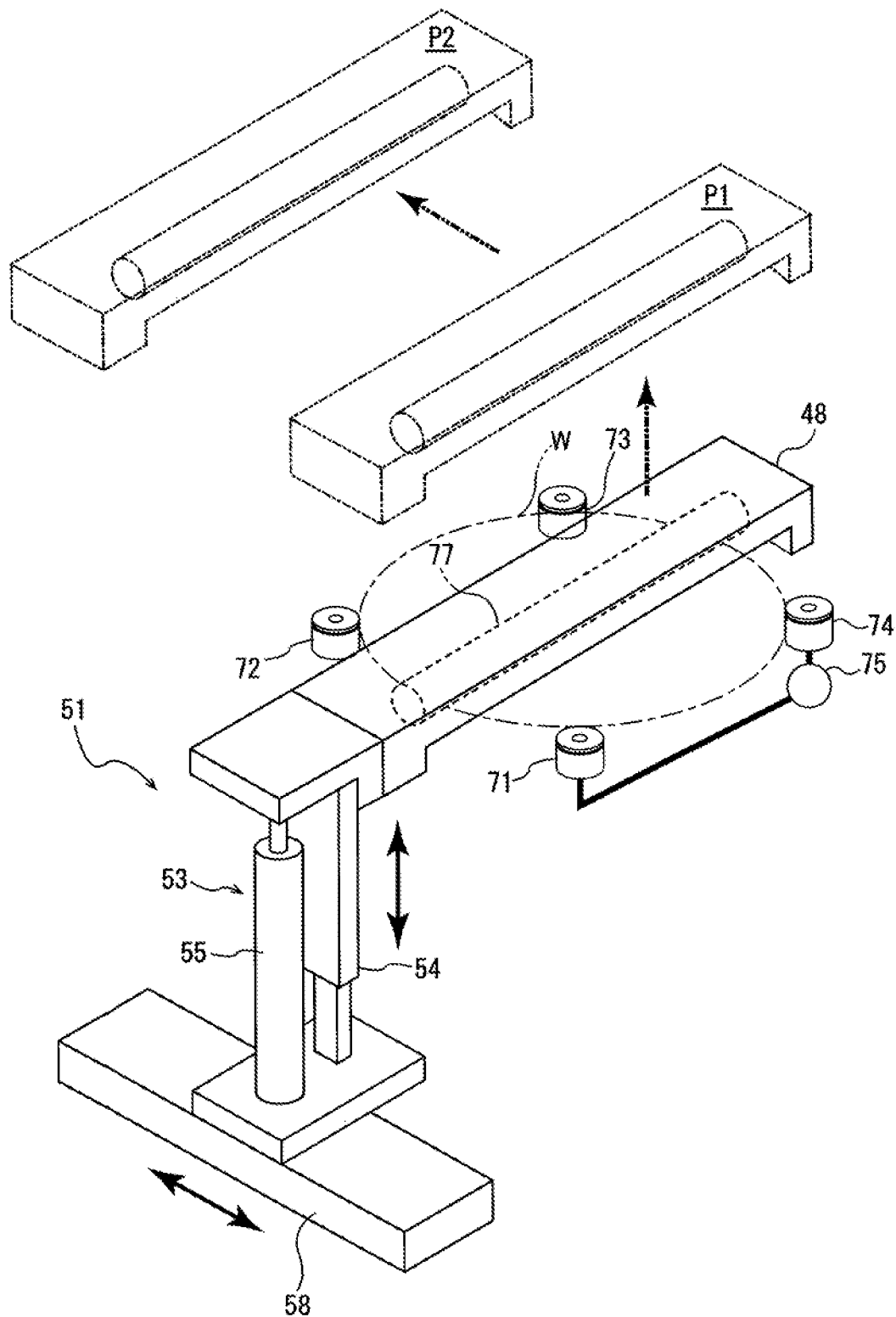
FIG. 4 is a schematic perspective view showing an example of a cleaning-tool moving unit.

The first cleaning unit 16 further includes a cleaning-tool moving unit configured to move the cleaning tool (for example, the upper roll sponge 77 or the lower roll sponge 78) from a retreat position to a cleaning position and from the cleaning position to the retreat position. FIG. 4 is a schematic perspective view showing an example of the cleaning-tool moving unit provided in the first cleaning unit 16. A cleaning-tool moving unit 51 shown in FIG. 4 is configured to move the upper roll sponge 77 from the retreat position to the cleaning position and from the cleaning position to the retreat position. Although not shown in the drawings, the first cleaning unit 16 further has a cleaning-tool moving unit configured to move the lower roll sponge 78 from a retreat position to a cleaning position and from the cleaning position to the retreat position. In this specification, the cleaning position of the cleaning tool is defined as a position where the cleaning tool is in contact with the substrate W in order to clean the surface of the substrate W, and the retreat position of the cleaning tool is defined as a position where the cleaning tool is separated from the surface of the substrate W. FIG. 2 shows a state in which the upper roll sponge 77 and the lower roll sponge 78 have been moved to the cleaning positions, respectively.

The cleaning-tool moving unit 51 shown in FIG. 4 has a vertically-moving mechanism 53 configured to move the upper roll arm 48 in a vertical direction together with the upper roll sponge 77, and a horizontally-moving mechanism 58 configured to move the upper roll arm 48 in a horizontal direction together with the vertically-moving mechanism 53.

In the illustrated example, the vertically-moving mechanism 53 includes a guide rail 54 configured to guide the vertical movement of the upper roll arm 48, and an elevating drive mechanism 55 configured to move the upper roll arm 48 along the guide rail 54. The upper roll arm 48 is attached to the guide rail 54. The elevating drive mechanism 55 is a linear motion mechanism, such as an air cylinder or a ball screw mechanism. When the elevating drive mechanism 55 is operated, the upper roll sponge 77 is moved up and down along the guide rail 54 together with the upper roll arm 48.

The horizontally-moving mechanism 58 is, for example, a linear motion mechanism, such as an air cylinder or a ball screw mechanism coupled to the vertically-moving mechanism 53. When the horizontally-moving mechanism 58 is in motion, the upper roll arm 48 (i.e., the upper roll sponge 77) is moved horizontally together with the vertically-moving mechanism 53.

As shown in FIG. 4, the operation of the elevating drive mechanism 55 causes the upper roll sponge 77 in the cleaning position to move to a retreat position P1 which is separated upwardly from the surface of the substrate W. Subsequently, the operation of the horizontally-moving mechanism 58 causes the upper roll sponge 77 to move from the retreat position P1 to a retreat position P2 located laterally of the substrate W. In one embodiment, the cleaning-tool moving unit 51 may have only the vertically-moving mechanism 53. In this case, the cleaning-tool moving unit 51 moves the upper roll sponge 77 between the cleaning position where the upper roll sponge 77 contacts the surface of the substrate W and the retreat position P1 where the upper roll sponge 77 is separated upwardly from the surface of the substrate W.

Next, a process of cleaning the substrate W will be described with reference to FIG. 2. First, the holding rollers 71, 72, 73, 74 rotate the substrate W about its axis. Subsequently, the roll sponges 77 and 78 are moved from the retreat position P2 (or P1) to the cleaning position shown in FIG. 2 by the cleaning-tool moving unit 51 shown in FIG. 4. The chemical liquid is then supplied to the front surface and the lower surface of the substrate W from the upper chemical-liquid supply nozzle 87 and the lower chemical-liquid supply nozzle (not shown). In this state, the roll sponges (cleaning tools) 77 and 78 rub the upper and lower surfaces of the substrate W while the roll sponges (cleaning tools) 77 and 78 are rotating around their axes extending horizontally to thereby scrub and clean the upper and lower surfaces of the substrate W. The roll sponges 77 and 78 are longer than the diameter (width) of the substrate W and can contact the entire upper and lower surfaces of the substrate W.

After the scrubbing process, the substrate W is rinsed with the pure water as the rinsing liquid supplied onto the upper surface and the lower surface of the rotating substrate W while the roll sponges 77 and 78 are in sliding contact with the upper and lower surfaces of the substrate W.

Figure 5A:
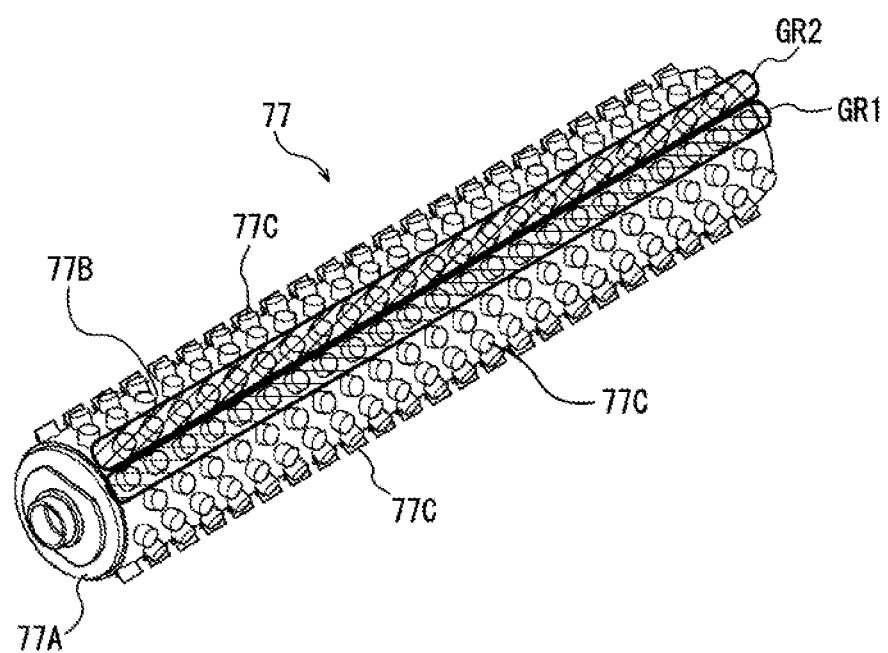
FIG. 5A is a perspective view schematically showing the upper roll sponge shown in FIG. 2.
Figure 5B:
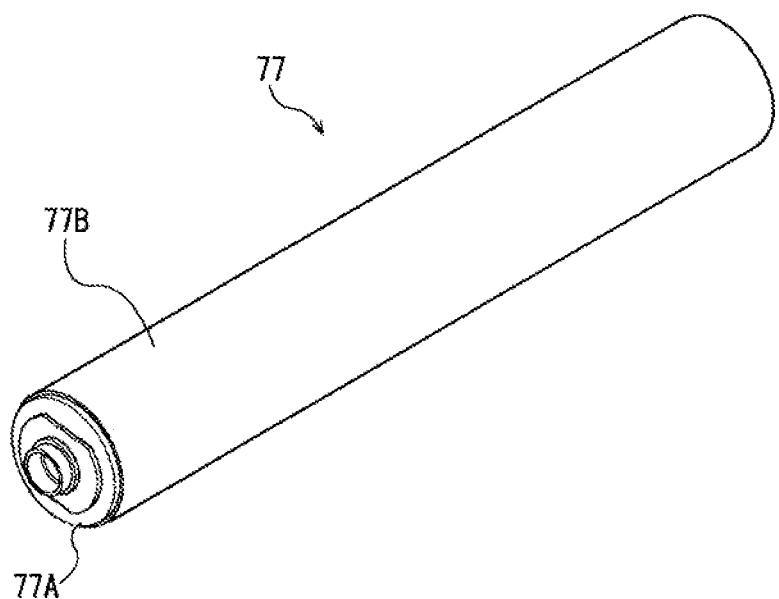
FIG. 5B is a perspective view schematically showing a modified example of the upper roll sponge shown in FIG. 5A.

FIG. 5A is a perspective view schematically showing the upper roll sponge 77 shown in FIG. 2, and FIG. 5B is a perspective view schematically showing a modified example of the upper roll sponge 77 shown in FIG. 5A. Since the lower roll sponge 78 has the same shape as the upper roll sponge 77 shown in FIG. 5A or FIG. 5B, repetitive descriptions thereof will be omitted.

The upper roll sponge 77 shown in FIG. 5A includes a cylindrical core member 77A and a scrubbing member 77B covering an outer peripheral surface of the core member 77A. The scrubbing member 77B is made of resin, such as PVA, and has cylindrical protrusions (hereinafter referred to as "nodules") 77C formed on the surface thereof. The upper roll sponge 77 has a plurality of nodule groups composed of the nodules 77C arranged at equal intervals in rows along a longitudinal direction (or an axial direction) of the upper roll sponge 77. The plurality of nodule groups are arranged at equal intervals in a circumferential direction of the upper roll sponge 77. In FIG. 5A, adjacent nodule groups GR1 and GR2 are shown with hatching as an example of nodule groups arranged in the circumferential direction of the upper roll sponge 77.

The position of each nodule 77C belonging to the nodule group GR1 and the position of each nodule 77C belonging to the nodule group GR2 are staggered in the longitudinal direction of the upper roll sponge 77. When the upper roll sponge 77 comes into contact with the surface of the substrate W while the upper roll sponge 77 is rotating, distal ends of the nodules 77C belonging to the adjacent nodules group GR1 and GR2 come into contact with the surface of the substrate W with no gap, whereby the entire surface of the substrate W is cleaned.

The upper roll sponge 77 shown in FIG. 5B differs from the upper roll sponge 77 shown in FIG. 5A in that the nodules 77C are not provided. As shown in FIG. 5B, the upper roll sponge 77 may not have the nodules 77C. In this case, the entire surface of the substrate W is cleaned by the surface of the scrubbing member 77B that is in surface contact with the surface of the substrate W.

Figure 6:
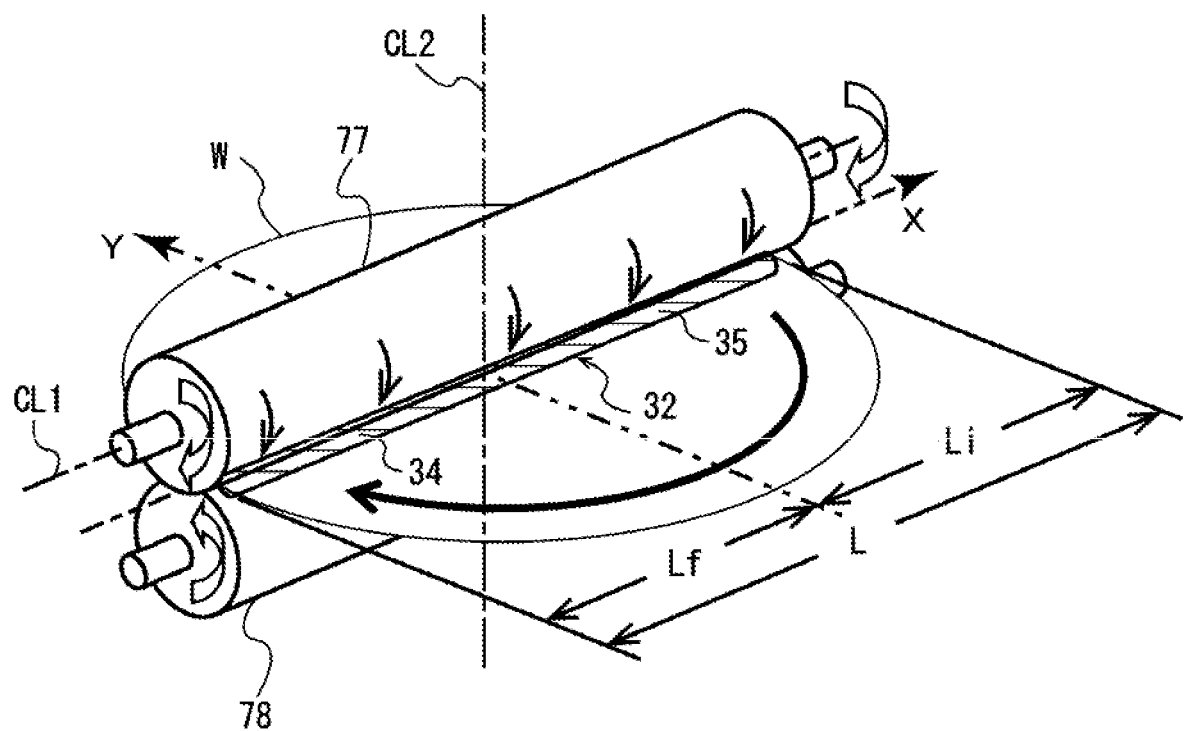
FIG. 6 is a schematic perspective view showing a relationship between the upper roll sponge and a substrate during scrub cleaning.
Figure 7:
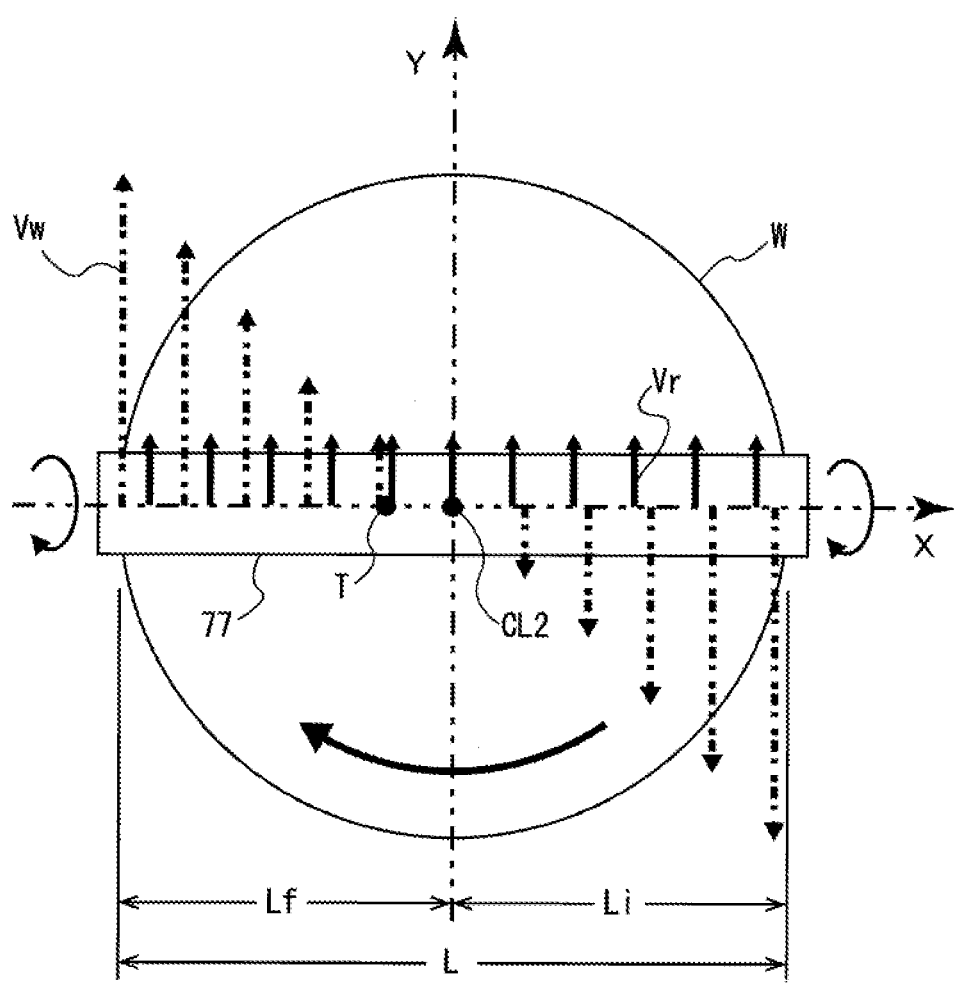
FIG. 7 is a schematic plan view showing a relationship between the upper roll sponge and a substrate during scrub cleaning.

FIG. 6 is a schematic perspective view showing a relationship between the upper roll sponge 77 and the substrate W during the scrub cleaning process, and FIG. 7 is a schematic plan view showing a relationship between the upper roll sponge 77 and the substrate W during the scrub cleaning process. Since a relationship between the lower roll sponge 78 and the substrate W during the scrub cleaning process is the same as the relationship between the upper roll sponge 77 and the substrate W shown in FIGS. 6 and 7, repetitive descriptions thereof will be omitted.

As shown in FIG. 6, a length of the upper roll sponge 77 is slightly longer than the diameter of the substrate W, and a central axis (rotation axis) CL1 of the upper roll sponge 77 is substantially orthogonal to a rotation axis CL2 of the substrate W. In this case, the substrate W and the upper roll sponge 77 are in contact with each other in a cleaning area 32 having a length L extending linearly over an entire length of the substrate W in its diameter direction. According to such configurations, the upper roll sponge 77 can clean the entire surface of the substrate W simultaneously and efficiently. In FIGS. 6 and 7, an X axis is parallel to the cleaning area 32 corresponding to the longitudinal direction (axial direction) of the upper roll sponge 77, and a Y axis extends in a direction orthogonal to the X axis. An origin of an X-Y plane coincides with the rotation axis CL2 of the substrate W. These descriptions are applied to embodiments described below as well.

As shown by a thick two-dot chain line in FIG. 7, an absolute value of a magnitude of a rotating velocity Vw of the substrate W along the cleaning area 32 is zero on the rotation axis CL2 of the substrate W and increases gradually toward the peripheral edge of the substrate W. The direction of the rotating velocity Vw of the substrate W at one side of the rotation axis CL2 is opposite to that at the opposite side of the rotation axis CL2. On the other hand, as shown by a thick solid line in FIG. 7, a magnitude of a rotating velocity Vr of the upper roll sponge 77 along the cleaning area 32 is constant over the entire length of the cleaning area 32, and the direction of the rotating velocity Vr is the same.

Therefore, the cleaning area 32 can be divided into a forward-direction cleaning area 34 and an opposite-direction cleaning area 35. The forward-direction cleaning area 34 has a length Lf and lies at one side of the rotation axis CL2 of the substrate W. In this forward-direction cleaning area 34, the direction of the rotating velocity Vw of the substrate W is the same as the direction of the rotating velocity Vr of the upper roll sponge 77. The opposite-direction cleaning area 35 has a length Li and lies at the opposite side of the rotation axis CL2 of the substrate W. In this opposite-direction cleaning area 35, the direction of the rotating velocity Vw of the substrate W is opposite to the direction of the rotating velocity Vr of the upper roll sponge 77.

Figure 8A:
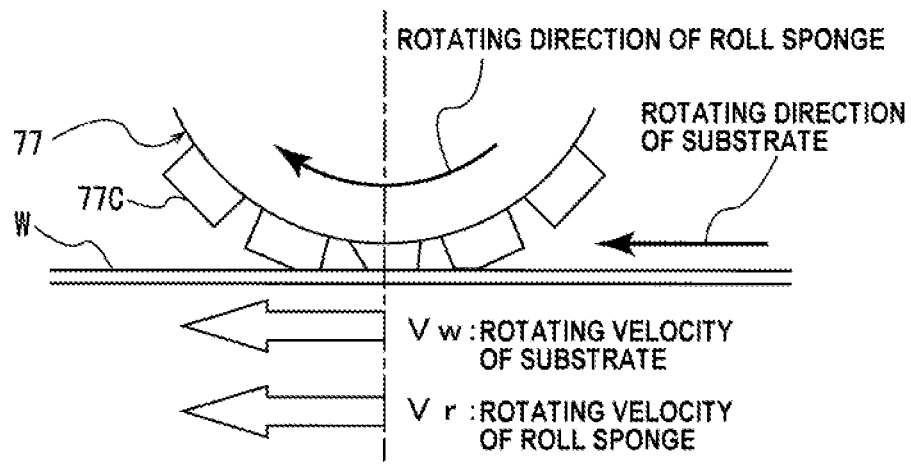
FIG. 8A is a schematic view showing the substrate and the upper roll sponge and their rotating velocities in a forward-direction cleaning area.
Figure 8B:
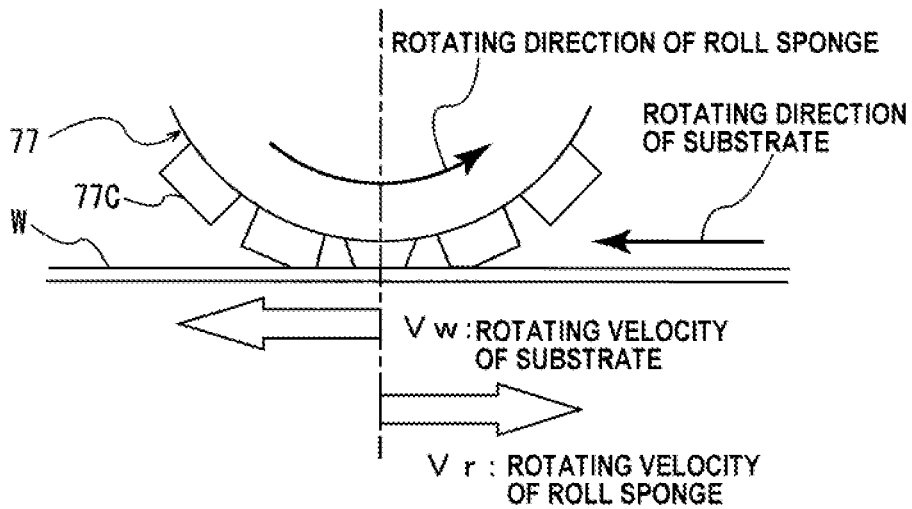
FIG. 8B is a schematic view showing the substrate and the upper roll sponge and their rotating velocities in an opposite-direction cleaning area.

As shown in FIG. 8A, in the forward-direction cleaning area 34, a magnitude of a relative velocity (relative rotating velocity) Vs between the rotating velocity Vw of the substrate W and the rotating velocity Vr of the upper roll sponge 77 is an absolute value of a difference between the magnitudes of these two rotating velocities and is relatively low. On the other hand, in the opposite-direction cleaning area 35, a magnitude of the relative velocity (relative rotating velocity) Vs between the rotating velocity Vw of the substrate W and the rotating velocity Vr of the roll cleaning member 16 is the sum of the magnitudes of the two rotating velocities and is relatively high, as shown in FIG. 8B. Thus, depending on the magnitude of the rotating velocity Vw of the substrate W and the magnitude of the rotating velocity Vf of the upper roll sponge 77, there may exist a reversing point T where the magnitude of the relative velocity Vs is zero (Vw=Vr). Specifically, when the rotating velocity Vr of the upper roll sponge 77 is smaller than the rotating velocity Vw at the outermost peripheral portion of the substrate W, there exists the reversing point T on the substrate W where the magnitude of the relative velocity Vs is zero (Vw=Vr). In this case, the cleaning directions of the substrate W by the upper roll sponge 77 are opposite on both sides of the reversing point T.

When the rotating velocity Vr of the upper roll sponge 77 is equal to or higher than the rotating velocity Vw at the outermost peripheral portion of the substrate W, the reversing point T at which the magnitude of the relative velocity Vs is zero does not occur on the substrate W. Specifically, the cleaning direction of the substrate W by the upper roll sponge 77 is not reversed over the entire cleaning area 32 on the substrate W. However, the absolute value of the magnitude of the relative velocity Vs gradually increases from the forward-direction cleaning area 34 toward the opposite-direction cleaning area 35.

Figure 9A:
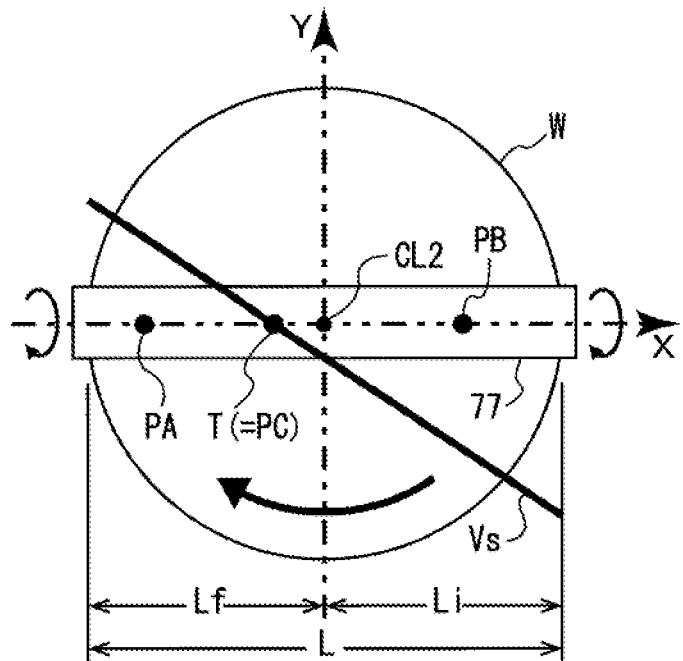
FIG. 9A a schematic diagram showing an example of a change in relative velocity along a longitudinal direction of the upper roll sponge when a reversing point T exists on the substrate where the magnitude of the relative velocity between rotating velocity of the substrate and rotating velocity of the upper roll sponge is zero.
Figure 9B:
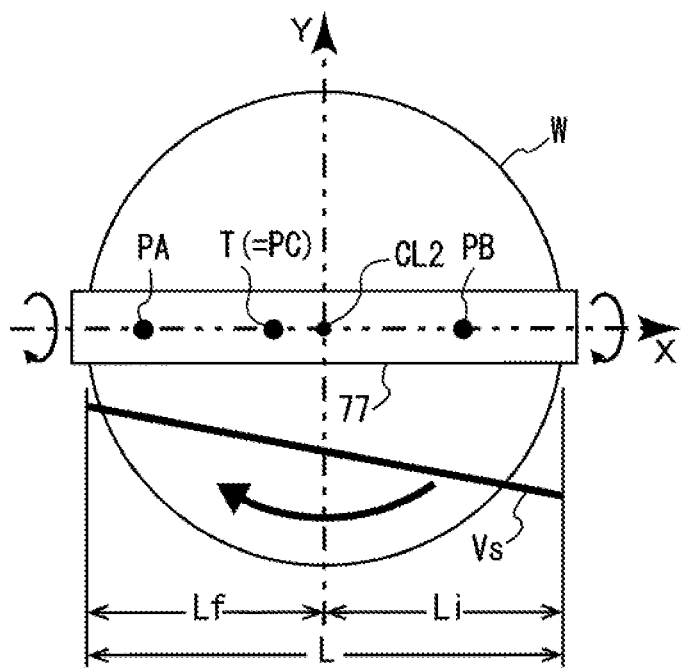
FIG. 9B is a schematic diagram showing an example of a change in the relative velocity along the longitudinal direction of the upper roll sponge when the reversing point T does not exist on the substrate where the magnitude of the relative velocity between the rotating velocity of the substrate and the rotating velocity of the upper roll sponge is zero.

FIG. 9A a schematic diagram showing an example of a change in the relative velocity Vs along the longitudinal direction of the upper roll sponge 77 when the reversing point T exists on the substrate W where the magnitude of the relative velocity Vs between the rotating velocity Vw of the substrate W and the rotating velocity Vr of the upper roll sponge 77 is zero. FIG. 9B is a schematic diagram showing an example of a change in the relative velocity Vs when the reversing point T does not exist on the substrate W where the magnitude of the relative velocity Vs between the rotating velocity Vw of the substrate W and the rotating velocity Vr of the upper roll sponge 77 is zero. In FIGS. 9A and 9B, the magnitude of the relative velocity Vs changing along the X axis is drawn by a thick solid line.

As shown in FIGS. 9A and 9B, the relative velocity Vs changes along the longitudinal direction of the upper roll sponge 77. Therefore, during scrubbing of the substrate W, times during which the nodules 77C belonging to a certain nodule group (for example, the nodule group GR1 or GR2 shown in FIG. 5A) are in contact with the surface of the rotating substrate W vary along the longitudinal direction of the upper roll sponge 77. This means that a degree of deterioration (or a deterioration rate) of the upper roll sponge 77, which progresses as scrubbing of substrates W is repeated, varies along the longitudinal direction of the upper roll sponge 77.

For example, in the embodiment in which the reversing point T shown in FIG. 9A exists, a contact time of the upper roll sponge 77 with the substrate W at a point PA in the cleaning area 34 is longer than a contact time of the upper roll sponge 77 with the substrate W at a point PB in the opposite cleaning area 35. Therefore, the degree of deterioration of the upper roll sponge 77 at the point PA is greater than the degree of deterioration of the upper roll sponge 77 at the point PB.

Furthermore, in the embodiment in which the reversing point T exists as shown in FIG. 9A, a manner in which the nodule 77C contacts the substrate W at the point PA in the forward-direction cleaning area 34 is different from a manner in which the nodule 77C contacts the substrate W at the point PB in the opposite-direction cleaning area 35. The reversing point T is located between the point PA and the point PB. More specifically, the distal end of the nodule 77C at the point PA contacts the surface of the substrate W for a relatively long time not only in a downstream side of the nodule 77C in the rotating direction of the upper roll sponge 77 but also in an upstream side of the nodule 77C. As a result, the distal end of the nodule 77C at the point PA is deteriorated even in the upstream side of the nodule 77C in the rotating direction of the upper roll sponge 77, as compared with the distal end of the nodule 77C at the point PB. Here, the upstream/downstream side of the nodule 77C in the rotating direction of the upper roll sponge 77 refers to an opposite side/forward side of the nodule 77C with respect to a center of the nodule 77C in the rotating direction of the upper roll sponge 77. In examples shown in FIGS. 10A to 10C described below, an upper half of the distal end of the nodule 77C in these figures is the upstream side relative to the center of the nodule 77C which is a reference position, and a lower half of the distal end of the nodule 77C is the downstream side relative to the center of the nodule 88 which is the reference position. The distal end of the nodule 77C of the rotating upper roll sponge 77 comes into contact with the substrate W from the downstream side to the upstream side of the nodule 77C in the rotating direction of the upper roll sponge 77. This also applies to the examples shown in FIGS. 11A to 11C described below.

Figure 10A:
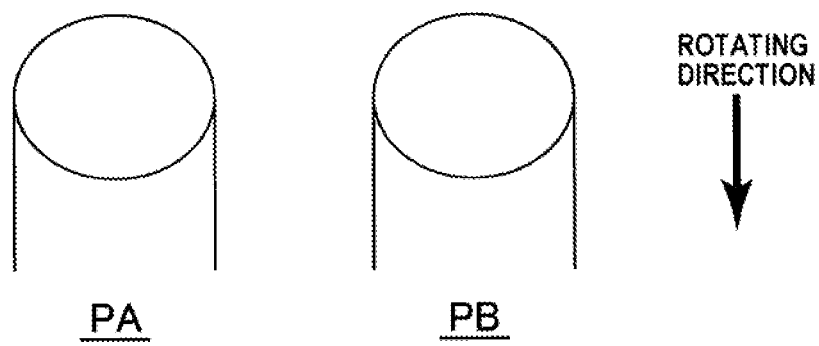
FIG. 10A is a schematic diagram showing distal ends of nodules at a point PA and a point PB on an unused upper roll sponge in the embodiment in which the reversing point T shown in FIG. 9A exists.
Figure 10B:
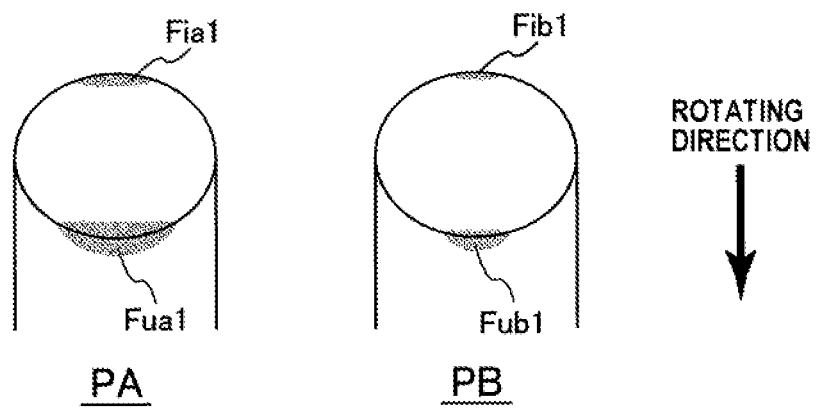
FIG. 10B is a schematic diagram showing the distal ends of the nodules at the point PA and the point PB after a predetermined number of substrates are scrubbed.
Figure 10C:
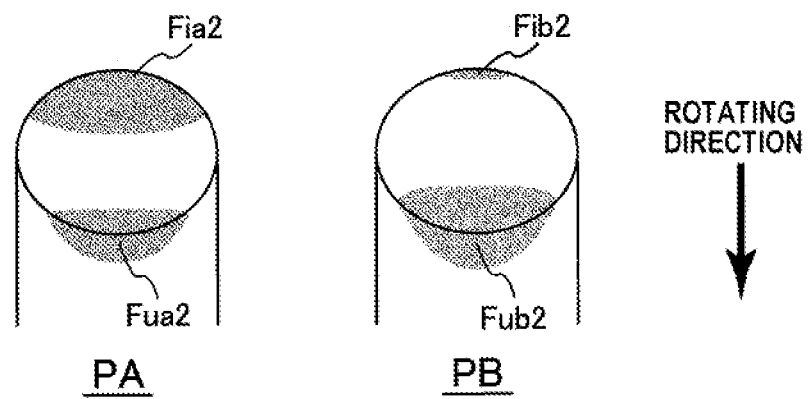
FIG. 10C is a schematic diagram showing the distal ends of the nodules at the point PA and the point PB after a predetermined number of substrates are further scrubbed.

FIGS. 10A to 10C are schematic views showing an example of the deterioration of the distal end of the nodule 77C at the point PA and the deterioration of the distal end of the nodule 77C at the point PB in the embodiment in which the reversing point T shown in FIG. 9A occurs. More specifically, FIG. 10A is a schematic diagram showing the distal ends of the nodules 77C at the point PA and the point PB on unused upper roll sponge 77, and FIG. 10B is a schematic diagram showing the distal ends of the nodules 77C at the point PA and the point PB after a predetermined number of substrates W are scrubbed. FIG. 10C is a schematic diagram showing the distal ends of the nodules 77C at the point PA and the point PB after a predetermined number of substrates W are further scrubbed.

As shown in FIG. 10A, in the unused upper roll sponge 77, no deteriorated region occurs in the distal end of the nodule 77C at the point PA and the distal end of the nodule 77C at the point PB. As shown in FIG. 10B, when the upper roll sponge 77 is used for scrubbing a predetermined number of substrates W, deteriorated regions Fua1 and Fub1 occur in the downstream sides of distal ends of the nodules 77C in the rotating direction of the upper roll sponge 77 at both the point PA and the point PB. However, the size of the deteriorated region Fua1 is larger than the size of the deteriorated region Fub1. Further, the nodule 77C at the point PA has a deteriorated region Fia1 in the upstream side of the distal end in the rotating direction of the upper roll sponge 77, and the nodule 77C at the point PB also has a deteriorated region Fib1 in the upstream side of the distal end in the rotating direction of the upper roll sponge 77. However, the deteriorated region Fib 1 is much smaller than the deteriorated region Fia1. The deteriorated region Fua1 is larger than the deteriorated region Fia1.

When a predetermined number of substrates W are further scrubbed with the upper roll sponge 77, the deterioration of the distal ends of the nodules 77C at the point PA and the point PB progresses as shown in FIG. 10C. Specifically, the nodule 77C of the point PA has a deteriorated region Fua2 larger than the deteriorated region Fua1 and further has a deteriorated region Fia2 larger than the deteriorated region Fia1. Moreover, the deteriorated region Fia2 is much larger than the deteriorated region Fua2. Specifically, the progress of deterioration of the distal end of the nodule 77 in its upstream side is greater than the progress of deterioration in the downstream side. In the nodule 77C of the point PB, a deteriorated region Fub2 larger than the deteriorated region Fub1 and a deteriorated region Fib2 larger than the deteriorated region Fib1 are generated.

As can be seen from the comparison between FIGS. 10B and 10C, the progress of deterioration of the nodule 77C at the point PA is greater than the progress of deterioration of the nodule 77C at the point PB. Specifically, a ratio Ca(=FTa2/FTa1) of a total deteriorated region FTa2(=Fua2+Fia2) of the nodule 77C shown in FIG. 10C to a total deteriorated region FTa1(=Fua1+Fia1) of the nodule 77C at the point PA shown in FIG. 10B is larger than a ratio Cb(=FTb2/FTb1) of a total deteriorated region FTb2 (=Fub2+Fib2) of the nodule 77C shown in FIG. 10C to a total deteriorated region FTb1(=Fub 1+Fib 1) of the nodule 77C at the point PB shown in 10B. Therefore, as the scrubbing of substrates W is repeated, the progress of deterioration of nodule 77C at the point PA increases at an accelerated pace, as compared with the progress of deterioration of nodule 77C at the point PB.

Further, the deteriorated regions Fua1, Fia1, Fua2, Fia2, Fub1, Fib1, Fub2, and Fib2 are regions in which a large amount of particles (contaminants), such as polishing debris and abrasive grains contained in the polishing liquid, are deposited. Therefore, the degree of contamination of nodule 77C at the point PA increases at an accelerated pace as compared with the degree of contamination of nodule 77C at the point PB. Specifically, as the scrubbing of substrates W is repeated, the degree of deterioration and the degree of contamination of the upper roll sponge 77 become different greatly along the longitudinal direction of the upper roll sponge 77.

Figure 11A:
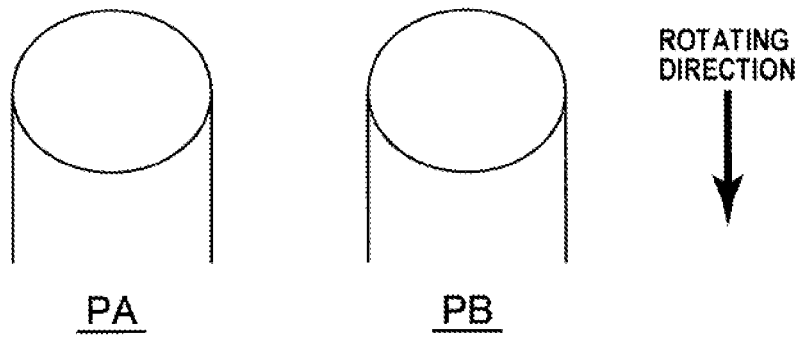
FIG. 11A is a schematic diagram showing distal ends of nodules at a point PA and a point PB on an unused upper roll sponge in the embodiment shown in FIG. 9B where the reversing point T does not exist.
Figure 11B:
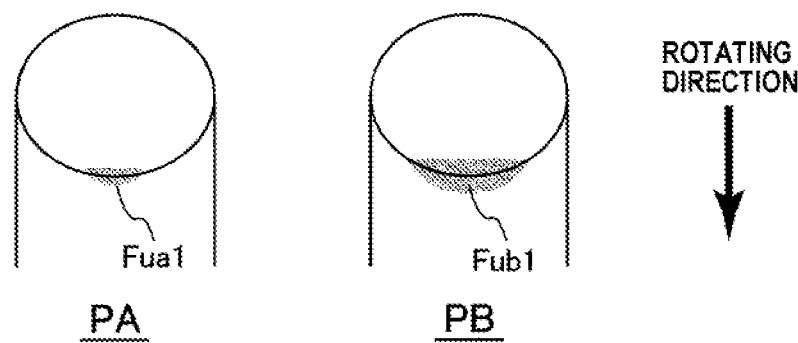
FIG. 11B is a schematic diagram showing the distal ends of the nodules at the point PA and the point PB after a predetermined number of substrates are scrubbed.
Figure 11C:
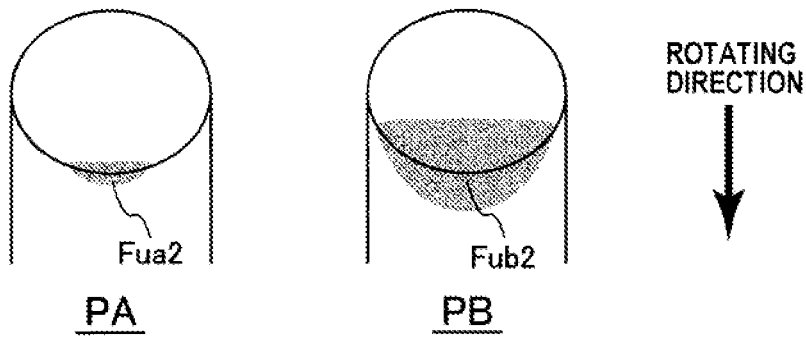
FIG. 11C is a schematic diagram showing the distal ends of the nodules at the point PA and the point PB after a predetermined number of substrates are further scrubbed.

This phenomenon also occurs in the embodiment in which the reversing point T shown in FIG. 9B does not occur. FIGS. 11A to 11C are schematic views showing an example of the deterioration of the distal end of the nodule 77C at the point PA and the deterioration of the distal end of the nodule 77C at the point PB in the embodiment shown in FIG. 9B in which the reversing point T does not occur. More specifically, FIG. 11A is a schematic view showing the distal ends of the nodules 77C at the point PA and the point PB on unused upper roll sponge 77, and FIG. 11B is a schematic diagram showing the distal ends of the nodules 77C at the point PA and the point PB after a predetermined number of substrates W are scrubbed. FIG. 11C is a schematic diagram showing the distal ends of the nodules 77C at the point PA and the point PB after a predetermined number of substrates W are further scrubbed.

In the embodiment in which the reversing point T shown in FIG. 9B does not occur, as can be seen from the comparison between FIGS. 11B and 11C, as the scrubbing of substrates W is repeated, the degree of deterioration and the degree of contamination of the nodule 77C at the point PB increase at an accelerated pace as compared with the degree of deterioration and the degree of contamination of the nodule 77C at the point PA.

As shown in FIGS. 10A to 10C and FIGS. 11A to 11C, as the scrubbing of substrates W is repeated, the degree of deterioration and the degree of contamination of the upper roll sponge 77 vary greatly along the longitudinal direction of the upper roll sponge 77. Furthermore, the degree of deterioration and the degree of contamination of the substrate W also vary depending on the cleaning recipe for the substrate W. Therefore, even if the surface property of the upper roll sponge 77 is observed and/or measured at a certain measurement point of the upper roll sponge 77, it is difficult to determine an appropriate replacement time of the upper roll sponge 77.

Thus, in the present embodiment, surface data of the upper roll sponge 77 are obtained at at least two measurement points of the upper roll sponge (cleaning tool) 77, and an appropriate replacement time of the upper roll sponge 77 is determined based on a difference between the two surface data. For example, the surface data indicative of surface properties of at least two measurement points (for example, the points PA and PB shown in FIGS. 9A and 9B) separated along the longitudinal direction of the upper roll sponge 77 are obtained, and the appropriate replacement time of the upper roll sponge 77 is determined based on the difference between the surface data. Similarly, for the lower roll sponge 78, surface data of the lower roll sponge 78 are obtained at at least two measurement points of the lower roll sponge (cleaning tool) 78, and an appropriate replacement time of the upper roll sponge 78 is determined based on a difference between the two surface data. Hereinafter, a surface-property measuring device for obtaining the surface data of the upper roll sponge 77 at at least two measurement points of the upper roll sponge (cleaning tool) 77 will be described. Since configurations of a surface-property measuring device for obtaining the surface data of the lower roll sponge 78 are the same as configurations of the surface-property measuring device for obtaining the surface data of the upper roll sponge 77, repetitive descriptions thereof will be omitted.

Figure 12:
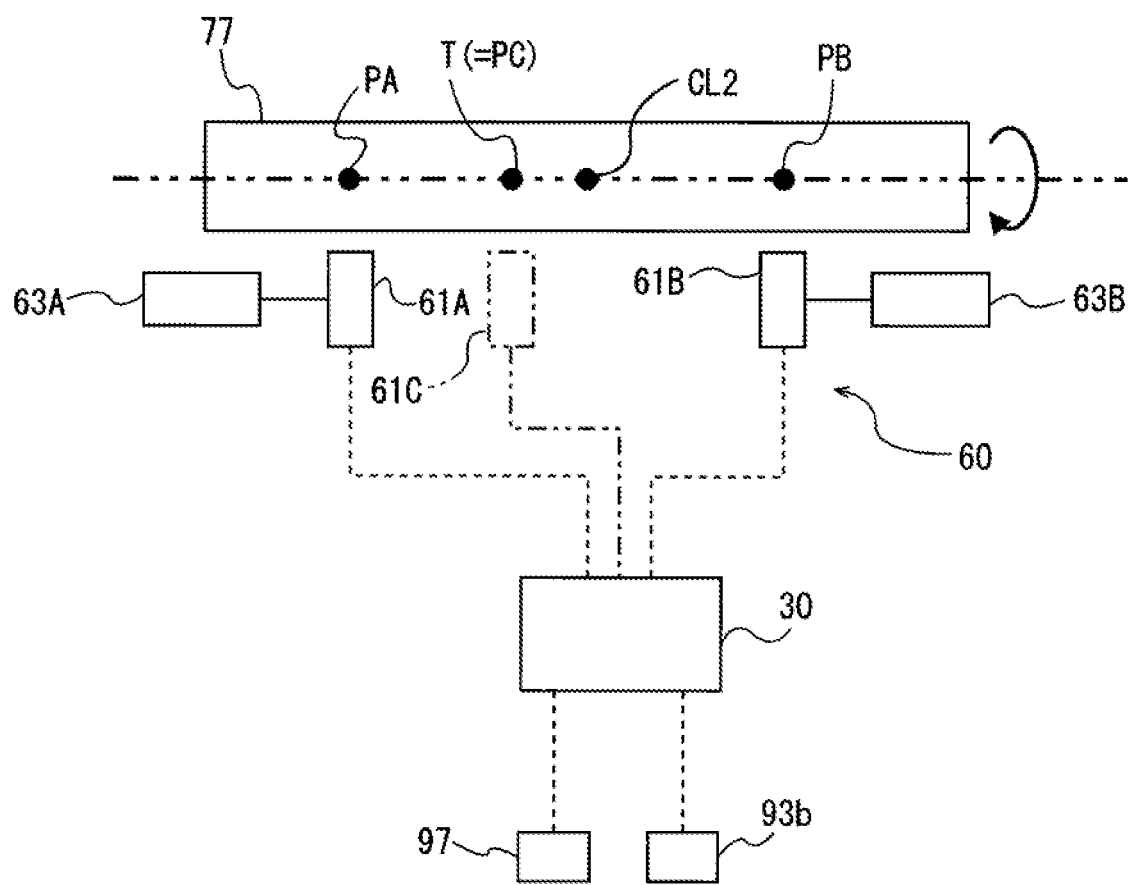
FIG. 12 is a schematic diagram showing a surface-property measuring device according to an embodiment.

FIG. 12 is a schematic view showing the surface-property measuring device according to an embodiment. A surface-property measuring device 60 shown in FIG. 12 is an apparatus configured to obtain the surface data indicative of the surface property of the upper roll sponge 77 moved to the retreat position P1 or the retreat position P2 (see FIG. 4). This surface-property measuring device 60 is configured to directly obtain the surface data in a non-contact manner. The surface-property measuring device 60 includes imaging devices 61A and 61B for obtaining the surface data indicative of the surface properties of the upper roll sponge (cleaning tool) 77 at the measurement points PA and PB. Since the imaging device 61B has the same configuration as the imaging device 61A, the imaging devices 61A and 61B are simply referred to as the imaging device 61 in the following descriptions unless otherwise specified.

The imaging device 61 is coupled to the controller 30 described above, and the surface data of the upper roll sponge 77 obtained by the imaging device 61 is sent to the controller 30. The imaging device 61 directly obtains an actual image data of the upper roll sponge 77 at the measurement point PA (or the measurement point PB), and converts the image data to the surface data indicating the surface property (i.e., the degree of deterioration and the degree of contamination) of the upper roll sponge 77.

The surface data obtained by the imaging device 61 may be, for example, an area of a dark part (or a bright part) in a bipolar image data of (the nodule 77C of) the upper roll sponge 77, or a spectral pattern of an infrared absorption spectrum of a reflected light or a transmitted light obtained when (the nodule 77C of) the upper roll sponge 77 is irradiated with infrared light. Alternatively, the surface data obtained by the imaging device 61 may be three-dimensional image data of (the nodule 77C of) the upper roll sponge 77 obtained by irradiating (the nodule 77C of) the upper roll sponge 77 with laser light. The surface data obtained by the imaging device 61 may be strain image data that visualizes a strain generated when a predetermined pressure is applied to the upper roll sponge 77.

Further, the surface data obtained by the imaging device 61 may be spectral image data generated from a light from (the nodule 77C of) the upper roll sponge 77 decomposed according to a large number of wavelengths (for example, 10 or more wavelengths). Further, the surface data obtained by the imaging device 61 may be hyperspectral image data generated from a light from (the nodule 77C of) the upper roll sponge 77 decomposed according to a large number of wavelengths including wavelength within a near infrared range. The hyperspectral image data can visualize a difference in the image data in an invisible region (near infrared range) that cannot be discriminated by a human eye or a color camera image.

The surface data obtained by the imaging device 61 may be polarization image data of (the nodule 77C of) the upper roll sponge 77. The polarization image data is image data including information on a polarizing direction and a degree of polarization of a reflected light from (the nodule 77C of) the upper roll sponge 77.

An imaging device available on the market can be used to generate the surface data, such as the bipolar image data, the spectral pattern of the infrared absorption spectrum, the strain image data, the three-dimensional image data, the spectral image data, the hyperspectral image data, the polarization image data, etc. Such an imaging device can shoot a video of the rotating upper roll sponge 77, extract a frame image from the video, and obtain the surface data of the upper roll sponge 77 from the frame image. Specifically, the imaging device can obtain the surface data of the rotating upper roll sponge 77 that has been moved to the retreat position P1 (or P2). In order to obtain the surface data when the upper roll sponge 77 is rotating, it is preferable that the imaging device includes a high-sensitive high-speed camera unit. As a matter of course, the imaging device can obtain the surface data of the upper roll sponge 77 in a stationary state.

Figure 13A:
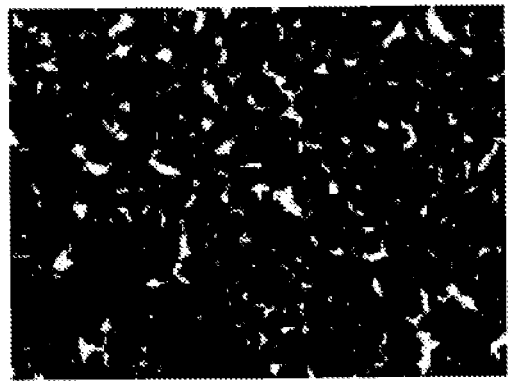
FIG. 13A is an example of a bipolar image data of the nodule of the unused upper roll sponge.
Figure 13B:
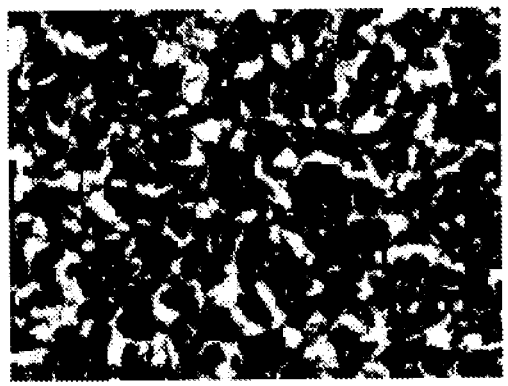
FIG. 13B is an example of a bipolar image data of the nodule of the upper roll sponge after a predetermined number of substrates are scrubbed.

FIG. 13A shows an example of bipolar image data of nodule 77C of unused upper roll sponge 77, and FIG. 13B shows an example of bipolar image data of nodule 77C of the upper roll sponge 77 after a predetermined number of substrates W are scrubbed. The bipolar image data shown in FIG. 13B was obtained at the same measurement point as the bipolar image data shown in FIG. 13A.

Such bipolar image data can be generated by performing a bipolar process in which an image of (the nodule 77C of) the upper roll sponge 77 generated by a camera unit (not shown) of the imaging device 61 is divided into a bright part and a dark part. The imaging device 61 includes an image processing unit (not shown) configured to perform the bipolar process on the image generated by the camera unit and calculate an area of the dark part (or the bright part) from the bipolar image data obtained.

As can be seen from FIGS. 13A and 13B, when the scrubbing of substrates W is repeated, the surface of the upper roll sponge 77 is worn, and as a result, the area of the dark part decreases and the area of the bright part increases. Specifically, the area of the dark part decreases according to the degree of deterioration of the upper roll sponge 77. Therefore, the degree of deterioration of the upper roll sponge 77 can be grasped by comparing the area of the dark part obtained as the surface data each time a predetermined number of substrates W are scrubbed.

Figures 14, 15:
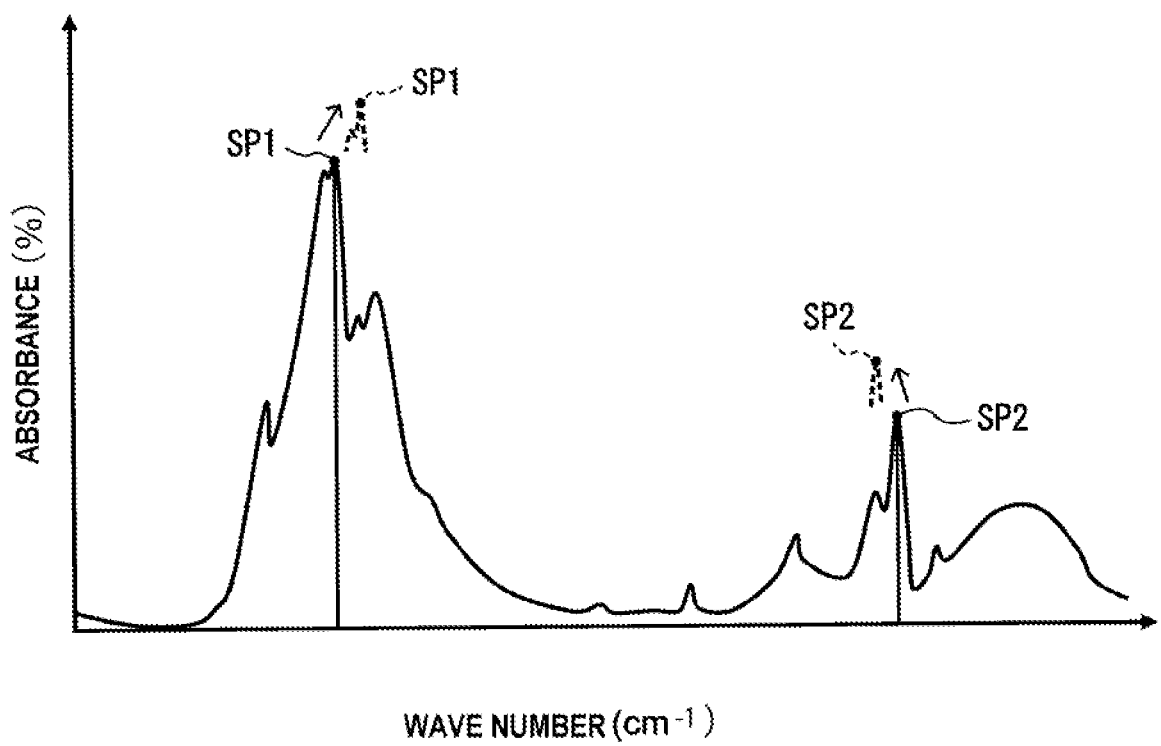
FIG. 14 is a schematic diagram showing an example of a spectral pattern created by an imaging device.
FIG. 15 is a table showing an example of a difference between an area of a dark part of a measurement point and an area of a dark part of a measurement point.

FIG. 14 is a schematic diagram showing an example of a spectral pattern produced by the imaging device 61. In FIG. 14, a vertical axis represents absorbance and a horizontal axis represents wave number. In the case where the surface data obtained by the imaging device 61 is a spectral pattern of an infrared absorption spectrum, the imaging device 61 is configured to irradiate the surface of the upper roll sponge 77 with infrared rays, obtain an infrared absorption spectrum from a reflected light or transmitted light of the infrared rays, and produce a spectral pattern based on the infrared absorption spectrum.

As shown in FIG. 14, when the upper roll sponge 77 deteriorates, the surface shape of the upper roll sponge 77 changes, or contaminants are deposited on the surface of the upper roll sponge 77. As a result, the spectral pattern obtained by the imaging device 61 changes. For example, an absorbance of a characteristic peak SP1 may change, or a wave number at which the peak SP1 appears may change. In another example, a relative positional relationship between two characteristic peaks SP1 and SP2 (for example, an absolute value of a difference between wave numbers of the two peaks SP1 and SP2) may change. Therefore, the degree of deterioration of the upper roll sponge 77 can be grasped by comparing the spectral pattern as the surface data obtained each time a predetermined number of substrates W are scrubbed (for example, by calculating amount of change in the absorbance and the wave number of the peak P1, amount of change in the absorbance and the wave number of the peak P2, or amount of change in the absolute value of the difference between the wave numbers of the peaks SP1 and SP2).

In the case where the surface data obtained by the imaging device 61 is the three-dimensional image data of the upper roll sponge 77, the imaging device 61 irradiates the upper roll sponge 77 with laser light from a light-emitting device (not shown) and receives reflected laser light by a light-receiving device (not shown) to obtain the three-dimensional image data of the upper roll sponge 77. Further, the imaging device 61 has a function of a laser displacement meter. More specifically, the imaging device 61 first obtains the three-dimensional image data of the unused upper roll sponge 77. When the upper roll sponge 77 repeatedly scrubs substrates W, the surface shape of the upper roll sponge 77 changes, and as a result, the three-dimensional image data obtained by the imaging device 61 changes. The imaging device 61 is configured to compare (for example, superimpose) three-dimensional image data of the unused upper roll sponge 77 with three-dimensional image data of the upper roll sponge 77 after use, and calculate an amount of change in three-dimensional image data (for example, an amount of decrease in surface area of the distal end of the nodule 77C).

The amount of change in the three-dimensional image data corresponds to the degree of deterioration of the upper roll sponge 77. Therefore, by comparing the three-dimensional image data obtained as the surface data (for example, calculating the amount of decrease in the surface area of the distal end of the nodule 77C) each time a predetermined number of substrates W are scrubbed, the degree of deterioration the upper roll sponge 77 can be grasped.

In the case where the surface data obtained by the imaging device 61 is the strain image data that visualizes a strain of the upper roll sponge 77, the upper roll sponge 77 is required to have, on its surface, regular or irregular pattern which is so-called "speckle pattern". Further, the surface-property measuring device 60 includes a pressing device (not shown) configured to apply a predetermined pressure to the upper roll sponge 77 that has been moved to the retreat position P2 (or the retreat position P1). The pressing device is, for example, a device configured to apply a pressing force in the axial direction of the upper roll sponge 77 from both ends of the upper roll sponge 77 (i.e., compress the upper roll sponge 77 in the axial direction with a predetermined pressing force).

The imaging device 61 includes a camera unit (not shown) configured to capture image data of the upper roll sponge 77 before and after being deformed by the pressing device, and an image processing unit (not shown) configured to visualize the strain of the upper roll sponge 77 using a digital image correlation method (DIC). The digital image correlation method measures a displacement of the speckle pattern by analyzing and calculating the image data of the upper roll sponge 77 taken by the camera unit before and after the deformation of the upper roll sponge 77, and visualizes the strain generated in the upper roll sponge 77 based on the displacement of the speckle pattern.

When the upper roll sponge 77 repeatedly scrubs substrates W, the surface shape of the upper roll sponge 77 changes. As a result, the amount of strain generated in the used upper roll sponge 77 is different from the amount of strain generated in the unused upper roll sponge 77. The amount of change in the strain corresponds to the degree of deterioration of the upper roll sponge 77. Therefore, the degree of deterioration of the upper roll sponge 77 can be grasped by comparing the strain image data obtained as the surface data (i.e., calculating the amount of change in the strain) each time a predetermined number of substrates W are scrubbed.

In the case where the surface data obtained by the imaging device 61 is the spectral image data or the hyperspectral image data of the upper roll sponge 77, the imaging device 61 includes a camera unit configured as a so-called "multispectral camera" or "hyperspectral camera". The multispectral camera or the hyperspectral camera can obtain spectral images (for example, grayscale images) whose number corresponds to the number of spectra, and can further obtain two-dimensional image data in which these spectral images are overlapped. In particular, the hyperspectral camera can obtain a spectral image in the near infrared range which is an invisible range. Further, the hyperspectral camera can display the obtained spectral images in different colors and can superimpose these colored spectral images displayed.

When the upper roll sponge 77 repeats scrubbing of substrates W, the surface shape of the upper roll sponge 77 changes. As a result, the spectral image data or hyperspectral image data obtained by the imaging device 61 changes. The imaging device 61 is configured to compare spectral image data or hyperspectral image data of the unused upper roll sponge 77 with spectral image data or hyperspectral image data of the upper roll sponge 77 after use (e.g., superimposes these spectral image data) and calculate the amount of change in the spectral image data or hyperspectral image data (e.g., the amount of decrease in the surface area of the distal end of the nodule 77C and/or the degree of contamination).

The amount of change in the spectral image data or the hyperspectral image data corresponds to the degree of deterioration of the upper roll sponge 77. Further, according to the spectral image data or the hyperspectral image data, contaminants attached to the surface of the upper roll sponge 77 can be distinguished from the material of the upper roll sponge (i.e., a resin, such as PVA). Therefore, the spectral image data or hyperspectral image data obtained as the surface data are compared (for example, the amount of decrease in the surface area of the distal end of the nodule 77C and the amount of increase in the surface area where the contaminants are attached are calculated) each time a predetermined number of substrates W are scrubbed, so that the degree of deterioration of the upper roll sponge 77 can be grasped.

In the case where the imaging device 61 includes a camera unit configured as the hyperspectral camera, the imaging device 61 can calculate and obtain the surface data indicating the degree of deterioration and the degree of contamination of the upper roll sponge 77 (for example, the degree of contamination of the distal end of the nodule 77C). For example, the imaging device 61 can convert the hyperspectral image data that changes according to the degree of deterioration and the degree of contamination of the upper roll sponge 77 into a graph of spectral intensity at each wavelength. In this case, the imaging device 61 includes an image processing unit (not shown) configured to convert hyperspectral image data into a graph of spectral intensity at each wavelength. In this specification, the graph of the spectral intensity at each wavelength may be referred to as "spectral intensity graph".

When the upper roll sponge 77 deteriorates and the surface shape of the upper roll sponge 77 changes, or when contaminants are deposited on the surface of the upper roll sponge 77, the hyperspectral image data obtained by the imaging device 61 changes. As a result, the spectral intensity graph converted from the hyperspectral image data also changes. The imaging device 61 is configured to compare (e.g., superimpose) spectral intensity graph of the unused upper roll sponge 77 with spectral intensity graph of the upper roll sponge 77 after use, and calculate an amount of change in spectral intensity at a predetermined wavelength. The degree of deterioration of the upper roll sponge 77 can be grasped based on the calculated amount of change in spectral intensity.

Further, the imaging device 61 may be configured to be able to calculate a slope of a tangential line on the spectral intensity graph. As the scrubbing of substrates W with the upper roll sponge 77 is repeated, the deterioration of the upper roll sponge 77 and the contamination of the upper roll sponge 77 by the particles progress. However, when the deterioration and contamination of the upper roll sponge 77 progress to some extent, the change in the obtained hyperspectral image data becomes small. Specifically, as the scrubbing of substrates W is repeated, the change in the spectral intensity graph becomes small. The imaging device 61 calculates and obtains the slope of the tangential line on the spectral intensity graph (for example, a differential calculation of the spectral intensity graph) each time a predetermined number of substrates W are scrubbed, and calculates an amount of change in the slope of the tangential line (for example, an amount of change in maximum value of the slope of the tangential line), so that the degree of deterioration of the upper roll sponge 77 can be grasped.

In the case where the surface data obtained by the imaging device 61 is the polarization image data of the upper roll sponge 77, the imaging device 61 includes a camera unit configured as a so-called "polarization camera". The polarization camera can obtain polarization image data including information on the polarization direction and the degree of polarization of reflected light from (the nodule 77C of) the upper roll sponge 77. The polarization camera capable of acquiring polarization image data can visualize a detailed surface state of a subject that is difficult to be recognized with a normal camera configured to obtain color image data.

An amount of change in the polarization image data also corresponds to the degree of deterioration of the upper roll sponge 77. Therefore, the polarization image data obtained as the surface data are compared (for example, an amount of decrease in the surface area of the distal end of the nodule 77C and an amount of increase in surface area where contaminants are attached are calculated) each time a predetermined number of substrates W are scrubbed, so that the degree of deterioration of the upper roll sponge 77 can be grasped.

Next, a method of determining a replacement time of the upper roll sponge (cleaning tool) 77 using the surface-property measuring device 60 will be described. An example in which the imaging device 61 is configured to obtain an area of the dark part in the bipolar image data as the surface data will be described below. However, in the case where the imaging device 61 is configured to obtain, as the surface data, the spectral pattern of the infrared absorption spectrum, the strain image data, the three-dimensional image data, the spectral image data, the hyperspectral image data, or the polarization image data, a replacement time of the upper roll sponge (cleaning tool) 77 can be determined in the same manner as discussed below.

As described above, the degree of deterioration and the degree of contamination of the nodule 77C of the upper roll sponge 77 at the measurement point PA are different from the degree of deterioration and the degree of contamination of the nodule 77C of the upper roll sponge 77 at the measurement point PB. For example, in the examples shown in FIGS. 10A to 10C, the degree of deterioration and the degree of contamination of the nodule 77C of the upper roll sponge 77 at the measurement point PA increase at an accelerated pace as compared to the degree of deterioration and the degree of contamination of the nodule 77C of the upper roll sponge 77 at the measurement point PB. In the examples shown in FIGS. 11A to 11C, the degree of deterioration and the degree of contamination of the nodule 77C of the upper roll sponge 77 at the measurement point PB increase at an accelerated pace as compared to the degree of deterioration and the degree of contamination of the nodule 77C of the upper roll sponge 77 at the measurement point PA.

Therefore, in the present embodiment, the controller 30 obtains, as the surface data, areas of the dark parts of the measurement points PA and PB using the imaging devices 61A and 61B (see FIG. 12) of the surface-property measuring device 60 each time a predetermined number NA of substrates W are scrubbed, and calculates a difference between the area of the dark part of the measurement point PA and the area of the dark part of the measurement point PB. Then, the controller 30 compares the calculated difference with a predetermined threshold value. This threshold value is predetermined by an experiment or the like and is stored in advance in the controller 30.

The predetermined number NA of substrates W is a value used for determining whether or not the surface-property measuring device 60 obtains the surface data of the upper roll sponge 77, and can be set arbitrarily. For example, the predetermined number NA of substrates W may be "1". When the predetermined number NA of substrates W is set to "1", the controller 30 obtains the surface data of the upper roll sponge 77 each time a substrate W is scrubbed.

When the difference is equal to or larger than the predetermined threshold value, the controller 30 determines that the upper roll sponge 77 has reached the replacement time (i.e., the life), and issues an alarm (first alarm) prompting the replacement of the upper roll sponge 77. In one embodiment, the controller 30 may issue the first alarm and may stop the operation of transporting the substrate W to the first cleaning unit. When the difference is smaller than the predetermined threshold value, the controller 30 allows the next substrate W to be transported to the first cleaning unit 16 and continues scrub cleaning of the substrate W using the upper roll sponge 77.

FIG. 15 is a table showing an example of the difference between the area of the dark part of the measurement point PA and the area of the dark part of the measurement point PB. With reference to FIG. 15, the method of determining the replacement time of the upper roll sponge 77 will be described below in more detail.

As shown in FIG. 15, the controller 30 obtains, as the surface data, areas of the dark parts of the measurement points PA and PB of the unused upper roll sponge 77, and calculates the difference between the area of the dark part of the measurement point PA and the area of the dark part of the measurement point PB. In the example shown in FIG. 15, the difference is "1", which shows that the area of the dark part of the measurement point PA is equivalent to the area of the dark part of the measurement point PB. If the area of the dark part of the measurement point PA of the unused upper roll sponge 77 is significantly different from the area of the dark part of the measurement point PB, it is suspected that something is wrong with the upper roll sponge 77 and/or the surface-property measuring device 60 (particularly, the imaging devices 61A and 61B). Therefore, in such a case, the controller 30 may issue an alarm prompting to check the state of the upper roll sponge 77 and/or the state of the surface-property measuring device 60.

Next, the controller 30 determines whether or not the number N of processed substrates W has reached a predetermined process number NA (referred to as "NA1" in FIG. 15 for convenience of explanation). If the number N of processed substrates W has reached the predetermined process number NA1, the controller 30 returns the number N of processed substrates W to zero, obtains the areas of the dark parts of the measurement points PA and PB of the upper roll sponge 77 as the surface data using the surface-property measuring device 60, and calculates the difference between the area of the dark part of the measurement point PA and the area of the dark part of the measurement point PB. Further, the controller 30 compares the calculated difference with a predetermined threshold value Dt. In the example shown in FIG. 15, the predetermined threshold value Dt is 22, and the difference when the number N of processed substrates W has reached the predetermined process number NA1 is "4". Therefore, the controller 30 allows for scrubbing of substrate W again until the number N of processed substrates W reaches the predetermined process number NA (referred to as "NA2" in FIG. 15 for convenience of explanation).

When the number N of processed substrates W reaches the predetermined process number NA2, the controller 30 returns the number N of processed substrates W to zero again, obtains the areas of the dark parts of the measurement points PA and PB of the upper roll sponge 77 as the surface data using the surface-property measuring device 60, and calculates the difference between the area of the dark part of the measurement point PA and the area of the dark part of the measurement point PB. The controller 30 compares the calculated difference with the predetermined threshold value Dt, and determines whether or not the difference is equal to or larger than the predetermined threshold value Dt. The controller 30 repeats these steps until the difference becomes equal to or larger than the predetermined threshold value Dt. When the difference is equal to or larger than the predetermined threshold value Dt (in FIG. 15, when a predetermined process number NAn is reached), the controller 30 issues an alarm (first alarm) prompting the replacement of the upper roll sponge 77 and stops the operation of transporting the next substrate W to the first cleaning unit 16. This allows an operator to replace the upper roll sponge 77 with a new roll sponge before the substrate W is back-contaminated by the upper roll sponge 77.

The predetermined threshold value Dt, which is stored in advance in the controller 30, is an important value for determining an appropriate replacement time of the cleaning tool (upper roll sponge 77 in the above-described embodiments). As described above, when the scrub cleaning by rubbing the cleaning tool against a substrate W is repeated, the surface of the cleaning tool is worn and particles are accumulated in the cleaning tool, thus causing the back-contamination of the substrate W. Therefore, in order to determine the threshold value for determining the replacement time of the cleaning tool, it is necessary to consider the cleaning efficiency, the amount of particles generated, and the like.

For example, the number of processed substrates W at which the number of particles attached to the surface of the substrate W greatly increases is determined by an experiment, and the difference corresponding to the determined number of processed substrates is determined to be the predetermined threshold value Dt. Alternatively, a difference corresponding to the number of processed substrates W at which the cleaning efficiency of the substrate W is greatly lowered may be determined to be the predetermined threshold value Dt. In one embodiment, the number of processed substrates W at which the number of particles attached to the surface of the substrate W greatly increases may be compared with the difference corresponding to the number of processed substrates W at which the cleaning efficiency of the substrate W is greatly lowered. In this case, the smaller one of the differences is determined to be the predetermined threshold value Dt.

Figure 16:
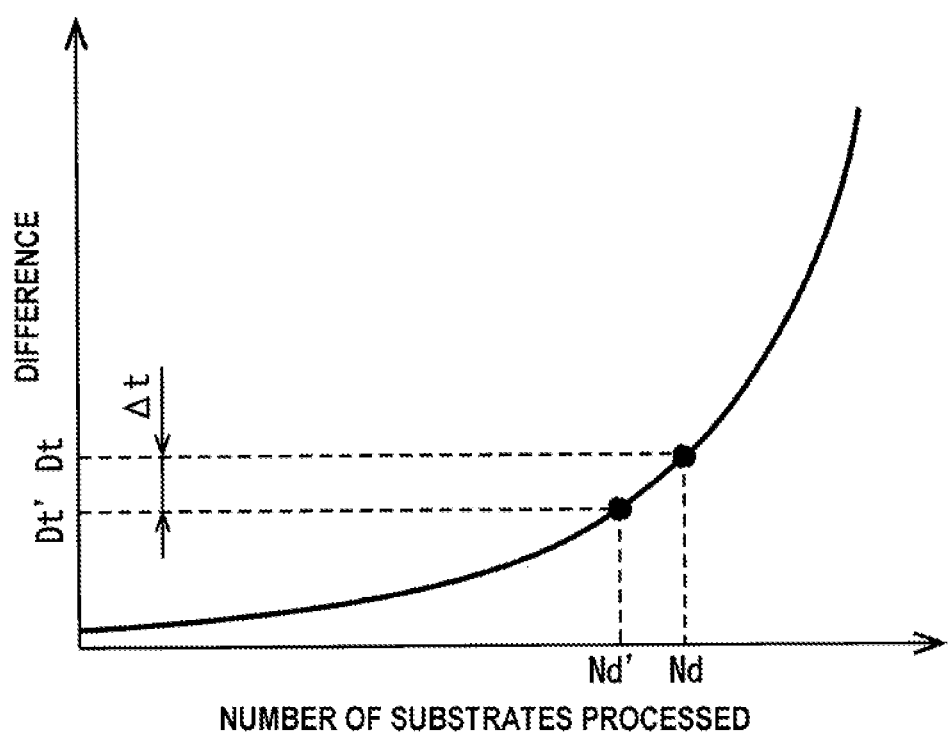
FIG. 16 is a graph for explaining a modified example of a method of determining a replacement time of the upper roll sponge described with reference to FIG. 15.

FIG. 16 is a graph for explaining a modified example of the method of determining the replacement time of the upper roll sponge 77 described with reference to FIG. 15. In the graph shown in FIG. 16, a vertical axis represents the difference between the area of the dark part of the measurement point PA and the area of the dark part of the measurement point PB, and a horizontal axis represents the number of processed substrates W.

In the example shown in FIG. 16, a pre-threshold value (second threshold value) Dt' is determined in advance by subtracting a predetermined value (Δt) from the predetermined threshold value (first threshold value) Dt. This pre-threshold value Dt' is also stored in advance in the controller 30. The controller 30 issues a second alarm when the difference between the area of the dark part of the measurement point PA and the area of the dark part of the measurement point PB is equal to or larger than the pre-threshold value Dt' (in FIG. 15, when the number of processed substrates W has reached Nd'). The second alarm does not require the replacement of the upper roll sponge 77 immediately, but can inform the operator that a period of use of the upper roll sponge 77 will soon reach the replacement time. The second alarm allows the operator to prepare a new upper roll sponge 77 in advance. In one embodiment, the upper roll sponge 77 may be replaced when the second alarm is issued. In this case, the occurrence of back contamination of the substrate W can be prevented more effectively.

Next, an example of another method of determining the replacement time of the upper roll sponge 77 will be described. Since configurations of the present embodiment, which will not be particularly described, are the same as those of the method of determining the replacement time of the upper roll sponge 77 described above, repetitive descriptions thereof will be omitted.

As described above, in the case where the imaging device 61 includes the camera unit configured as the hyperspectral camera, the imaging device 61 can grasp the degree of deterioration of the upper roll sponge 77 from the spectral intensity graph converted from the hyperspectral image data. In the present embodiment, the replacement time of the upper roll sponge 77 is determined by using the spectral intensity graph converted from the hyperspectral image data.

Figure 17A:
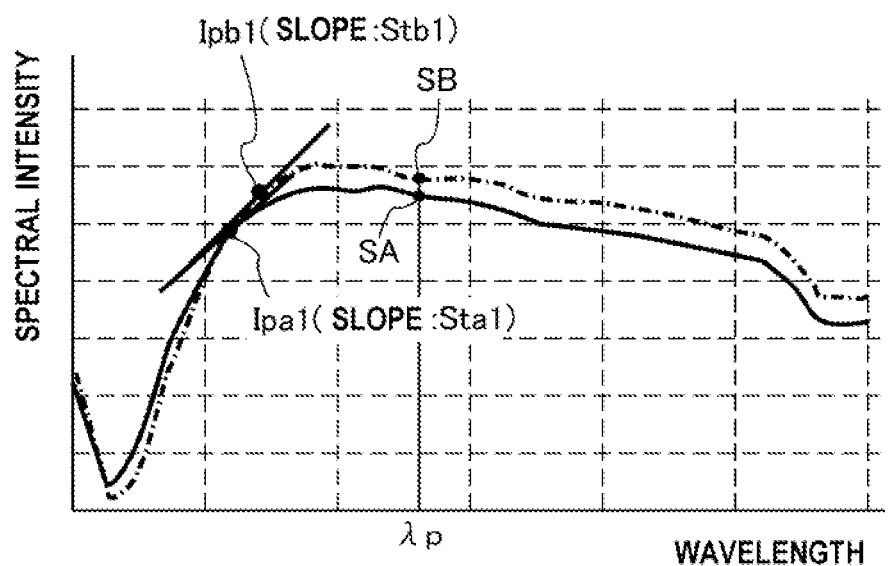
FIG. 17A is a diagram showing spectral intensity graphs converted from hyperspectral image data at two measurement points after a predetermined number of substrates are scrubbed.
Figure 17B:
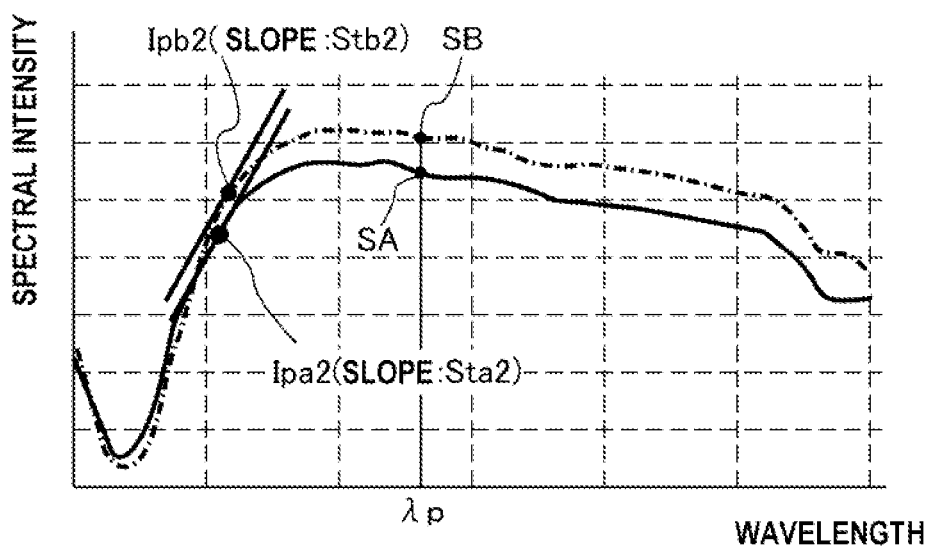
FIG. 17B is a diagram showing spectral intensity graphs converted from hyperspectral image data at the two measurement points PA and PB after a predetermined number of substrates W are further scrubbed.

FIG. 17A is a diagram showing spectral intensity graphs converted from hyperspectral image data at two measurement points PA and PB after a predetermined number NA of substrates W have been scrubbed, and FIG. 17B is a diagram showing spectral intensity graphs converted from hyperspectral image data at the two measurement points PA and PB after a predetermined number NA of substrates W have been further scrubbed. In FIGS. 17A and 17B, a vertical axis represents the spectral intensity and a horizontal axis represents the wavelength. In FIGS. 17A and 17B, a solid line represents spectral intensity at each of the wavelengths converted from the hyperspectral image data at the measurement point PA, and one-point chain line represents spectral intensity at each of the wavelengths converted from the hyperspectral image data at the measurement point PB. The graph in FIGS. 17A and 17B shows that light is absorbed as it goes up and light is reflected as it goes down.

As shown in FIGS. 17A and 17B, when the spectral intensity graphs converted from the hyperspectral image data obtained at the two measurement points PA and PB having different deterioration degrees are superimposed, the two graphs obtained are different from each other. Therefore, there is a difference between spectral intensities SA and SB of the two measurement points PA and PB at a predetermined wavelength $\lambda p$.

In the present embodiment, the controller 30 obtains, as the surface data, the spectral intensity graphs converted from the hyperspectral image data obtained at the measurement points PA and PB using the imaging devices 61A and 61B (see FIG. 12) of the surface-property measuring device 60 each time a predetermined number NA of substrates W are scrubbed. Further, the controller 30 calculates a difference (=SB-SA) between the spectral intensity of the measurement point PA and the spectral intensity of the measurement point PB at a predetermined wavelength $\lambda p$. Then, the controller 30 compares the calculated difference with a predetermined threshold value. This threshold value is predetermined by an experiment or the like and is stored in advance in the controller 30.

When the difference is equal to or larger than the predetermined threshold value, the controller 30 determines that the upper roll sponge 77 has reached the replacement time (i.e., the life), and issues an alarm (first alarm) prompting the replacement of the upper roll sponge 77. In one embodiment, the controller 30 may issue the first alarm and may stop the operation of transporting a substrate W to the first cleaning unit. When the difference is smaller than the predetermined threshold value, the controller 30 allows the next substrate W to be transported to the first cleaning unit 16 and continues scrub cleaning of the substrate W using the upper roll sponge 77.

As described with reference to FIG. 16, a pre-threshold value (second threshold value) Dt' may be determined in advance by subtracting a predetermined value ($\Delta t$) from a predetermined threshold value (first threshold value) Dt. In this case, the controller 30 issues the second alarm when the difference between the spectral intensity of the measurement point PA and the spectral intensity of the measurement point PB at a predetermined wavelength $\lambda p$ is equal to or larger than the pre-threshold value Dt'.

In the present embodiment, when an absolute value of the amount of change in the difference at the predetermined wavelength $\lambda p$ is small, it may be difficult or erroneous to determine an appropriate replacement time of the upper roll sponge 77. Therefore, an appropriate replacement time of the upper roll sponge 77 may be determined in consideration of the change in the slope of the tangential line on the spectral intensity graph of the measurement point PA and the change in the slope of the tangential line on the spectral intensity graph of the measurement point PB. For example, an appropriate replacement time of the upper roll sponge 77 may be determined based on an amount of change in a maximum value of the slope of the tangential line on the spectral intensity graph of the measurement point PA and an amount of change in a maximum value of the slope of the tangential line on the spectral intensity graph of the measurement point PB. In this specification, a point at which the slope of the tangential line on the spectral intensity graph becomes the maximum value may be referred to as an "inflection point".

As described above, as the deterioration of the upper roll sponge 77 and the contamination of the upper roll sponge 77 by the particles progress, the change in the hyperspectral image data obtained becomes small. Specifically, in both the spectral intensity graph of the measurement point PA and the spectral intensity graph of the measurement point PB obtained each time a predetermined number NA of substrates W are scrubbed, the slope of the tangential line at the inflection point does not change. In this embodiment, this phenomenon is used to determine an appropriate replacement time of the upper roll sponge 77.

As shown in FIG. 17A, a slope of a tangential line at an inflection point Ipa1 on the spectral intensity graph of the measurement point PA is Sta1, and a slope of a tangential line at an inflection point Ipb1 on the spectral intensity graph of the measurement point PB is Stb1. As shown in FIG. 17B, after scrubbing of the predetermined process number NA of substrates, the inflection point of the measurement point PA moves to Sta2, and the slope of the tangential line at the inflection point Sta2 is Sta2. Similarly, after scrubbing of the predetermined process number NA of substrates, the inflection point of the measurement point PB moves to Stb2, and the slope of the tangential line at this inflection point Stb2 is Stb2.

Each time the predetermined process number NA of substrates W are scrubbed, the controller 30 obtains, as the surface data, the spectral intensity graphs converted from the hyperspectral image data obtained at the measurement points PA and PB using the imaging devices 61A and 61B (see FIG. 12) of the surface-property measuring device 60. Further, the controller 30 calculates the amount of change (=Sta2-Sta1) in the slope of the tangential line at the inflection point in the spectral intensity graph of the measurement point PA and the amount of change (=Stb2-Stb1) in the slope of the tangential line at the inflection point in the spectral intensity graph of the measurement point PB. The controller 30 then compares each calculated difference with a predetermined threshold value. This threshold value is predetermined by an experiment or the like and is stored in advance in the controller 30.

When each amount of the change is equal to or less than the predetermined threshold value, the controller 30 determines that the upper roll sponge 77 has reached the replacement time (i.e., the life), and issues an alarm (a first alarm) that prompts the replacement of the upper roll sponge 77. In one embodiment, the controller 30 may issue the first alarm and may stop the operation of transporting the substrate W to the first cleaning unit. When each amount of the change is larger than the predetermined threshold value, the controller 30 allows the next substrate W to be transported to the first cleaning unit 16 and continues scrub cleaning of the substrate W using the upper roll sponge 77.

In one embodiment, the controller 30 may determine that the upper roll sponge 77 has reached the replacement time (i.e., the life) when either one of the amount of change in the slope of the tangential line at the inflection point in the spectral intensity graph of the measurement point PA and the amount of change in the slope of the tangential line at the inflection point in the spectral intensity graph of the measurement point PB is equal to or less than the predetermined threshold value. In one embodiment, the controller 30 may determine the replacement time of the upper roll sponge 77 based on the difference between the spectral intensity of the measurement point PA and the spectral intensity of the measurement point PB at the predetermined wavelength λp, and based on at least one of the amount of change in the slope of the tangential line at the inflection point in the spectral intensity graph of the measurement point PA and the amount of change in the slope of the tangential line at the inflection point in the spectral intensity graph of the measurement point PB. For example, the controller 30 may determine that the upper roll sponge 77 has reached the replacement time when the above difference is equal to or more than a predetermined threshold value and the amount of change in the slope of the tangential line at the inflection point in the spectral intensity graph of the measurement point PA is equal to or less than a predetermined threshold value. In this case, since the degree of deterioration and the progress of contamination of the upper roll sponge 77 can be determined more accurately, an appropriate replacement time of the upper roll sponge 77 can be determined more accurately.

In one embodiment, the spectral intensity graph converted from the hyperspectral image data obtained at one measurement point PA (or PB) may be used to determine the replacement time of the upper roll sponge 77. Since the configurations of this embodiment, which will not be particularly described, are the same as those of the above-described embodiments, the duplicated descriptions thereof will be omitted.

Figure 18:
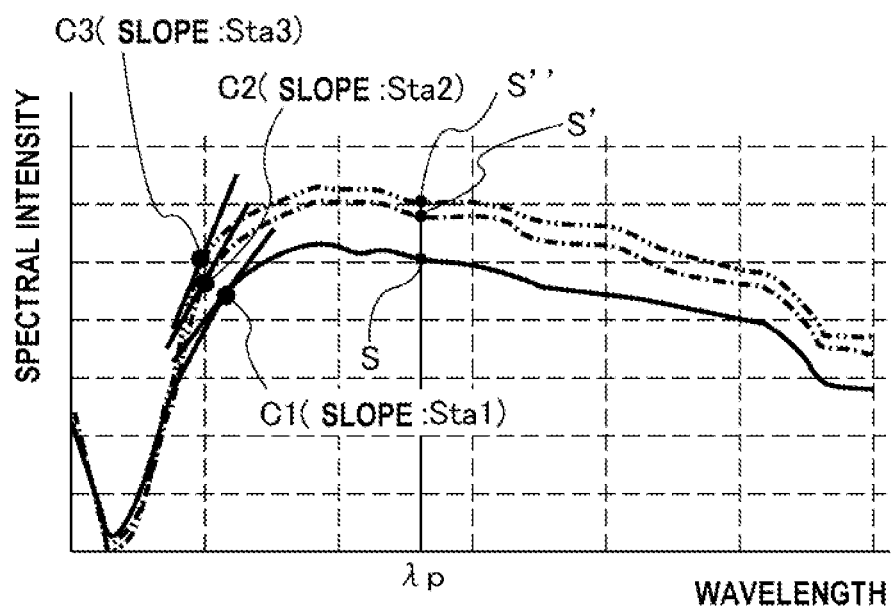
FIG. 18 is a diagram showing a change in a spectral intensity graph converted from hyperspectral image data obtained at one measurement point PA.
Figure 19:
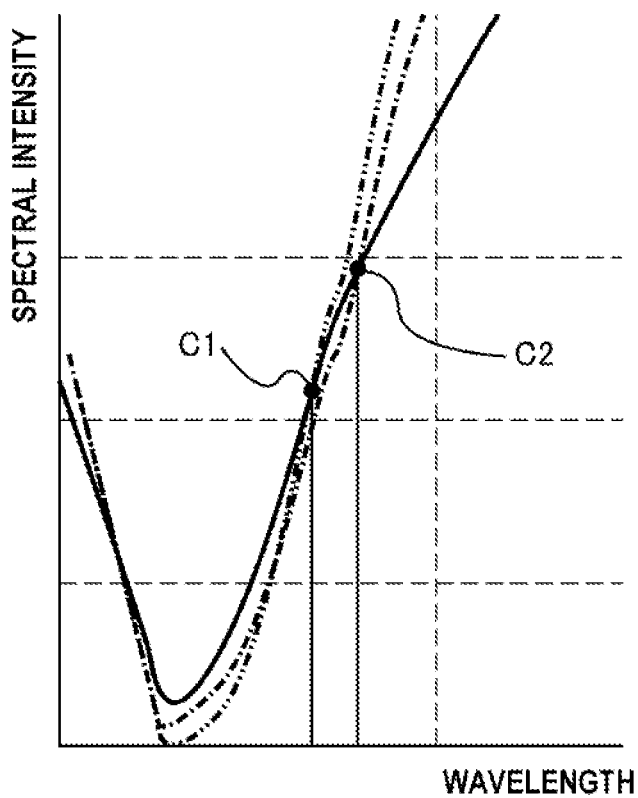
FIG. 19 is an enlarged view showing an intersection of a solid line and a one-point chain line in FIG. 18 and an intersection of the one-point chain line and a two-point chain line in FIG. 18.

FIG. 18 is a diagram showing a change in the spectral intensity graph converted from the hyperspectral image data obtained at one measurement point PA. In FIG. 18, a vertical axis represents the spectral intensity and a horizontal axis represents the wavelength. In FIG. 18, a solid line represents a spectral intensity graph converted from hyperspectral image data at one measurement point PA after a predetermined number NA of substrates W are scrubbed, one-point chain line represents a spectral intensity graph converted from hyperspectral image data at one measurement point PA after a predetermined number NA of substrates W are further scrubbed, and a two-point chain line shows a spectral intensity graph converted from hyperspectral image data at one measurement point PA after a predetermined number NA of substrates W are further scrubbed. FIG. 19 is an enlarged view showing an intersection of the solid line and the one-point chain line in FIG. 18 and an intersection of the one-point chain line and the two-point chain line in FIG. 18.

As shown in FIG. 18, each time scrubbing of a predetermined number NA of substrates W is repeated, the spectral intensity graph converted from the hyperspectral image data changes as a whole. However, as shown in FIG. 19, the amount of change in the spectral intensity is small in the vicinity of an intersection C1 of the solid line and the one-point chain line and an intersection C2 of the one-point chain line and the two-point chain line. As a result, it is difficult to accurately determine the appropriate replacement time of the upper roll sponge 77. On the other hand, as seen in spectral intensities at a predetermined wavelength λp that is larger than wavelengths of the intersections C1 and C2, a difference between a spectral intensity S' on the one-point chain line at the predetermined wavelength λp and a spectral intensity S" on the two-point chain line at the predetermined wavelength λp is smaller than a difference between a spectral intensity S on the solid line at the predetermined wavelength λp and the spectral intensity S' on the one-point chain line at the predetermined wavelength λp. Therefore, in the present embodiment, the replacement time of the upper roll sponge 77 is determined based on the amount of change in this difference.

In the present embodiment, each time a predetermined number NA of substrates W are scrubbed, the controller 30 obtains, as the surface data, a graph of the spectral intensity at each of wavelengths converted from the hyperspectral image data obtained at the measurement point PA by using the imaging device 61A (see FIG. 12) of the surface-property measuring device 60. Further, the controller 30 calculates a difference between a currently-obtained spectral intensity of the measurement point PA at the predetermined wavelength λp and a previously-obtained spectral intensity of the measurement point PA at the predetermined wavelength λp. Then, the controller 30 compares this difference with a predetermined threshold value. This threshold value is predetermined by an experiment or the like and is stored in advance in the controller 30.

When the difference between the currently-obtained spectral intensity at the predetermined wavelength λp and the previously-obtained spectral intensity at the predetermined wavelength λp is smaller than the predetermined threshold value, the controller 30 determines that the upper roll sponge 77 has reached the replacement time (i.e., the life), and issues an alarm (first alarm) prompting the replacement of the upper roll sponge 77. In one embodiment, the controller 30 may issue the first alarm and may stop the operation of transporting the substrate W to the first cleaning unit. When the difference is smaller than the predetermined threshold value, the controller 30 allows the next substrate W to be transported to the first cleaning unit 16 and continues scrub cleaning of the substrate W using the upper roll sponge 77.

Even in this embodiment, if an absolute value of the amount of change in the difference at the predetermined wavelength λp is small, it may be difficult or erroneous to determine an appropriate replacement time of the upper roll sponge 77. Therefore, each time scrubbing of a predetermined number NA of substrates is repeated, an appropriate replacement time of the upper roll sponge 77 may be determined based on the amount of change in the slope of the tangential line on the spectral intensity graph converted from the hyperspectral image data and the above difference. This method will be described in more detail.

A relational expression Sta1>Sta2>Sta3 holds among a slope Sta1 of a tangential line at an inflection point CP1 of the solid line, a slope Sta2 of a tangential line at an inflection point CP2 of the one-point chain line, and a slope Sta3 of a tangential line at an inflection point C3 of the two-point chain line. However, when the spectral intensity graph converted from the hyperspectral image data hardly changes, the first difference between Sta1 obtained the time before last and Sta2 obtained last time is almost equal to the second difference between Sta2 obtained last time and Sta1 obtained this time. In other words, as the scrubbing of substrates W is repeated, a difference between the first difference and the second difference approaches zero. Utilizing this phenomenon, the controller 30 determines that the upper roll sponge 77 has reached the replacement time when the amount of change in the spectral intensity at the predetermined wavelength $\lambda p$ (i.e., the difference between the currently-obtained spectral intensity at the predetermined wavelength $\lambda p$ and the spectral intensity at the predetermined wavelength $\lambda p$ obtained last time) is equal to or less than a predetermined threshold value and the difference between the first difference and the second difference is equal to or less than a predetermined threshold value. In this case, since the degree of deterioration and the progress of contamination of the upper roll sponge 77 can be determined more accurately, an appropriate replacement time of the upper roll sponge 77 can be determined more accurately.

Inventors have diligently studied the method of determining an appropriate replacement time of the upper roll sponge 77 based on the change in the spectral intensity graph. As a result, the following findings were obtained. Specifically, the inventors found that, as the deterioration of the upper roll sponge 77 and the contamination of the upper roll sponge 77 by the particles progress, the intersection of the previously obtained spectral intensity graph and the currently obtained spectral intensity graph (see the intersection points CP1 and CP2 in FIG. 19) does not move in the horizontal-axis direction (i.e., the wavelength value of the intersection CP1 and the wavelength value of the intersection CP2 are almost the same). Thus, in one embodiment, the controller 30 may determine that the upper roll sponge 77 has reached the replacement time when a change in the wavelength value of the intersection in the spectral intensity graph is equal to or less than a predetermined threshold value.

FIG. 20 is a table showing an example of the change in the spectral intensity obtained at one measurement point PA after scrubbing of a predetermined number NA of substrates W. Hereinafter, a method of determining the replacement time of the upper roll sponge 77 based on the difference in spectral intensity obtained at one measurement point PA will be described with reference to FIG. 20.

As shown in FIG. 20, the controller 30 obtains, as the surface data, a spectral intensity graph converted from a hyperspectral image of the measurement point PA of the unused upper roll sponge 77 (or the upper roll sponge 77 after self-cleaning thereof), and stores therein a spectral intensity at a predetermined wavelength $\lambda p$ in the graph. Next, the controller 30 determines whether or not the number N of processed substrates W has reached a predetermined process number NA (referred to as "NA1" in FIG. 20 for convenience of explanation). When the number N of processed substrates W has reached the predetermined process number NA1, the controller 30 returns the number N of processed substrates W to zero and obtains, as the surface data, a spectral intensity graph converted from a hyperspectral image of the measurement point PA of the upper roll sponge 77. The controller 30 stores therein a spectral intensity at the predetermined wavelength $\lambda p$ in the graph. Further, the controller 30 calculates a difference between the spectral intensity at the predetermined wavelength $\lambda p$ of the measurement point PA of the unused upper roll sponge 77 and the spectral intensity at the predetermined wavelength $\lambda p$ of the measurement point PA of the upper roll sponge 77 that has scrubbed the predetermined process number NA1 of substrates W. In the example shown in FIG. 20, this difference is "16". Further, the controller 30 compares the calculated difference with a predetermined threshold value Dt. In the example shown in FIG. 20, the predetermined threshold value Dt is 2, and the difference at which the number N of processed substrates W reaches the predetermined process number NA1 is "16". Therefore, the controller 30 allows for scrubbing of a substrate W until the number N of processed substrates W reaches the predetermined process number NA again (referred to as "NA2" in FIG. 20 for convenience of explanation).

When the number N of processed substrates W has reached the predetermined process number NA2, the controller 30 returns the number N of processed substrates W to zero again and obtains, as the surface data, a spectral intensity graph converted from a hyperspectral image of the measurement point PA of the upper roll sponge 77. The controller 30 stores therein a spectral intensity at the predetermined wavelength $\lambda p$ in the graph. Further, the controller 30 calculates a difference between the spectral intensity at the predetermined wavelength $\lambda p$ of the measurement point PA of the upper roll sponge 77 that has scrubbed the predetermined process number NA1 of substrates W and the spectral intensity at the predetermined wavelength $\lambda p$ of the measurement point PA of the upper roll sponge 77 that has scrubbed the predetermined process number NA2 of substrates W. In the example shown in FIG. 20, this difference is "15".

In one embodiment, the controller 30 may calculate the difference (i.e., the amount of change) in the spectral intensity at the predetermined wavelength $\lambda p$, may calculate the difference between the slope Spa1 of the tangential line at the inflection point CP1 of the spectral intensity graph after scrubbing of the predetermined process number NA1 of substrates W and the slope Spa2 of the tangential line at the inflection point CP2 of the spectral intensity graph after scrubbing of the predetermined process number NA2 of substrates W (i.e., calculate the amount of change in the slope of the tangential line at the inflection point), and may compare this difference in the slope with a predetermined threshold value.

The controller 30 repeats these processing steps until the difference is smaller than the predetermined threshold value Dt, or until the difference is smaller than the predetermined threshold value Dt and the amount of change in the slope of the tangential line is smaller than the predetermined threshold value. When the difference is smaller than the predetermined threshold value Dt (in FIG. 20, when the predetermined process number NAn is reached), or when the difference is smaller than the predetermined threshold value Dt and the amount of change in the slope of the tangential line is smaller than the predetermined threshold value, the controller 30 issues an alarm prompting the replacement of the upper roll sponge 77, and stops the operation of transporting the next substrate W to the first cleaning unit 16. This allows an operator to replace the upper roll sponge 77 with a new roll sponge before a substrate W is back-contaminated by the upper roll sponge 77.

In one embodiment, the controller 30 may issue an alarm prompting the replacement of the upper roll sponge 77 and may stop transporting of the next substrate W to the first cleaning unit 16 when the difference is smaller than the predetermined threshold value Dt and after a predetermined process number NB of substrates W are scrubbed.

In the above-mentioned example, the surface-property measuring device 60 obtains the surface data of the upper roll sponge 77 at the two measurement points PA and PB, but the present embodiment is not limited to this example. For example, the surface-property measuring device 60 may obtain surface data of the upper roll sponge 77 at three or more measurement points.

For example, as shown by an imaginary line (two-point chain line) in FIG. 12, a measurement point PC is set at the reversing point T where the relative velocity Vs is zero. The surface-property measuring device 60 may further have an imaging device 61C configured to obtain surface data at the measurement point PC. Further, the surface-property measuring device 60 may include camera-moving mechanisms 63A and 63B configured to move the imaging devices 61A and 61B in the longitudinal direction of the upper roll sponge 77. Each of the camera-moving mechanisms 63A and 63B is a linear motion mechanism, such as an air cylinder or a ball screw mechanism. According to this configuration, by moving the imaging devices 61A and 61B in the longitudinal direction of the upper roll sponge 77, the positions of the measurement points PA and PB at which the imaging devices 61A and 61B obtain the surface data can be changed. Therefore, the imaging devices 61A and 61B can obtain the surface data at multiple measurement points.

In an embodiment in which the imaging device 61A is coupled to the camera-moving mechanism 63A, the imaging device 61B (and the imaging device 61C) may be omitted. In this case, the camera-moving mechanism 63A moves the imaging device 61A in the longitudinal direction of the upper roll sponge 77, so that the imaging device 61A can obtain the surface data at multiple measurement points (for example, measurement points PA, PB, PC).

When the surface data are obtained at three or more measurement points, the controller 30 may calculate differences between two of all possible combinations of these measurement points. For example, when the three measurement points PA, PB, and PC are set, the controller 30 may obtain a difference D1 of the surface data obtained at the measurement point PA and the measurement point PB, a difference D2 of the surface data obtained at the measurement point PA and the measurement point PC, a difference D3 of the surface data obtained at the measurement point PB and the measurement point PC. In this case, the controller 30 stores in advance three predetermined threshold values Dt1, Dt2, Dt3 corresponding to the three differences D1, D2, and D3, respectively. The controller 30 compares the above three differences D1, D2, D3 with the predetermined threshold values Dt1, Dt2, Dt3, respectively.

The controller 30 may issue an alarm prompting the replacement of the upper roll sponge 77 when all of the three differences D1, D2, and D3 are equal to or higher than the predetermined threshold values Dt1, Dt2, and Dt3, or when one or two of the differences D1, D2, and D3 is equal to or higher than corresponding predetermined threshold value(s).

In one embodiment, the controller 30 may issue a second alarm when one of the three differences D1, D2, D3 is equal to or higher than the corresponding predetermined threshold value.

Figure 21:
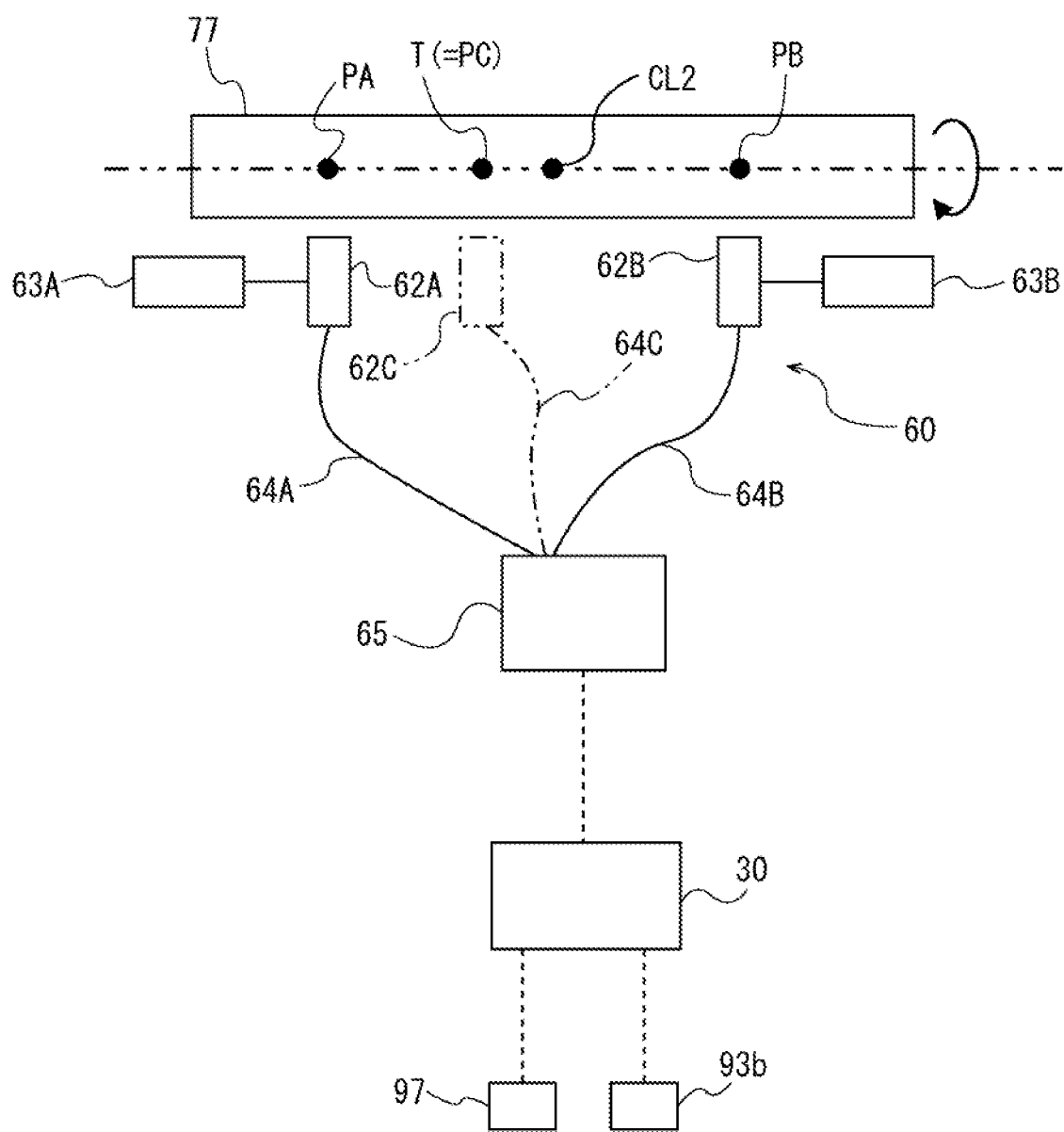
FIG. 21 is a schematic diagram showing a surface-property measuring device according to another embodiment.

FIG. 21 is a schematic view showing a surface-property measuring device according to another embodiment. Since configurations, which will not be particularly described, are the same as those of the above-described embodiments, repetitive descriptions thereof will be omitted.

The surface-property measuring device 60 shown in FIG. 21 includes camera units 62A and 62B configured to obtain image data of the upper roll sponge 77, and an image processing unit 65 configured to convert the image data obtained by the camera units 62A and 62B into surface data. The camera units 62A and 62B are coupled to the image processing unit 65 via cables (for example, optical fibers) 64A and 64B.

The image processing unit 65 is coupled to the controller 30 and sends the surface data converted from the image data to the controller 30. As described above, the controller 30 determines the replacement time of the upper roll sponge 77 based on the difference in the surface data converted from the image data obtained by the camera units 62A and 62B at the measurement points PA and PB.

As shown in FIG. 21, the surface-property measuring device 60 may include a camera unit 62C configured to obtain image data of the measurement point PC. In this case, the camera unit 62C is coupled to the image processing unit 65 via a cable (for example, an optical fiber) 64C.

Figure 22:
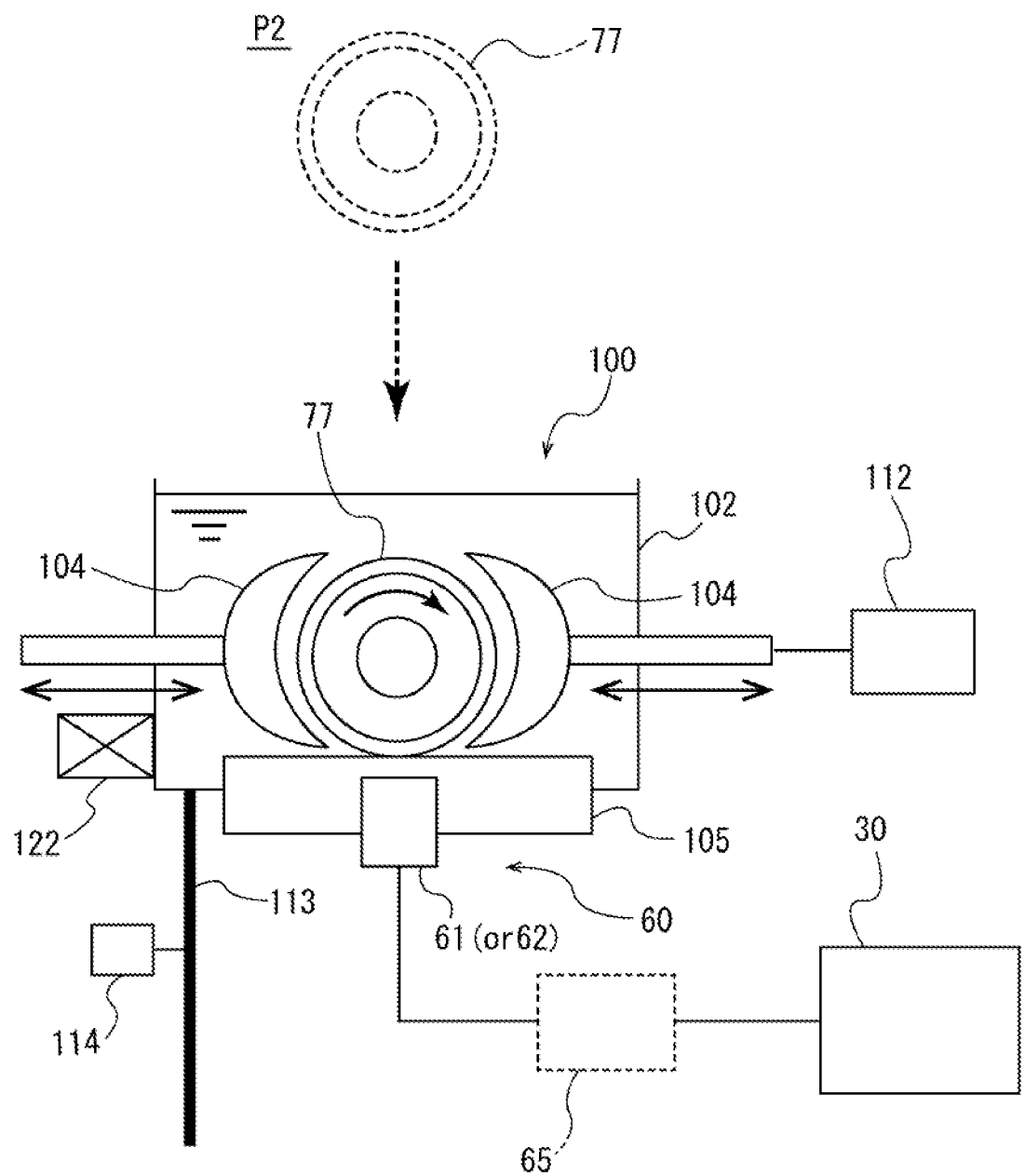
FIG. 22 is a schematic diagram showing an example of a cleaning-tool cleaning device.

The first cleaning unit 16 may include a cleaning-tool cleaning device configured to clean off contaminants attached to the roll sponges 77 and 78. FIG. 22 is a schematic view showing an example of the cleaning-tool cleaning device.

A cleaning-tool cleaning device 100 shown in FIG. 22 is arranged below the retreat position P2 shown in FIG. 4. The cleaning-tool cleaning device 100 includes a cleaning tank 102 configured to hold a cleaning liquid (e.g., pure water) therein, contact members (cleaning members) 104 configured to contact and press the rotating upper roll sponge 77 in the cleaning tank 102 to clean the upper roll sponge 77, a drive device 112 configured to move the contact members 104 toward and away from the upper roll sponge 77, a drain pipe 113 configured to discharge the cleaning liquid from the cleaning tank 102, and a particle counter 114 coupled to the drain pipe 113. The cleaning liquid is supplied from a supply pipe (not shown) into the cleaning tank 102. The upper roll sponge 77 is moved to the retreat position P2 (see FIG. 4) by the cleaning-tool moving unit 51 and is moved (lowered) into the cleaning tank 102 by the vertically-moving mechanism 53 of the cleaning-tool moving unit 51.

Each contact member 104 is, for example, a quartz plate, and the entire length of each contact member 104 is substantially equal to the entire length of the upper roll sponge 77 so that the contact member 104 can clean the entire outer peripheral surface of the upper roll sponge 77. In this cleaning-member cleaning device 100, the upper roll sponge 77 that has scrubbed the substrate W is immersed in the cleaning liquid in the cleaning tank 102, and the contact members 104 press the rotating upper roll sponge 77 with predetermined pressing force, thereby cleaning the upper roll sponge 77. As a result, particles (contaminants) attached to the upper roll sponge 77 are removed from the upper roll sponge 77. As shown in FIG. 22, the cleaning-tool cleaning device 100 may have an ultrasonic transmitter 122 configured to apply ultrasonic wave to the cleaning liquid in the cleaning tank 102.

The particle counter 114 is a device that measures the number of particles in the cleaning liquid discharged from the cleaning tank 102. A measured value of the particle counter 114 corresponds to the degree of contamination of the upper roll sponge (cleaning tool) 77.

Specifically, when the measured value of the particle counter 114 is high, it means that the degree of contamination of the upper roll sponge 77 is high. When the measured value of the particle counter 114 is low, it means that the degree of contamination of the upper roll sponge 77 is low.

The particle counter 114 is coupled to the controller 30 (see FIG. 1), and the measured value of the particle counter 114 is sent to the controller 30. The controller 30 monitors the degree of contamination of the cleaning liquid (i.e., the degree of contamination of the upper roll sponge 77) based on the measured value of the particle counter 114. Further, the controller 30 performs a feedback-control of the drive device 121 based on the degree of contamination of the cleaning liquid. Specifically, when the degree of contamination of the cleaning liquid is high (i.e., the degree of contamination of the upper roll sponge 77 is high), the controller 30 transmits a predetermined control signal to the drive device 21 to change a cleaning condition under which the contact members 104 clean the upper roll sponge 77.

A flat plate-shaped observation wall 105, which is made of a transparent material (e.g., glass), is installed at a bottom of the cleaning tank 102, and the above-mentioned surface-property measuring device 60 is arranged below the observation wall 105. In FIG. 22, the imaging device 61 (or the camera unit 62) of the surface-property measuring device 60 is depicted. Further, in FIG. 22, the image processing unit 65 is depicted by imaginary line (dotted line). In this manner, the imaging device 61 (or the camera unit 62) of the surface-property measuring device 60 is attached to the cleaning-tool cleaning device 100 so as to obtain the surface data (or image data) of the surface of the upper roll sponge 77 in the cleaning tank 102 through the observation wall 105. The imaging device 61 (or the camera unit 62) of the surface-property measuring device 60 obtains the surface data of the upper roll sponge 77 that is rotating or stationary in the cleaning tank 102 of the cleaning-tool cleaning device 100.

Figure 23:
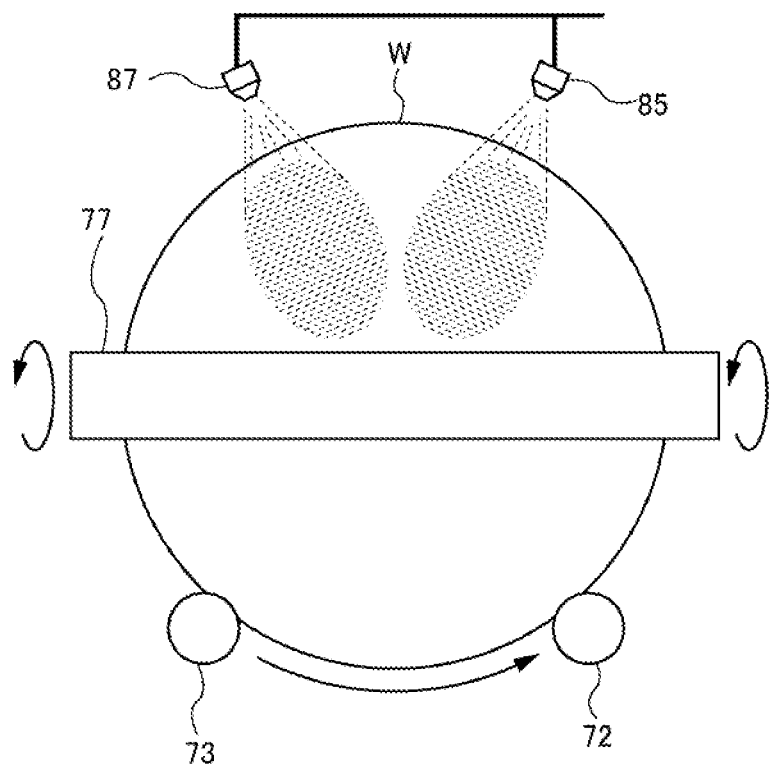
FIG. 23 is a schematic diagram showing an example of cleaning a surface of a substrate with a roll sponge while holding the substrate in a vertical posture.

In the above-described embodiment, the first cleaning unit (substrate cleaning apparatus) 16 is configured to clean both sides (upper and lower surfaces) of the substrate W with the roll sponges 77 and 78, which are cleaning tools, while holding the substrate W in a horizontal posture by the plurality of (four in FIG. 2) holding rollers 71, 72, 73, 74 of the substrate holder. However, the present embodiment is not limited to this example. For example, as shown in FIG. 23, the first cleaning unit 16 may clean both sides of a substrate W with roll sponges while holding the substrate W in a vertical posture by a plurality of holding rollers of a substrate holder. Alternatively, as shown in FIG. 24, the first cleaning unit 16 may clean both sides of a substrate W with roll sponges while holding the substrate W with a plurality of holding rollers of a substrate holder in a state where the surface of the substrate W is inclined.

In the embodiment shown in FIG. 23, the first cleaning unit 16 has two holding rollers 72, 73 configured to support and rotate the substrate W in a vertical posture, a roll sponge 77 configured to contact one surface of the substrate W supported by the holding rollers 72, 73, a rinsing-liquid supply nozzle 85 configured to supply a rinsing liquid (for example, pure water) to the one surface of the substrate W, and a chemical-liquid supply nozzle 87 configured to supply a chemical liquid to the one surface of the substrate W. On the back side of the substrate W shown in FIG. 23, a roll sponge that contacts the other surface of the substrate W, a rinsing-liquid supply nozzle configured to supply a rinsing liquid (for example, pure water) to the other surface of the substrate W, and a chemical-liquid supply nozzle configured to supply a chemical liquid are provided.

Figure 24:
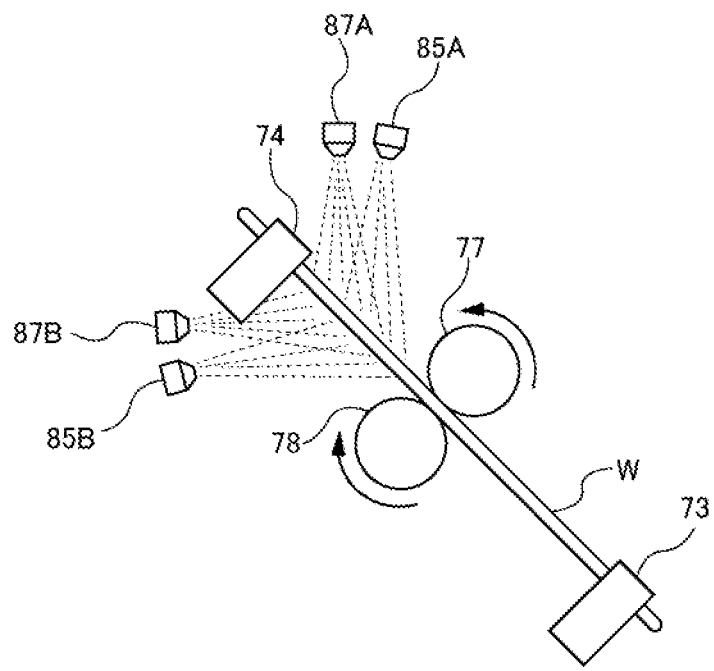
FIG. 24 is a schematic diagram showing an example of cleaning a surface of a substrate with a roll sponge while holding the substrate in a state where the surface is inclined.

In the embodiment shown in FIG. 24, the first cleaning unit 16 includes four holding rollers (two holding rollers 73 and 74 of the four holding rollers are shown in FIG. 24) configured to hold the substrate W with its surface inclined and rotate the substrate W, roll sponges 77 and 78 configured to contact both surfaces of the substrate W supported by the four holding rollers, a rinsing-liquid supply nozzle 85A configured to supply a rinsing liquid (for example, pure water) to one surface of the substrate W, a chemical-liquid supply nozzle 87A configured to supply a chemical liquid to the one surface of the substrate W, a rinsing-liquid supply nozzle 85B configured to supply a rinsing liquid (for example, pure water) to the other surface of the substrate W, and a chemical-liquid supply nozzle 87B configured to supply a chemical liquid to the other surface of the substrate W.

Also in the embodiments shown in FIGS. 23 and 24, as the scrubbing of substrates W is repeated with the roll sponge 77 (and the roll sponge 78), the degree of deterioration and the degree of contamination of the roll sponge 77 vary greatly along the longitudinal direction of the roll sponge 77 (and the roll sponge 78). Therefore, also in the first cleaning unit 16 shown in FIGS. 23 and 24, the controller 30 determines an appropriate replacement time of the roll sponge 77 (and the roll sponge 78) by using the methods described above.

Specifically, the roll sponge 77 (and the roll sponge 78) is moved to a retreat position away from the surface of the substrate W. Next, as shown in FIG. 12 or FIG. 17, the surface data is obtained at at least two measurement points of the roll sponge 77 by the imaging device 61 (or camera unit 62) of the surface-property measuring device 60, and the controller 30 determines an appropriate replacement time of the roll sponge 77 based on a difference between the two surface data. As described above, examples of the surface data obtained by the imaging device 61 (or the camera unit 62) include bipolar image data, spectral pattern of infrared absorption spectrum, strain image data, three-dimensional image data, spectral image data, hyperspectral image data, and polarization image data. The imaging device 61 (or the camera unit 62) can obtain the surface data of the roll sponge 77 that is rotating or stationary after the roll sponge 77 has been moved to the retreat position.

Also in these embodiments, the surface data indicative of the surface property of the roll sponge 77 (and the roll sponge 78) actually used for scrub cleaning are obtained at at least two measurement points of the roll sponge 77 having different deterioration degrees. The replacement time of the roll sponge 77 is determined based on the difference of the surface data. Therefore, an appropriate replacement time of the roll sponge 77 can be determined.

Figure 25:
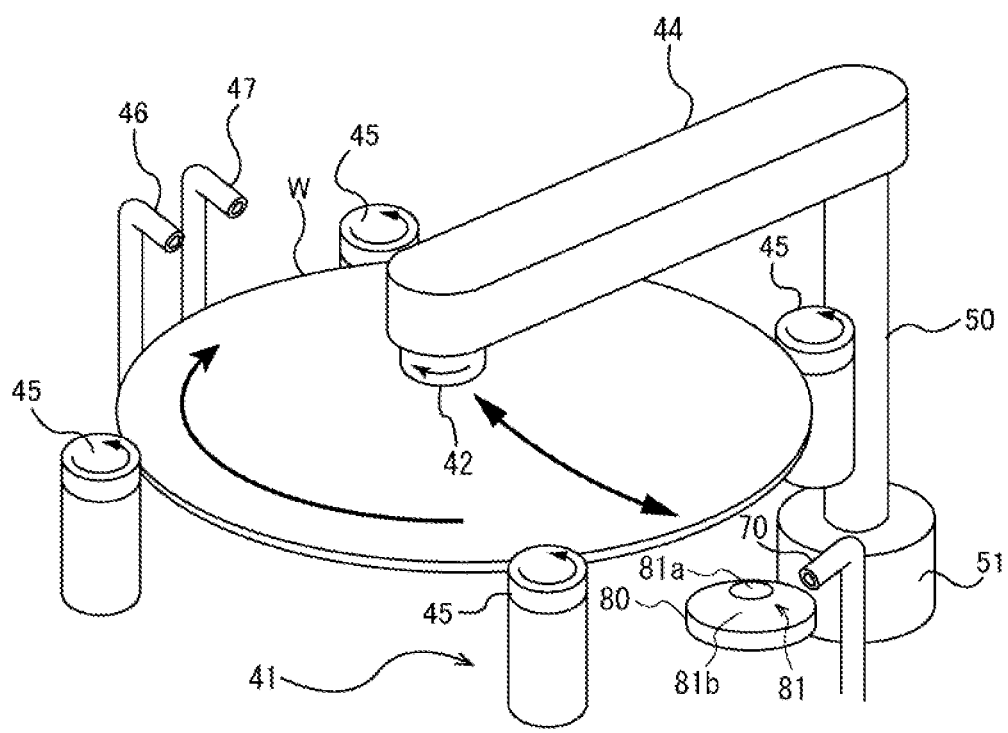
FIG. 25 is a perspective view schematically showing a second cleaning unit of the substrate processing apparatus shown in FIG. 1.

FIG. 25 is a perspective view schematically showing the second cleaning unit 18 of the substrate processing apparatus 1 shown in FIG. 1. The second cleaning unit 18 shown in FIG. 25 is a substrate cleaning apparatus according to another embodiment of the present invention. As shown in FIG. 25, the pen-type substrate cleaning apparatus includes a substrate holder 41 configured to hold and rotate a substrate (wafer) W, a pen sponge (cleaning tool) 42 configured to contact a surface of the substrate W, an arm 44 configured to hold the pen sponge 42, a rinsing-liquid supply nozzle 46 configured to supply a rinsing liquid (usually pure water) to the surface of the substrate W, and a chemical-liquid supply nozzle 47 configured to supply a chemical liquid to the surface of the substrate W. The pen sponge 42 is coupled to a cleaning-tool rotating mechanism (not shown) disposed in the arm 44, so that the pen sponge 42 is rotated around its central axis extending in the vertical direction.

The substrate holder 41 includes a plurality of (four in FIG. 25) rollers 45 configured to hold the peripheral edge of the substrate W. These rollers 45 are configured to rotate in the same direction at the same speed. When the rollers 45 rotate while holding the substrate W horizontally, the substrate W is rotated about its central axis in a direction indicated by arrow.

The arm 44 is arranged above the substrate W. The pen sponge 42 is coupled to one end of the arm 44, and a pivot shaft 50 is coupled to the other end of the arm 44. The pen sponge 42 is coupled to a cleaning-tool moving mechanism 51 via the arm 44 and the pivot shaft 50. More specifically, the cleaning-tool moving mechanism 51 for causing the arm 44 to pivot is coupled to the pivot shaft 50. The cleaning-tool moving mechanism 51 is configured to rotate the pivot shaft 50 by a predetermined angle to thereby cause the arm 44 to pivot in a plane parallel to the substrate W. This pivoting motion of the arm 44 causes the pen sponge 42, supported by the arm 44, to move (or oscillate) in a radial direction of the wafer W. Further, the cleaning-tool moving mechanism 51 is configured to be able to move the pivot shaft 50 up and down, so that the pen sponge 42 can be pressed against the surface of the substrate W with a predetermined pressure. A lower surface of the pen sponge 42 constitutes a flat scrubbing surface, and this scrubbing surface is placed in sliding contact with the surface of the substrate W.

The substrate W is cleaned as follows. First, the substrate W is rotated around its central axis. Next, the cleaning liquid is supplied to the surface of the substrate W from the cleaning-liquid supply nozzle 47. In this state, the rotating pen sponge 42 is pressed against the surface of the substrate W, and further the pen sponge 42 oscillates in the radial direction of the substrate W. The pen sponge 42 is in sliding contact with the surface of the substrate W in the presence of the cleaning liquid, so that the substrate W is scrubbed. After scrubbing, the rinsing liquid is supplied to the surface of the rotating substrate W from the rinsing-liquid supply nozzle 46 in order to wash away the cleaning liquid from the substrate W.

The pen sponge 42 is made of resin, such as PVA, and has a porous structure. Therefore, as the scrubbing of substrates W is repeated, contaminants (e.g., abrasive grains and polishing debris) accumulate in the pen sponge 42, thus lowering the cleaning performance and possibly causing back contamination of the substrate W. Therefore, in order to remove the contaminants from the pen sponge 42, the second cleaning unit 18 further includes a cleaning member 80 for cleaning the pen sponge 42.

As shown in FIG. 25, the cleaning member 80 is arranged adjacent to the substrate W held by the substrate holder 41. The cleaning member 80 shown in FIG. 25 has a truncated cone shape. The cleaning member 80 has an upper surface constituting a cleaning surface 81 that contacts the lower surface (scrubbing surface) of the pen sponge 42. The cleaning surface 81 of the cleaning member 80 has a circular central portion 81*a* and a slope portion 81*b* that extends outward from the central portion 81*a* and is inclined downward. The slope portion 81*b* has an annular shape.

The arm 44 is moved radially outwardly of the substrate W by the cleaning-tool moving mechanism 51 until the pen sponge 42 reaches a position above the cleaning member 80. Further, the pen sponge 42 is pressed against the cleaning surface 81 of the cleaning member 80 by the cleaning-tool moving mechanism 51 while the pen sponge 42 is rotating about its axis. A pure-water supply nozzle 70 is arranged adjacent to the cleaning member 80, so that pure water is supplied from the pure-water supply nozzle 70 to the pen sponge 42 in contact with the cleaning member 80.

The central portion 81*a* of the cleaning member 80 projects upward and is located higher than other portions lying around the central portion 81*a* (i.e., the slope portion 81*b*). Therefore, when the pen sponge 42 is lowered, a central portion of the lower surface of the pen sponge 42 comes into contact with the protruding central portion 81*a* of the cleaning surface 81. When the pen sponge 42 is further lowered, a peripheral portion of the lower surface of the pen sponge 42 comes into contact with the slope portion 81*b* of the cleaning surface 81. In this way, the entire lower surface of the pen sponge 42 comes into contact with the cleaning surface 81 of the cleaning member 80. The cleaning member 80 is made of quartz, resin, polypropylene, polybutylene terephthalate, or the like.

Since the cleaning member 80 has a truncated cone shape, the central portion 81*a* of the cleaning member 80 is located higher than other portions (i.e., the slope portion 81*b*) around the central portion 81*a*. Therefore, the central portion of the pen sponge 42 is pressed more strongly against the cleaning member 80 than other portion of the pen sponge 42, and particles, such as abrasive grains or polishing debris, that have entered the central portion of the pen sponge 42 can be removed. The particles once removed from the pen sponge 42 quickly flow down on the slope portion 81*b* of the cleaning member 80 together with the pure water. Therefore, the particles are prevented from reattaching to the pen sponge 42.

In the present embodiment, in order to clean the surface of the substrate W, the rotating pen sponge 42 oscillates on the rotating substrate W. A magnitude of a rotating velocity of the pen sponge 42 is zero on the rotation axis of the pen sponge 42, and gradually increases toward the peripheral edge of the pen sponge 42. Therefore, the degree of deterioration and the degree of contamination of the scrubbing surface of the pen sponge 42 differ in the radial direction of the scrubbing surface of the pen sponge 42.

Thus, also in the present embodiment, the surface-property measuring device 60 obtains the surface data of the pen sponge 42 at at least two measurement points of the pen sponge (cleaning tool) 42, and determines an appropriate replacement time of the pen sponge 42 based on a difference between the two surface data.

Figure 26A:
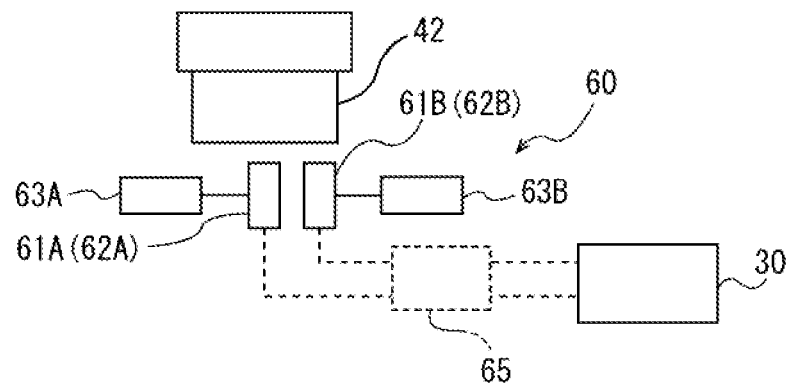
FIG. 26A is a schematic diagram showing an example of a surface-property measuring device configured to obtain surface data of a pen sponge.
Figure 26B:
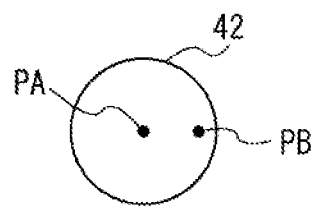
FIG. 26B is a bottom view of the pen sponge shown in FIG. 26A.
Figure 26C:
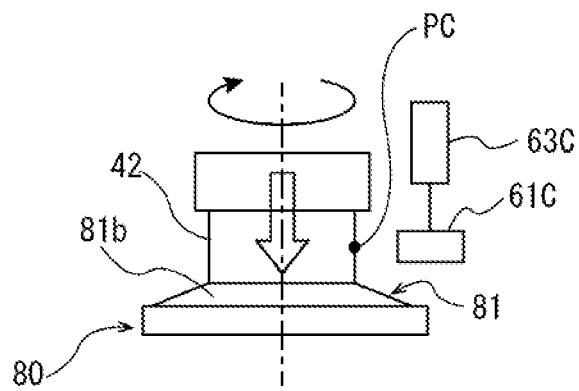
FIG. 26C is a schematic diagram showing a modified example of the surface-property measuring device shown in FIG. 26A.

FIG. 26A is a schematic view showing an example of the surface-property measuring device 60 for obtaining the surface data of the pen sponge 42, FIG. 26B is a bottom view of the pen sponge 42 shown in FIG. 26A, and FIG. 26C is a schematic diagram which shows a modification of the surface-property measuring device 60 shown in FIG. 26A. Since configurations of the present embodiment, which will not be particularly described, are the same as the configurations of the above-described embodiments, repetitive descriptions thereof will be omitted.

As shown in FIGS. 26A and 26B, the imaging devices 61A and 61B (or the camera units 62A and 62B) of the surface-property measuring device 60 are configured to obtain the surface data of the pen sponge 42 at two measurement points PA, PB which are separated in the radial direction of the scrubbing surface of the pen sponge 42. In this example, the imaging devices 61A, 61B (or the camera units 62A, 62B) obtain the surface data of the pen sponge 42 at the retreat position located above the cleaning member 80.

In the example shown in FIG. 26B, the measurement point PA is located at the center of the scrubbing surface of the pen sponge 42. In the case where the surface-property measuring device 60 has the camera-moving mechanisms 63A and 63B for moving the imaging devices 61A and 61B (or the camera units 62A and 62B) in the radial direction of the pen sponge 42, the positions of the measurement points PA and PB on the scrubbing surface can be changed arbitrarily.

Further, as shown in FIG. 26C, the surface-property measuring device 60 may have an imaging device 61C (or a camera unit 62C) configured to obtain surface data of a measurement point PC set on a side surface of the pen sponge 42. The pen sponge 42 is brought into contact with the cleaning member 80 after the imaging devices 61A and 61B (or the camera units 62A and 62B) obtain the surface data of the scrubbing surface of the pen sponge 42. The imaging device 61C (or the camera unit 62C) obtains the surface data of the side surface of the pen sponge 42 being pressed against the cleaning member 80. In the case where the surface-property measuring device 60 has a camera-moving mechanism 63C configured to move the imaging device 61C (or the camera unit 62C) in the vertical direction, the position of the measurement point PC on the side surface of the pen sponge 42 can be arbitrarily changed.

Also in this embodiment, the surface data indicative of the surface property of the pen sponge 42 actually used for scrub cleaning are obtained at at least two measurement points of the pen sponge 42 having different deterioration degrees. The replacement time of the roll sponge 77 is determined based on the difference of the surface data. Therefore, an appropriate replacement time of the pen sponge 42 can be determined.

In the above-described embodiment, the controller 30 determines the replacement time of the roll sponge 77, 78 and the pen sponge 42 based on the difference between at least two surface data obtained by the surface-property measuring device 60. With use of a similar method, the controller 30 may determine completion of "initial break-in" of the roll sponges 77, 78 and the pen sponge 42.

Conventionally, after the replacement of the cleaning tool with a new cleaning tool, an initial operation is carried out in which a break-in operation of rubbing the new cleaning tool against a dummy substrate having the same shape as a product substrate is repeated by a predetermined number of times. The number of substrates to which the cleaning tool is rubbed in the initial operation was determined based on quality control and/or a rule of thumb of an operator, as in the conventional method of determining the replacement time of the cleaning tool. In this case, if the surface condition (for example, a degree of scraping of the surface of the cleaning tool or a degree of peeling of a coating material applied to the surface of the cleaning tool) of the cleaning tool rubbed against a predetermined number of substrates does not reach a target surface condition, the cleaning tool is not able to exert its proper cleaning performance. In this case, a cleaning failure of a product substrate may occur. Alternatively, if the surface condition of the cleaning tool that has been rubbed against a predetermined number of substrates greatly exceeds the target surface condition, the number of substrates that can be cleaned by the cleaning tool decreases, and running costs of the substrate cleaning apparatus increase.

On the other hand, as the break-in operation is repeated, the surface property of the cleaning tool changes. As well as the degree of deterioration and the degree of contamination of the cleaning tool, this change in surface property in the break-in operation also differs depending on the measurement point at which the surface data is obtained. Therefore, in this embodiment, the controller 30 performs a break-in check operation using the same method as the method of determining the replacement time of the cleaning tool. The break-in check operation is a process of determining completion of "initial break-in" of a new cleaning tool after a previous cleaning tool (e.g., the roll sponge 77, 78, or the pen sponge 42) is replaced with the new cleaning tool.

Specifically, as shown in FIGS. 12, 17A, 17B, or 26A to 26C, a new cleaning tool (e.g., roll sponge 77, 78, or pen sponge 42) is moved to the retreat position located away from the surface of the substrate W. The surface data are obtained at at least two measurement points of the cleaning tool with the imaging device 61 (or camera unit 62) of the surface-property measuring device 60, and the completion of the initial break-in of the cleaning tool is determined based on a difference between the two surface data. As described above, examples of the surface data obtained by the imaging device 61 (or the camera unit 62) include bipolar image data, spectral pattern of infrared absorption spectrum, strain image data, three-dimensional image data, spectral image data, hyperspectral image data, and polarization image data. The imaging device 61 (or the camera unit 62) can obtain the surface data of the cleaning tool that is rotating or stationary after the cleaning tool has been moved to the retreat position.

The substrate processing apparatus 1 or the substrate cleaning apparatuses (substrate cleaning units) 16 and 18 may estimate or determine an appropriate replacement time of the cleaning tool (e.g., the roll sponge 77, 78 or the pen sponge 42) using a trained model constructed by machine learning performed by a machine learning apparatus described below.

The machine learning is executed by a learning algorithm which is an algorithm of artificial intelligence (AI), and a trained model that estimates an appropriate replacement time of the cleaning tool 77, 78, 42 is constructed by the machine learning. The learning algorithm for constructing the trained model is not particularly limited. For example, a known learning algorithm, such as "supervised learning", "unsupervised learning", "reinforcement learning", and "neural network", as learning algorithm for learning the appropriate replacement time of cleaning tool 77, 78, 42 can be adopted.

Figure 27:
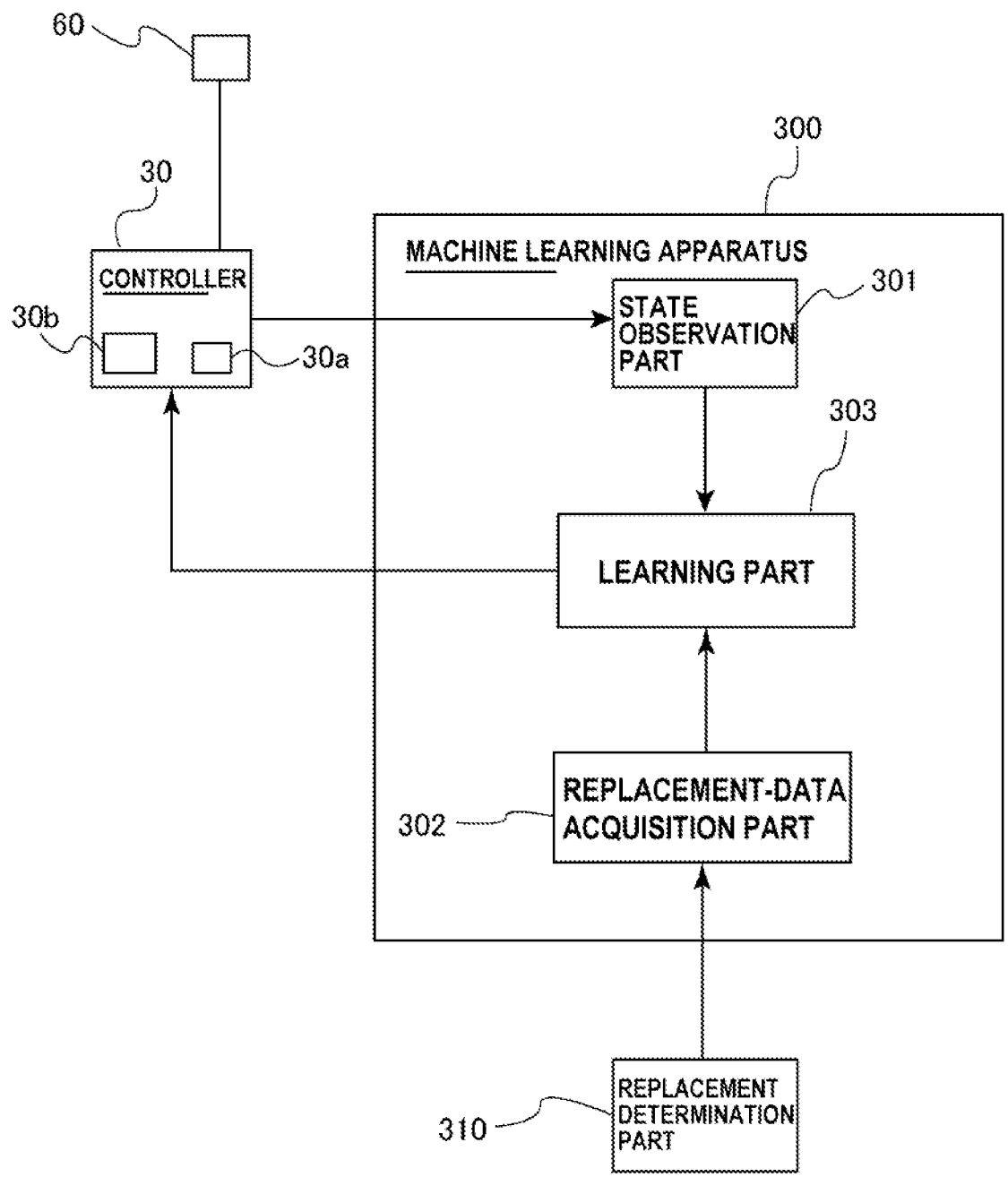
FIG. 27 is a schematic diagram showing an example of a machine learning apparatus.

FIG. 27 is a schematic diagram showing an example of the machine learning apparatus. A machine learning apparatus 300 shown in FIG. 27 is a device which is coupled to the controller 30 and learns an appropriate replacement time of the cleaning tool 77, 78, 42 provided in the cleaning unit 16, 18 of the substrate processing apparatus 1. The machine learning apparatus 300 includes a state observation part 301, a replacement-data acquisition part 302, and a learning part 303. Although not shown in the drawings, the controller 30 may include the machine learning apparatus 300 shown in FIG. 27. In this case, the trained model for estimating the appropriate replacement time of the cleaning tool 77, 78, 42 is constructed by using a processor 30a of the controller 30.

The state observation part 301 observes a state variable as an input value for the machine learning. This state variable contains at least the surface data obtained by the surface property device 60. In one embodiment, the state variable may further contain an output value of the vibration meter 97 attached to the bearing 90a (see FIG. 3) of the bearing device 90 and/or an output value of the torque sensor 93b (see FIG.

3) of the electric motor 93. Further, the state variable may include the measured value of the particle counter 114 provided in the cleaning-tool cleaning device 100.

The replacement-data acquisition part 302 obtains replacement data from a replacement determination part 310. The replacement data is data used when constructing the trained model that estimates an appropriate replacement time of the cleaning tool 77, 78, 42, and contains judgement results obtained by a known judgment method as to whether or not the cleaning tool 77, 78, 42 should be replaced. The replacement data is associated with (or connected to) the state variable input to the state observation part 301.

An example of the machine learning performed by the machine learning apparatus 300 is as follows. First, the state observation part 301 obtains the state variable including at least the surface data, and the replacement-data acquisition part 302 obtains the replacement data of the cleaning tool 77, 78, 42 associated with the state variable obtained by the state observation part 301. The learning part 303 determines the appropriate replacement time of the cleaning tool 77, 78, 42 based on a training data set which is a combination of the state variable obtained from the state observation part 52 and the replacement data obtained from the replacement-data acquisition part 51. The machine learning executed by the machine learning apparatus 300 is repeated until the machine learning apparatus 300 outputs an appropriate replacement time of the cleaning tool 77, 78, 42.

In one embodiment, the machine learning executed by the learning part 303 of the machine learning apparatus 300 may be machine learning using a neural network, particularly deep learning. Deep learning is a machine learning method based on a neural network having multiple hidden layers (also called intermediate layers). In this specification, machine learning using a neural network composed of an input layer, two or more hidden layers, and an output layer is referred to as deep learning.

FIG. 28 is a schematic diagram showing an example of the structure of the neural network. The neural network shown in FIG. 28 has an input layer 350, multiple hidden layers 351, and an output layer 352. The neural network learns the appropriate replacement time of the cleaning tool 77, 78, 42 based on a training data set containing a large number of combinations of the state variables obtained by the state observation part 301 and the replacement data associated with the state variables and obtained by the replacement-data acquisition part 302. Specifically, the neural network learns the relationship between the state variable and the replacement time of the cleaning tool 77, 78, 42. Such machine learning is so-called "supervised learning". In the supervised learning, a large amount of combinations of the state variables and the replacement data (labels) associated with these state variables are input to the neural network, so that the relationship between them is learned in a recursive manner.

In one embodiment, the neural network may learn the appropriate replacement time of the cleaning tool 77, 78, 42 by so-called "unsupervised learning". In unsupervised learning, for example, a large amount of only state variables are input to a neural network, and the neural network learns how the state variables are distributed. In the unsupervised learning, the teaching output data (replacement data) corresponding to the state variables are not input to the neural network. Instead, the input state variables are compressed, classified, shaped, etc., so that a trained model configured to output the appropriate replacement time of the cleaning tool 77, 78, 42 is constructed. Specifically, in the unsupervised learning, the neural network classifies a large number of input state variables into groups with similar characteristics. Then, the neural network sets a predetermined criterion for outputting the appropriate replacement time of the cleaning tool 77, 78, 42 for the plurality of classified groups, and the trained model is constructed such that the relationship between them is optimized. As a result, the trained model can output an appropriate replacement time of the cleaning tool 77, 78, 42.

In one embodiment, the machine learning executed by the learning part 303 may use a so-called "Recurrent Neural Network (RNN)" in order to reflect a temporal change in the state variable in the trained model. The recurrent neural network uses not only the state variable of the current time but also the state variables that have been input to the input layer 351 so far. In the recurrent neural network, a trained model that estimates an appropriate replacement time of the cleaning tool 77, 78, 42 can be constructed based on the transitions of the state variables input so far by expanding and considering the changes of the state variables along the time axis.

Figure 29A:
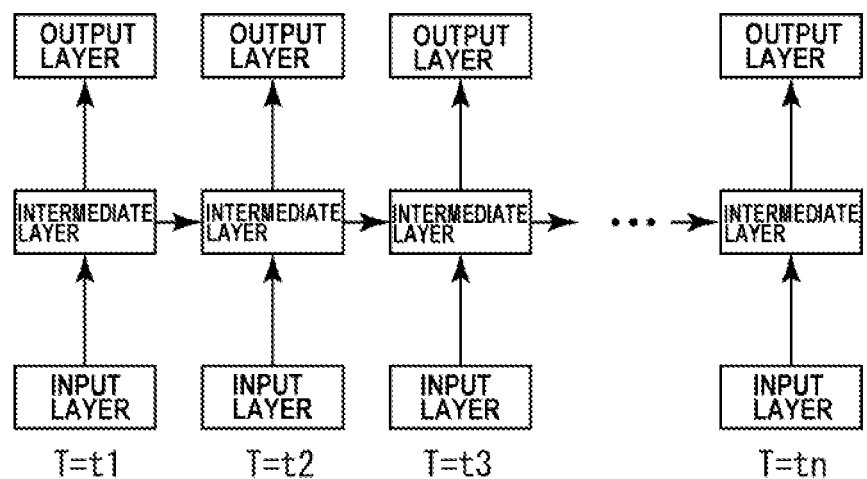
FIG. 29A is a schematic diagram showing a time axis expansion of Elman network.
Figure 29B:
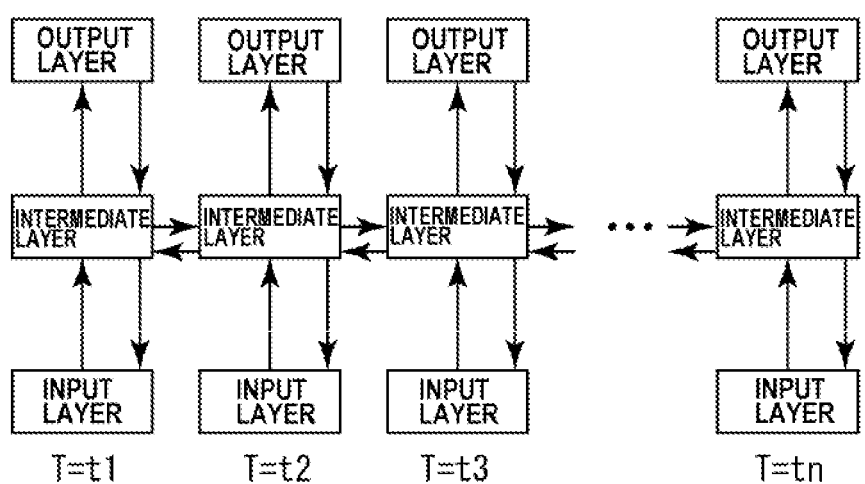
FIG. 29B is a schematic diagram showing backpropagation through-time of a back propagation method.

FIGS. 29A and 29B are development diagrams each for explaining a simple recurrent network (Elman Network) which is an example of a recurrent neural network. More specifically, FIG. 29A is a schematic diagram showing a time-axis expansion of the Elman network, and FIG. 29B a schematic diagram showing backpropagation through-time of a backpropagation method.

In the Elman network as shown in FIGS. 29A and 29B, unlike a normal neural network, an error propagates so as to go back in time (see FIG. 29B). By applying such recurrent neural network structure to the neural network of the machine learning performed by the learning part 303, the trained model that can output an appropriate replacement time of the cleaning tool 77, 78, 42 in consideration of the transition of the state variables input so far can be constructed.

The trained model constructed in this way is stored in a memory 30b (see FIG. 27) of the controller 30. The controller 30 operates according to a program electrically stored in the memory 30b. Specifically, the processor 30a of the controller 30 performs arithmetic operations including inputting the state variable including at least the surface data transmitted from the surface-property measuring device 60 to the controller 30 into the input layer 351 of the trained model, estimating, from the input state variable (and the amount of temporal change in the state variable), the process number of substrates W until the surface data of the cleaning tool 77, 78, 42 reaches the predetermined threshold value Dt, and outputting the estimated processing number from the output layer 352. Specifically, the controller 30 can obtain the number of substrates W that can be processed (which will be referred to as estimated processing number) before the replacement time (i.e., the life) of the cleaning tool 77, 78, 42 is reached. Further, the controller 30 can obtain the replacement time of the cleaning tool 77, 78, 42 (i.e., the life of the cleaning tool 77, 78, 42) by adding the estimated processing number output from the output layer 303 to the number of processed substrates after the cleaning tool 77, 78, 42 is started to be used.

When it is determined that the estimated processing number of the cleaning tool output from the output layer 352 and the replacement time of the cleaning tool 77, 78, 42 obtained by the controller 30 are equivalent to a normal data, the controller 30 may store, as additional training data, the estimated processing number and the replacement time of the cleaning tool in the replacement determination part 310. In this case, the machine learning apparatus 300 updates the trained model through the machine learning based on the training data and the additional training data. This makes it possible to improve the accuracy of the estimated time output from the trained model and the replacement time of the cleaning tool.

As the deterioration of the upper roll sponge 77 progresses, the output value of the vibration meter 97 attached to the bearing 90*a* (see FIG. 3) of the bearing device 90 increases, and the output value of the torque sensor 93*b* (see FIG. 3) of the motor 93 also increases. This phenomenon also occurs in connection with the lower roll sponge 78. Therefore, the output value of the vibration meter 97 and/or the output value of the torque sensor 93*b* when the roll sponges 77 and 78 are scrubbing the substrate W may be input as state variable into the input layer 351 of the neural network. This makes it possible to construct the trained model that can more accurately output the estimated processing number of the cleaning tool 77, 78, 42 from the output layer 352.

Further, as the degree of contamination of the upper roll sponge 77 increases, the measured value of the particle counter 114 (see FIG. 22) increases. This phenomenon also occurs in connection with the lower roll sponge 78. Therefore, the measured value of the particle counter 114 may be input as the state variable to the input layer 351 of the neural network. This makes it possible to construct the trained model that can more accurately output the estimated processing number of the cleaning tool 77, 78 from the output layer 352.

In the above-described embodiments, the substrate processing apparatus 1 is a substrate polishing apparatus including the polishing units 14*a* to 14*d*, but the substrate processing apparatus 1 is not limited to these embodiments. For example, the substrate processing apparatus 1 may be a substrate plating apparatus having at least one plating tank and configured to plate a substrate in the plating tank. In this case, the above-mentioned substrate cleaning unit (substrate cleaning apparatus) can be used to clean the substrate before and/or after immersion in the plating tank. Alternatively, the substrate processing apparatus 1 may be a substrate cleaning apparatus for cleaning a substrate after being subjected to various processes. In this case, the substrate cleaning unit described above is incorporated in the substrate cleaning apparatus.

In the above-described embodiments, a wafer, which is a substrate having a circular shape, is scrubbed with the cleaning tool, but as long as the substrate held by the substrate holder can be scrubbed with the cleaning tool, the substrate is not limited to the wafer having a circular shape. For example, the substrate may be a glass substrate having a rectangular shape or a liquid crystal panel. In this case, the substrate holder may not rotate the glass substrate or the liquid crystal panel. Further, the cleaning tool is the roll sponge or the pen sponge in the above-described embodiments, but the cleaning tool may be a cleaning brush.

Further, in the above-described embodiments, the appropriate replacement time of the cleaning tool is determined based on the surface data obtained by the surface-property measuring device 60, while in one embodiment, the surface-property measuring device 60 may be disposed in at least one of the polishing units (polishing apparatuses) 14*a* to 14*d* to determine an appropriate replacement time of a polishing pad.

Figure 30:
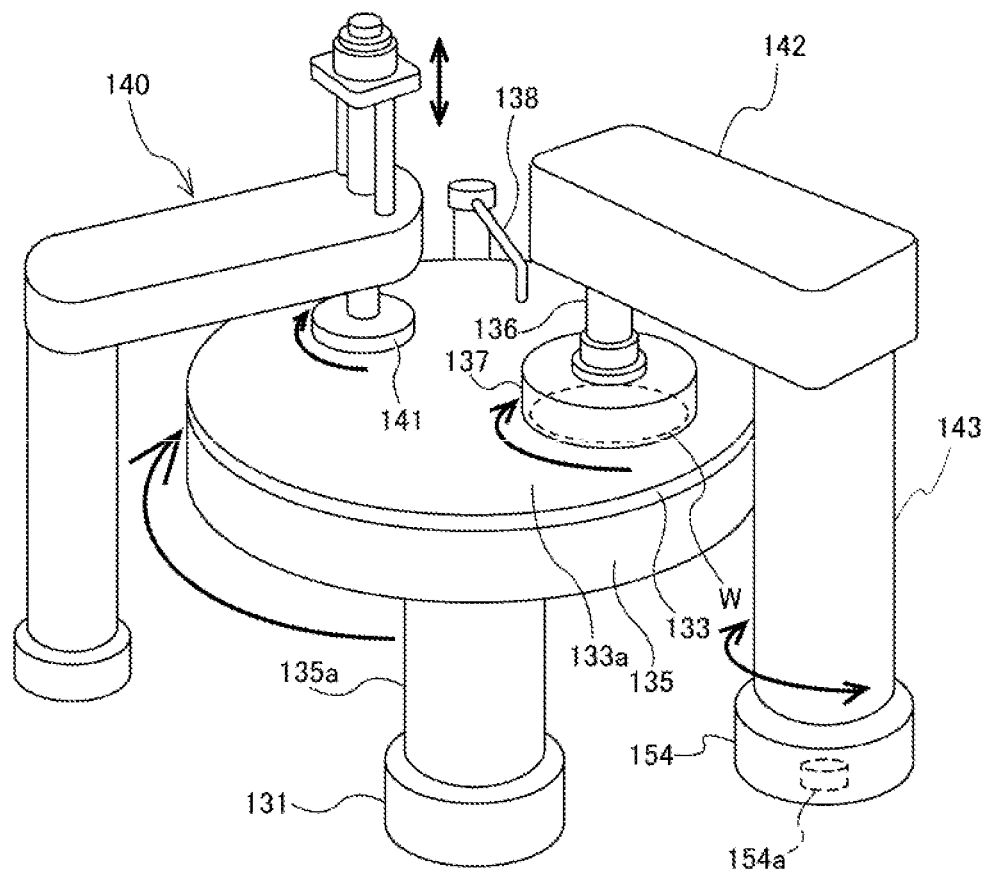
FIG. 30 is a perspective view schematically showing a polishing unit (polishing apparatus) according to an embodiment.

FIG. 30 is a perspective view schematically showing a polishing unit (polishing apparatus) according to an embodiment. At least one of the polishing units 14*a* to 14*d* of the substrate polishing apparatus shown in FIG. 1 is the polishing unit (polishing apparatus) shown in FIG. 30.

The polishing unit shown in FIG. 30 has a polishing table 135 to which a polishing pad 133 having a polishing surface 133*a* is attached, a polishing head (which may be referred to as top ring) 137 configured to hold a substrate W and press the substrate W against the polishing pad 133 on the polishing table 135, a polishing-liquid supply nozzle 138 configured to supply a polishing liquid or a dressing liquid (for example, pure water) to the polishing pad 133, and a dressing device 140 having a dresser 141 configured to dress the polishing surface 133*a* of the polishing pad 133. In one embodiment, the dressing device 140 may be omitted.

The polishing table 133 is coupled to a table motor 131 via a table shaft 135*a*. The table motor 131 is arranged below the polishing table 133, and is configured to rotate the polishing table 135 in a direction indicated by arrow. The polishing pad 133 is attached to an upper surface of the polishing table 135, and an upper surface of the polishing pad 133 constitutes the polishing surface 133*a* for polishing the substrate W. The polishing head 137 is coupled to a lower end of a head shaft 136. The polishing head 137 is configured to be able to hold the substrate W on its lower surface by vacuum suction. The head shaft 136 is configured to move up and down by a vertical movement mechanism (not shown).

The head shaft 136 is rotatably supported by a head arm 142, and the head arm 142 is driven by a head swing motor 154 to swing around a head pivot shaft 143. When the head swing motor 154 is in motion, the polishing head 137 can oscillate on the polishing pad 33 in substantially a radial direction of the polishing pad 33. Further, the head swing motor 154 can move the polishing head 137 between a polishing position above the polishing pad 133 and a retreat position laterally of the polishing pad 133.

Polishing of the substrate W is performed as follows. The polishing head 137 and the polishing table 135 are rotated in the directions indicated by the arrows, respectively, and the polishing liquid (slurry) is supplied onto the polishing pad 133 from the polishing-liquid supply nozzle 138. In this state, the polishing head 137 presses the substrate W against the polishing surface 133*a* of the polishing pad 133. The surface of the substrate W is polished by a mechanical action of abrasive grains contained in the polishing liquid and a chemical action of the polishing liquid. After the polishing is terminated, the dressing device 140 performs dressing (or conditioning) of the polishing surface 133*a*.

Figure 31:
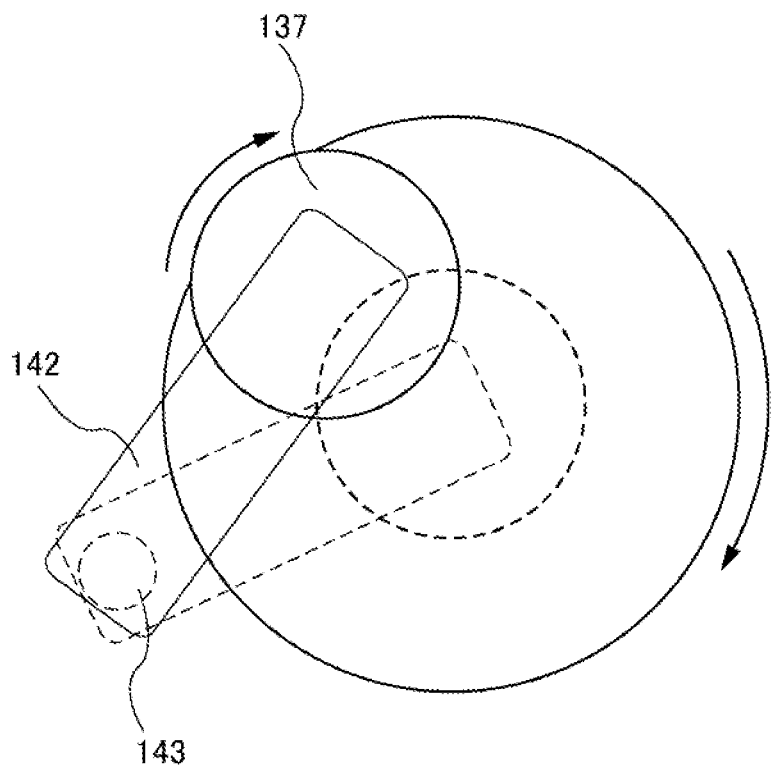
FIG. 31 is a schematic view showing a polishing head oscillating on a polishing pad.

In the polishing unit shown in FIG. 30, the polishing head 137 is caused to oscillate on the polishing pad 133 in substantially the radial direction of the polishing pad 133 by the head swing motor 154 during the polishing of the substrate W. FIG. 31 is a schematic view showing the polishing head 137 oscillating on the polishing pad 133. As shown in FIG. 31, the polishing head 137 oscillates in substantially the radial direction of the polishing pad 133 so that the substrate W held on the lower surface of the polishing head 137 moves between a center CP and a peripheral edge of the polishing pad 133.

The polishing pad 133 is also made of resin, and the surface of the polishing pad 133 deteriorates as polishing of substrates W is repeated. Therefore, it is necessary to replace the polishing pad 133 with a new polishing pad at an appropriate timing.

Therefore, in the present embodiment, the surface-property measuring device 60 described above is used to determine an appropriate replacement time of the polishing pad 133. Since the configurations of the surface-property measuring device 60 of the present embodiment, which will not be particularly described, are the same as the configurations of the surface-property measuring device 60 described above, repetitive descriptions thereof will be omitted.

In the polishing apparatus shown in FIG. 30, the polishing head 137 oscillates in substantially the radial direction of the polishing pad 133 during polishing of the substrate W. Therefore, the degree of deterioration and the degree of contamination of the polishing pad 133 differ in the radial direction of the polishing pad 133. Therefore, in order to determine an appropriate replacement time of the polishing pad 137, the surface-property measuring device 60 obtains the surface data of the polishing pad 133 at two measurement points which are different in the radial direction of the polishing pad 133. The appropriate replacement time of the polishing pad 133 is determined based on a difference between the two surface data.

Figure 32:
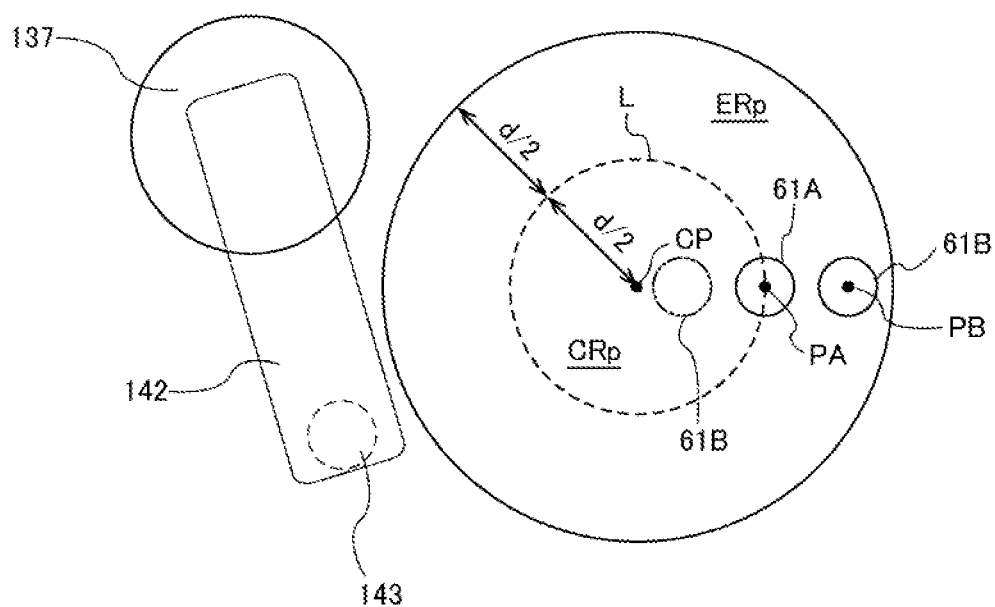
FIG. 32 is a schematic view showing a manner in which two imaging devices of a surface-property measuring device obtain the surface data at two measurement points which are different in the radial direction of the polishing pad.

FIG. 32 is a schematic view showing a manner in which two imaging devices 61A and 61B of the surface-property measuring device 60 obtain the surface data at two measurement points PA and PB which are different in the radial direction of the polishing pad 133.

As shown in FIG. 32, the polishing pad 133 is divided into a central region CRp and an outer edge region ERp on both sides of a boundary line L located at a position half the radius of the polishing pad 133 from the center CP. One imaging device 61A obtains surface data on or near the boundary line L, and other imaging device 61B obtains surface data on the outer edge region ERp. In one embodiment, the other imaging device 61B may obtain surface data on the central region CRp (see a two-point chain line in FIG. 32). Although not shown in the drawings, if the surface-property measuring device 60 has a camera-moving mechanism for moving the imaging device 61A in the radial direction of the polishing pad 133, the imaging device 61B may be omitted.

In the present embodiment, the imaging device 61 of the surface-property measuring device 60 includes a camera unit (not shown) configured as a hyperspectral camera, and an image processing unit (not shown) configured to convert a hyperspectral image data, obtained by the hyperspectral camera, into a graph of spectral intensity at each wavelength.

As well as the embodiments of the substrate cleaning apparatus described above, the imaging device 61 can grasp the degree of deterioration of the polishing pad 133 by calculating an amount of change in the spectral intensity at a predetermined wavelength. The controller 30 causes the polishing head 137 to move to the retreat position (see FIG. 32) each time a predetermined number NA of substrates W are polished, and then obtains, as the surface data, graphs of the spectral intensity at each wavelength converted from hyperspectral image data obtained at the measurement points PA and PB using the imaging devices 61A and 61B of the surface-property measuring device 60. Further, the controller 30 calculates a difference between a spectral intensity of the measurement point PA at a predetermined wavelength and a spectral intensity of the measurement point PB at the predetermined wavelength. Then, the controller 30 compares the calculated difference with a predetermined threshold value. This threshold value is predetermined by an experiment or the like and is stored in advance in the controller 30.

When the difference is equal to or larger than the predetermined threshold value, the controller 30 determines that the polishing pad 133 has reached the replacement time (i.e., the life), and outputs an alarm (first alarm) prompting the replacement of the polishing pad 133. In one embodiment, the controller 30 may issue the first alarm and may stop the operation of transporting the substrate W to the polishing unit. When the difference is smaller than the predetermined threshold value, the controller 30 allows the next substrate W to be transported to the polishing unit and continues polishing process of the substrate W.

In one embodiment, when the difference is equal to or greater than a predetermined first threshold value, the controller 30 may determine that a time of dressing the polishing pad 133 (i.e., a dressing time) has been reached, and may instruct the dresser 141 to start dressing of the polishing pad 133. In this case, after the dressing process, the controller 30 may obtain, as the surface data, spectral intensity graphs converted from hyperspectral image data obtained at the measurement points PA and PB using the imaging devices 61A and 61B of the surface-property measuring device 60. If there is no change in the difference in the spectral intensities of the measurement points PA and PB before and after the dressing of the polishing pad 133, the controller 30 may determine that the polishing pad 133 has reached the replacement time (i.e., the life).

Further, in one embodiment, the controller 30 may apply the above-mentioned method of determining an appropriate replacement time of the cleaning tool based on the slope of the tangential line to the polishing pad 133. In this case, the controller 30 stores in advance a predetermined threshold value to be compared with an amount of change in the slope of the tangential line, and determines an appropriate replacement time of the polishing pad 133 based on the amount of change in the slope of the tangential line and the above difference.

As described with reference to FIG. 16, a pre-threshold value (second threshold value) Dt' may be determined in advance by subtracting a predetermined value (Δt) from a predetermined threshold value (first threshold value) Dt. In this case, the controller 30 issues a second alarm when the difference between the spectral intensity of the measurement point PA at a predetermined wavelength and the spectral intensity of the measurement point PB at the predetermined wavelength is equal to or larger than the pre-threshold value Dt'. The second alarm does not require the replacement of the polishing pad 133 immediately, but can inform an operator that a period of use of the polishing pad 133 will soon reach the replacement time. The second alarm allows the operator to prepare a new polishing pad 133 in advance.

As well as the embodiments of the substrate cleaning apparatus described above, the replacement time of the polishing pad 133 may be determined using a graph of spectral intensity at each wavelength converted from hyperspectral image data obtained at one measurement point PA (or PB). More specifically, each time a predetermined number NA of substrates W are polished, the controller 30 obtains, as the surface data, a graph of spectral intensity at each wavelength converted from hyperspectral image data obtained at the measurement point PA using the imaging device 61A of the surface-property measuring device 60. Further, the controller 30 calculates a difference between a spectral intensity at the predetermined wavelength at the measurement point PA obtained this time and a spectral intensity at the measurement point PA at the predetermined wavelength obtained last time. Then, the controller 30 compares this difference with a predetermined threshold value. This threshold value is predetermined by an experiment or the like and is stored in advance in the controller 30.

When the difference between the spectral intensity at the predetermined wavelength obtained this time and the spectral intensity at the predetermined wavelength obtained last time is smaller than the predetermined threshold value, the controller 30 determines that the polishing pad 133 has reached a replacement time (i.e., a life), and issues an alarm (first alarm) prompting the replacement of the polishing pad 133. In one embodiment, when the difference between the spectral intensity at the predetermined wavelength obtained this time and the spectral intensity at the predetermined wavelength obtained last time is smaller than the predetermined threshold, and the difference between the slope of the tangential line at the inflection point of the spectral intensity graph obtained this time and the slope of the tangential line at the inflection point of the spectral intensity graph obtained last time is smaller than a predetermined threshold value, the controller 30 determines that the polishing pad 133 has reached a replacement time (i.e., a life). In one embodiment, the controller 30 may issue the first alarm and may stop the operation of transporting the substrate W to the polishing unit. When the difference is smaller than a predetermined threshold value, the controller 30 allows the next substrate W to be transported to the polishing unit and continues polishing process of the substrate W.

In one embodiment, the controller 30 may issue an alarm prompting the replacement of the polishing pad 133 and may stop transporting of the next substrate W to the polishing unit when the difference is smaller than the predetermined threshold value and after a predetermined process number NB of substrates W are polished.

The substrate processing apparatus may include a buffing apparatus for slightly additionally polishing a substrate W, which has been polished, or for cleaning the substrate to remove deposits from the substrate. The buffing apparatus is configured to press a contact member having a diameter smaller than that of the substrate W against the substrate W while providing relative movement between the substrate W and the contact member. The buffing apparatus may be disposed in the substrate processing apparatus instead of the first cleaning unit 16 shown in FIG. 1 or may be disposed between the polishing units 14a to 14d and the first cleaning unit 16.

Figure 33:
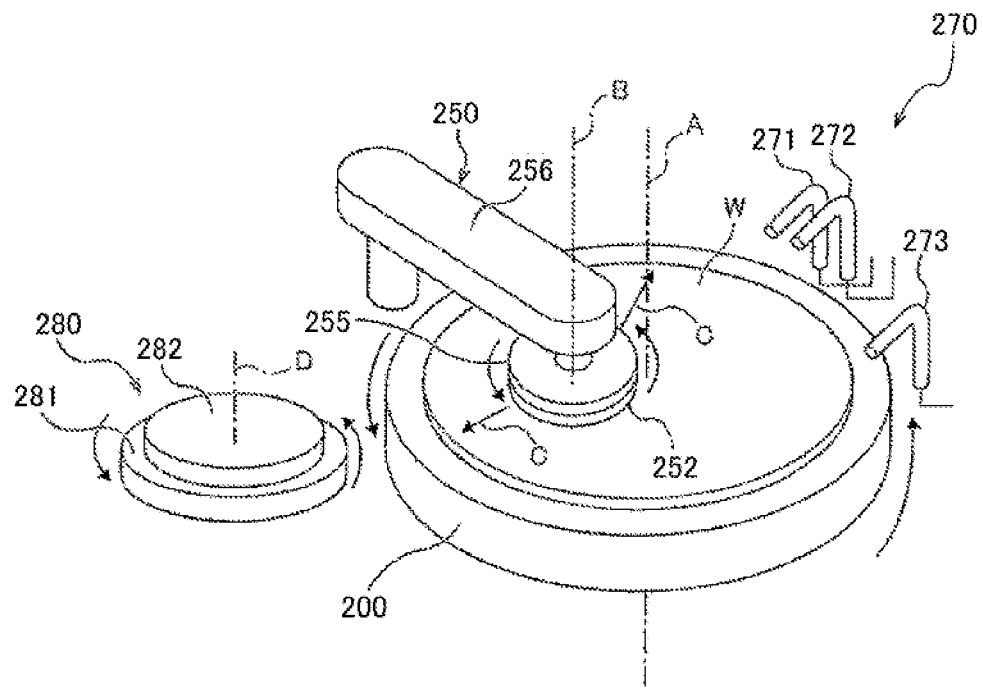
FIG. 33 is a schematic diagram showing a buffing apparatus according to an embodiment.

FIG. 33 is a schematic view showing a buffing apparatus according to an embodiment. The buffing apparatus shown in FIG. 33 includes a buffing table 200 on which the substrate W is placed, a buffing component 250, a liquid supply system 270 for supplying a buffing liquid, and a conditioning unit 280 for conditioning (dressing) a buffing pad (buffing tool) 252. The buffing component 250 includes a buffing head 255 to which the buffing pad 252 for buffing a surface of the substrate W is attached, and a buffing arm 256 holding the buffing head 255.

The buffing liquid contains at least one of DIW (pure water), a cleaning-chemical liquid, and a polishing liquid, such as a slurry. There are mainly two types of buffing process. One is a process of removing contaminants, such as slurry or a residue of a polishing product remaining on the substrate W, by the contact of the buffing pad 252. The other is a process of removing a certain amount of material of the substrate W to which the contaminants are attached by the polishing or the like. In the former case, the buffing liquid is preferably the cleaning-chemical liquid or DIW, and in the latter case, the polishing liquid is preferable. The buffing pad 252 is formed of, for example, a polyurethane foam-based hard pad, a suede-based soft pad, a sponge, or the like. The type of the buffing pad 252 may be appropriately selected depending on a material of the surface of the substrate W and conditions of the contaminants to be removed. The surface of the buffing pad 252 may have grooves, such as concentric grooves, XY grooves, spiral groove, or radial grooves. Further, at least one hole penetrating the buffing pad 252 may be formed in the buffing pad 252, so that the buffing liquid may be supplied through the hole. The buffing pad 252 may be made of sponge-like material, such as PVA sponge, through which the buffing liquid can permeate. These configurations make it possible to provide a uniform flow distribution of the buffing liquid within the surface of the buffing pad and to quickly discharge the contaminants removed by the buffing process.

The buffing table 200 has a mechanism of attracting the substrate W. Further, the buffing table 200 can be rotated about a rotation axis A by a drive mechanism (not shown). In one embodiment, the buffing table 200 may be adapted to cause the substrate W to perform an angular rotating motion or a scroll motion by a drive mechanism (not shown). The buffing pad 252 is attached to a surface of the buffing head 255 facing the substrate W. The buffing head 255 can be rotated about a rotation axis B by a drive mechanism (not shown). Further, the buffing head 255 is configured to be able to press the buffing pad 252 against a surface, to be processed, of the substrate W by a drive mechanism (not shown). The buffing arm 256 can move the buffing head 255 within the radius or diameter of the substrate W as shown by arrows C. Further, the buffing arm 256 can swing the buffing head 255 to a position where the buffing pad 252 faces the conditioning unit 280.

The conditioning unit 280 is a structure for conditioning the surface of the buffing pad 252. The conditioning unit 280 includes a dressing table 281 and a dresser 282 installed on the dressing table 281. The dressing table 281 is configured to be able to rotate about a rotation axis D by a drive mechanism (not shown). The dressing table 281 may be configured to cause the dresser 282 to scroll by a drive mechanism (not shown).

When conditioning of the buffing pad 252 is to be performed, the buffing apparatus rotates the buffing arm 256 until the buffing pad 252 faces the dresser 282. The buffing apparatus rotates the dressing table 281 about the rotation axis D, rotates the buffing head 255, and presses the buffing pad 252 against the dresser 282 to thereby perform the conditioning of the buffing pad 252.

The liquid supply system 270 has a pure-water nozzle 271 for supplying pure water (DIW) to the surface of the substrate W, a chemical-liquid nozzle 272 for supplying a chemical liquid to the surface of the substrate W, and a slurry nozzle 273 for supplying slurry to the surface of the substrate W.

The buffing apparatus supplies the processing liquid to the substrate W, rotates the buffing table 200 about the rotation axis A, presses the buffing pad 252 against the surface of the substrate W, and causes the buffing head 255 to oscillate in the directions as shown by the arrows C while rotating the buffing head 255 about the rotation axis B, so that the buffing process is performed on the substrate W. Here, the buffing process includes at least one of a buff-polishing process and a buff-cleaning process.

The buff-polishing process is a process of scraping off the surface of the substrate W slightly by providing the relative motion between the substrate W and the buffing pad 252 which are in contact with each other in the presence of the polishing agent, such as slurry, between the substrate W and the buffing pad 252. The buffing process can remove a surface layer to which contaminants have been attached, can additionally remove material of a portion that could not be removed by the main polishing process performed by the polishing units 14a to 14d, or can improve the morphology after the main polishing process.

The buff-cleaning process is a process of removing contaminants on the surface of the substrate W or modifying the surface of the substrate W by providing the relative motion between the substrate W and the buffing pad 252 which are in contact with each other in the presence of the cleaning liquid (e.g., chemical liquid, or chemical liquid and pure water) between the substrate W and the buffing pad 252.

The buffing pad 252 is also made of resin, and the surface of the buffing pad 252 deteriorates as the buffing process of substrates W is repeated. Therefore, it is necessary to replace the buffing pad 252 with a new buffing pad 252 at an appropriate timing.

Therefore, the present embodiment uses the surface-property measuring device 60 described above to determine an appropriate replacement time of the buffing pad 252. Since configurations of the surface-property measuring device 60 of the present embodiment, which will not be particularly described, are the same as the configurations of the surface-property measuring device 60 described above, repetitive descriptions thereof will be omitted.

Figure 34:
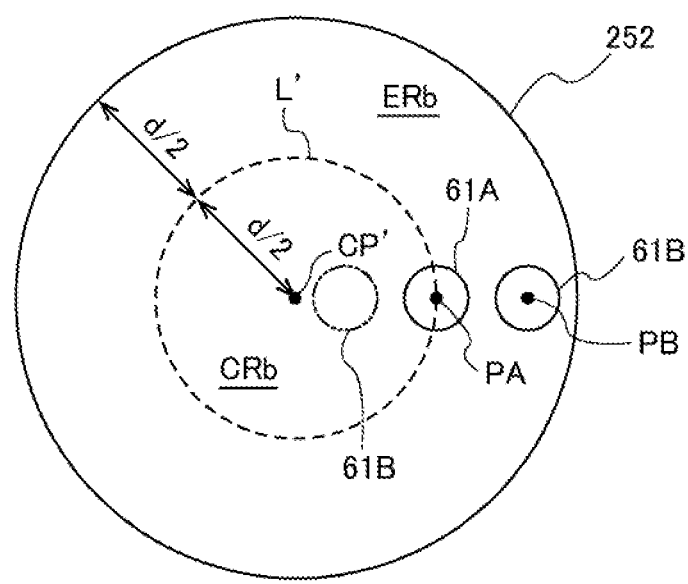
FIG. 34 is a schematic view showing a manner in which two imaging devices of a surface-property measuring device obtain the surface data at two measurement points which are different in the radial direction of a buffing pad.

FIG. 34 is a schematic view showing a manner in which the two imaging devices 61A and 61B of the surface-property measuring device 60 obtain the surface data at two measurement points PA and PB which are different in the radial direction of the buffing pad 252.

As shown in FIG. 34, the buffing pad 252 is divided into a central region CRb and an outer edge region ERb on both sides of a boundary line L' located at a position half the radius of the buffing pad 252 from the center CP. One imaging device 61A obtains surface data on or near the boundary line L', and other imaging device 61B obtains surface data on the outer edge region ERb. In one embodiment, the other imaging device 61B may obtain surface data on the central region CRb (see a two-point chain line in FIG. 34). Although not shown in the drawings, if the surface-property measuring device 60 has a camera-moving mechanism for moving the imaging device 61A in the radial direction of the buffing pad 252, the imaging device 61B may be omitted.

Also in the present embodiment, the imaging device 61 of the surface-property measuring device 60 includes a camera unit (not shown) configured as a hyperspectral camera, and an image processing unit (not shown) configured to convert a hyperspectral image data, obtained by the hyperspectral camera, into a graph of spectral intensity at each wavelength.

As well as the embodiments of the substrate cleaning apparatus described above, the imaging device 61 can grasp the degree of deterioration of the buffing pad 252 by calculating an amount of change in the spectral intensity at a predetermined wavelength. The controller 30 causes the buffing pad 252 to move to the position above the dresser 282 each time a predetermined number NA of substrates W are buffed, and then obtains, as the surface data, graphs of the spectral intensity at each wavelength converted from hyperspectral image data obtained at the measurement points PA and PB using the imaging devices 61A and 61B of the surface-property measuring device 60. Further, the controller 30 calculates a difference between a spectral intensity of the measurement point PA at a predetermined wavelength and a spectral intensity of the measurement point PB at the predetermined wavelength. Then, the controller 30 compares the calculated difference with a predetermined threshold value. This threshold value is predetermined by an experiment or the like and is stored in advance in the controller 30.

When the difference is equal to or larger than the predetermined threshold value, the controller 30 determines that the buffing pad 252 has reached the replacement time (i.e., the life), and issues an alarm (first alarm) prompting the replacement of the buffing pad 252. In one embodiment, the controller 30 may issue the first alarm and may stop the operation of transporting the substrate W to the buffing apparatus. When the difference is smaller than the predetermined threshold value, the controller 30 allows the next substrate W to be transported to the buffing apparatus and continues the buffing of the substrate W.

As described with reference to FIG. 16, a pre-threshold value (second threshold value) Dt' may be determined in advance by subtracting a predetermined value ($\Delta t$) from a predetermined threshold value (first threshold value) Dt. In this case, the controller 30 issues a second alarm when the difference between the spectral intensity of the measurement point PA at a predetermined wavelength and the spectral intensity of the measurement point PB at the predetermined wavelength is equal to or larger than the pre-threshold value Dt'. The second alarm does not require the replacement of the buffing pad 252 immediately, but can inform an operator that a period of use of the buffing pad 252 will soon reach the replacement time. The second alarm allows the operator to prepare a new buffing pad 252 in advance.

Further, in one embodiment, the controller 30 may apply the above-mentioned method of determining an appropriate replacement time of the cleaning tool based on the slope of the tangential line to the buffing pad 252. In this case, the controller 30 stores in advance a predetermined threshold value to be compared with an amount of change in the slope of the tangential line, and determines an appropriate replacement time of the buffing pad 252 based on the amount of change in the slope of the tangential line and the above difference.

As well as the embodiments of the substrate cleaning apparatus described above, the replacement time of the buffing pad 252 may be determined using a graph of spectral intensity at each wavelength converted from hyperspectral image data obtained at one measurement point PA (or PB). More specifically, each time a predetermined number NA of substrates W are buffed, the controller 30 obtains, as the surface data, a graph of spectral intensity at each wavelength converted from hyperspectral image data obtained at the measurement point PA using the imaging device 61A of the surface-property measuring device 60. Further, the controller 30 calculates a difference between a spectral intensity at the predetermined wavelength at the measurement point PA obtained this time and a spectral intensity at the measurement point PA at the predetermined wavelength obtained last time. Then, the controller 30 compares this difference with a predetermined threshold value. This threshold value is predetermined by an experiment or the like and is stored in advance in the controller 30.

When the difference between the spectral intensity at the predetermined wavelength obtained this time and the spectral intensity at the predetermined wavelength obtained last time is smaller than the predetermined threshold value, the controller 30 determines that the buffing pad 252 has reached a replacement time (i.e., a life), and issues an alarm (first alarm) prompting the replacement of the buffing pad 252. In one embodiment, when the difference between the spectral intensity at the predetermined wavelength obtained this time and the spectral intensity at the predetermined wavelength obtained last time is smaller than the predetermined threshold, and the difference between the slope of the tangential line at the inflection point of the spectral intensity graph obtained this time and the slope of the tangential line at the inflection point of the spectral intensity graph obtained last time is smaller than a predetermined threshold value, the controller 30 determines that the buffing pad 252 has reached a replacement time (i.e., a life). In one embodiment, the controller 30 may issue the first alarm and may stop the operation of transporting the substrate W to the buffing apparatus. When the difference is smaller than a predetermined threshold value, the controller 30 allows the next substrate W to be transported to the buffing apparatus and continues buffing process of the substrate W.

In one embodiment, the controller 30 may issue an alarm prompting the replacement of the buffing pad 252 and may stop transporting of the next substrate W to the buffing apparatus when the difference is smaller than the predetermined threshold value and after a predetermined process number NB of substrates W are buffed.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. For example, the substrate cleaning apparatus described above may be an independent apparatus that is not incorporated in the CMP apparatus. Further, the above-described embodiments of the machine learning apparatus for learning the replacement time of the cleaning tool can be applied to a machine learning apparatus for learning the replacement time of the polishing pad and/or the buffing pad. Therefore, the present invention is not intended to be limited to the embodiments described herein but is to be accorded the widest scope as defined by limitation of the claims.

INDUSTRIAL APPLICABILITY

The present invention is applicable to a substrate cleaning apparatus and a substrate cleaning method for scrubbing a substrate, such as a semiconductor substrate, a glass substrate, or a liquid crystal panel, with a cleaning tool while supplying a cleaning liquid onto the substrate. Further, the present invention is applicable to a polishing apparatus for polishing a surface of a substrate. Further, the present invention is applicable to a buffing apparatus for slightly additionally polishing a substrate, which has been polished, or for cleaning the substrate to remove deposits from the substrate by pressing a contact member having a diameter smaller than that of the substrate against the substrate while providing relative movement between the substrate and the contact member. Furthermore, the present invention is applicable to a substrate processing apparatus having at least one of the substrate cleaning apparatus, the polishing apparatus, and the buffing apparatus. Further, the present invention is applicable to a machine learning apparatus configured to learn at least one of a replacement time of a cleaning tool, a replacement time of a polishing pad, and a replacement time of a buffing tool.

1 substrate processing apparatus
14a, 14b, 14c, 14d polishing unit
17 first cleaning unit (first substrate cleaning apparatus)
18 second cleaning unit (second substrate cleaning apparatus)
20 drying unit
22 first substrate transfer robot
24 substrate transfer unit
26 second substrate transfer robot
28 third substrate transfer robot
30 controller
41 substrate holder
42 pen sponge (cleaning tool)
51 cleaning-tool movement mechanism
60 surface-property measuring device
61A, 61B, 61C imaging device
62A, 62B, 62C camera unit
65 image processing unit
77, 78 roll sponge (cleaning tool)
90 bearing device
90a bearing
93 electric motor
93b torque sensor
97 vibration sensor
114 particle counter
300 machine learning apparatus
301 state observation part
302 replacement-data acquisition part
303 learning part
310 replacement determination part

The invention claimed is:

1. A substrate cleaning apparatus comprising:
a substrate holder configured to hold and rotate a substrate;
a cleaning tool configured to clean the substrate by rubbing the rotating substrate in a presence of a cleaning liquid;
a surface-property measuring device configured to obtain surface data in a non-contact manner, the surface data being indicative of a surface property which corresponds to a degree of deterioration and a degree of contamination of the cleaning tool; and
a controller coupled to the surface-property measuring device and configured to determine a replacement time of the cleaning tool based on the surface data,
wherein the surface-property measuring device is configured to obtain surface data of the cleaning tool at at least two measurement points of the cleaning tool each time a predetermined number of substrates are scrubbed, and
the controller is configured to determine the replacement time of the cleaning tool based on a comparison between a difference in the surface data obtained at the at least two measurement points and a predetermined threshold value for the difference in the surface data stored in advance.

2. The substrate cleaning apparatus according to claim 1, wherein the controller is configured to determine that the cleaning tool has reached the replacement time when the difference has reached the predetermined threshold value.

3. The substrate cleaning apparatus according to claim 1, wherein the surface-property measuring device includes an imaging device configured to obtain the surface data and a camera-moving mechanism configured to move the imaging device.

4. The substrate cleaning apparatus according to claim 1, further comprising a cleaning-tool moving unit configured to move the cleaning tool between a cleaning position where the cleaning tool contacts a surface of the substrate and a retreat position where the cleaning tool is away from the surface of the substrate,
wherein the surface-property measuring device is configured to obtain the surface data of the cleaning tool that has been moved to the retreat position.

5. The substrate cleaning apparatus according to claim 1, wherein the controller is configured to perform a break-in check operation after replacement of the cleaning tool with a new cleaning tool,
  wherein the break-in check operation includes:
    obtaining surface data of the new cleaning tool at at least two measurement points of the new cleaning tool using the surface-property measuring device, each time a predetermined number of dummy substrates are scrubbed with the new cleaning tool; and
    determining completion of break-in of the new cleaning tool based on a comparison between a difference in the surface data obtained at the at least two measurement points and a predetermined threshold value for the difference in the surface data stored in advance in the controller.

6. The substrate cleaning apparatus according to claim 1, wherein the surface data is one of bipolar image data, spectrum pattern of infrared absorption spectrum, strain image data, three-dimensional image data, spectral image data, hyperspectral image data, and polarization image data.

7. The substrate cleaning apparatus according to claim 6, wherein the surface data is a graph of spectral intensity converted from the hyperspectral image data, and the controller is configured to determine that the cleaning tool has reached the replacement time when a difference in the spectral intensity at a predetermined wavelength is larger than a predetermined threshold value.

8. The substrate cleaning apparatus according to claim 7, wherein the controller is configured to further determine that the cleaning tool has reached the replacement time when an amount of change in a slope of a tangential line at an inflection point of the graph of the spectral intensity is equal to or less than a predetermined threshold value.

* * * * *